United States Patent
Nosaka

(10) Patent No.: US 10,911,027 B2
(45) Date of Patent: Feb. 2, 2021

(54) RADIO-FREQUENCY FILTER, MULTIPLEXER, RADIO-FREQUENCY FRONT-END CIRCUIT, AND COMMUNICATION DEVICE

(71) Applicant: Murata Manufacturing Co., Ltd., Nagaokakyo (JP)

(72) Inventor: Koji Nosaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/727,772

(22) Filed: Dec. 26, 2019

(65) Prior Publication Data

US 2020/0136592 A1  Apr. 30, 2020

Related U.S. Application Data

(63) Continuation of application No. PCT/JP2018/017014, filed on Apr. 26, 2018.

(30) Foreign Application Priority Data

Jun. 28, 2017  (JP) .................................. 2017-126814

(51) Int. Cl.
*H04B 1/10* (2006.01)
*H03H 11/04* (2006.01)
(Continued)

(52) U.S. Cl.
CPC .............. *H03H 11/04* (2013.01); *H03F 3/21* (2013.01); *H03H 7/0115* (2013.01); *H03H 9/46* (2013.01);
(Continued)

(58) Field of Classification Search
CPC ...... H03H 7/065; H03H 7/175; H03H 7/1766; H03H 17/0283; H03H 11/04;
(Continued)

(56) References Cited

U.S. PATENT DOCUMENTS 8,306,499 B2 * 11/2012 Yamakawa .......... H04N 5/4401
  455/307
2004/0266378 A1 * 12/2004 Fukamachi ............ H04B 1/406
  455/188.1

(Continued)

FOREIGN PATENT DOCUMENTS

| JP | 07-74185 A | 3/1995 |
| JP | 1998-336000 A | 12/1998 |
| JP | 2000-323961 A | 11/2000 |
| JP | 2001-285025 A | 10/2001 |

OTHER PUBLICATIONS

English Translation of the Written Opinion of the International Search Authority dated Jul. 3, 2018 for PCT/JP2018/017014.
(Continued)

*Primary Examiner* — Tuan Pham
(74) *Attorney, Agent, or Firm* — Xsensus LLP

(57) ABSTRACT

A filter includes: a series-arm circuit; a first parallel-arm circuit connected to a node and a ground; and a second parallel-arm circuit connected to a node and the ground. The first parallel-arm circuit includes a first parallel-arm resonator, and a first switch circuit connected in series to the first parallel-arm resonator. The second parallel-arm circuit includes a second parallel-arm resonator, and a second switch circuit connected in series to the second parallel-arm resonator. The first switch circuit includes a first switch element that includes one or more transistors. The second switch circuit includes a second switch element that includes one or more transistors. A gate width of each of the one or more transistors included in the first switch element is greater than a gate width of at least one of the one or more transistors included in the second switch element.

20 Claims, 35 Drawing Sheets

(51) Int. Cl.
*H03F 3/21* (2006.01)
*H03H 7/01* (2006.01)
*H03H 9/46* (2006.01)
*H03H 11/34* (2006.01)
*H04B 1/40* (2015.01)

(52) U.S. Cl.
CPC .............. *H03H 11/34* (2013.01); *H04B 1/40* (2013.01); *H03F 2200/294* (2013.01); *H03F 2200/451* (2013.01)

(58) Field of Classification Search
CPC ........ H03H 7/0115; H03H 9/46; H03H 11/34; H04B 1/40; H03F 3/21
See application file for complete search history.

(56) References Cited

U.S. PATENT DOCUMENTS

2009/0251235 A1    10/2009  Belot et al.
2014/0370827 A1*   12/2014  Nakamura ........... H04B 1/0067
                                                         455/78

OTHER PUBLICATIONS

International Search Report and Written Opinion dated Jul. 3, 2018 for PCT/JP2018/017014 filed on Apr. 26, 2018, 8 pages including English Translation of the International Search Report, (2020).

\* cited by examiner

RADIO-FREQUENCY FILTER, MULTIPLEXER, RADIO-FREQUENCY FRONT-END CIRCUIT, AND COMMUNICATION DEVICE

CROSS REFERENCE TO RELATED APPLICATIONS

This is a continuation application of PCT International Application No. PCT/JP2018/017014 filed on Apr. 26, 2018, designating the United States of America, which is based on and claims priority of Japanese Patent Application No. 2017-126814 filed on Jun. 28, 2017. The entire disclosures of the above-identified applications, including the specifications, drawings and claims are incorporated herein by reference in their entirety.

FIELD

The present disclosure relates to a radio-frequency filter that includes a resonator, a multiplexer, a radio-frequency front-end circuit, and a communication device.

BACKGROUND

Conventionally, a radio-frequency filter (tunable filter) having a frequency-tunable function is proposed as a radio-frequency filter that supports multiband communication.

Such a radio-frequency filter having a frequency-tunable function includes a ladder circuit that includes a plurality of series-arm circuits and a plurality of parallel-arm circuits. A known configuration of such a parallel-arm circuit includes a parallel-arm resonator connected in series to a circuit constituted by a capacitor and a switch element connected in parallel (for example, see Patent Literature (PTL) 1).

According to the above conventional configuration, switching between a conducting state (on) and a non-conducting state (off) of a switch changes a resonant frequency that is a singular point at which impedance of the parallel-arm circuit has a local minimum value, and thus the frequency of the attenuation pole according to the resonant frequency can be changed.

CITATION LIST

Patent Literature

PTL 1: U.S. Unexamined Patent Application Publication No. 2009/0251235

SUMMARY

Technical Problem

As recognized by the present inventor, when the radio-frequency filter described above is applied as, for example, a transmission filter, the radio-frequency filter is required to have power durability. In order to improve power durability of a radio-frequency filter, power durability of a parallel-arm circuit needs to be improved. In improving power durability of a parallel-arm circuit, it is important to improve not only power durability of a parallel-arm resonator, but also power durability of a switch included in the parallel-arm circuit.

However, conventionally, when such a radio-frequency filter is applied to a multiband system, reduction in size of the switch element and loss when the switch element is conducting are priority issues, and a configuration that improves power durability, which is in a trade-off relationship with the reduction in size of the switch element and loss, has not been examined.

In view of this, the present disclosure is to ensure power durability for a radio-frequency filter having a frequency-tunable function, and a multiplexer, a radio-frequency front-end circuit, and a communication device each including the radio-frequency filter, while achieving reduction in size and passband insertion loss thereof.

Solution to Problem

In order to ensure power durability therefor, a radio-frequency filter according to an aspect of the present invention includes: a series-arm circuit disposed on a path that connects an input terminal and an output terminal; a first parallel-arm circuit connected to a ground and a first node on the path, between the input terminal and the series-arm circuit, the first parallel-arm circuit including a first parallel-arm resonator, and a first switch circuit connected in series to the first parallel arm resonator, the first switch circuit including a first switch element that includes one or more transistors; and a second parallel-arm circuit connected to the ground and a second node on the path, between the series-arm circuit and the output terminal, the second parallel-arm circuit including a second parallel-arm resonator, and a second switch circuit connected in series to the second parallel-arm resonator, the second switch circuit including a second switch element that includes one or more transistors. A gate width of each of the one or more transistors included in the first switch element is greater than a gate width of at least one of the one or more transistors included in the second switch element.

For a radio-frequency filter having such a configuration, current withstand capability of the switch elements is to be ensured in order to achieve power durability that the radio-frequency filter is to have. In this regard, a greater current flows through a switch element in the conducting state, as the switch element is connected closer to the input terminal. In view of this, the gate width of each of the one or more transistors included in the first switch element is greater than the gate width of at least one of the one or more transistors included in the second switch element, so that current withstand capability of the first switch element and the second switch element that achieves power durability that the radio-frequency filter is to have can be ensured while a total size of the first switch element and the second switch element is decreased. Further, the gate width of the first switch element is relatively great, thus decreasing the resistance of the first switch element (on resistance) in the conducting state. Accordingly, the insertion loss in the passband of the radio-frequency filter can be reduced when the first switch element is conducting. Thus, power durability can be ensured for the radio-frequency filter having a frequency-tunable function while achieving reduction in size and passband insertion loss of the filter.

When a stack count indicates a total number of transistors connected in series, the second switch element may have a stack count lower than a stack count of the first switch element.

Accordingly, the stack count of the second switch element is made lower than the stack count of the first switch element, thus reducing resistance of the second switch element having a relatively narrow gate width when the second switch element is conducting. Further, the size of the second switch element can be reduced by decreasing the stack count of the second switch element. Accordingly, with regard to the radio-frequency filter, passband insertion loss when the second switch element is conducting can be reduced, and at the same time, the size of the radio-frequency filter can be reduced.

The first switch circuit may further include a first impedance element connected to the first switch element, the first impedance element being one of an inductor and a capacitor, and the second switch circuit may further include a second impedance element connected to the second switch element, the second impedance element being one of an inductor and a capacitor.

Accordingly, the resonant frequency of the first parallel-arm circuit is changed by switching between the conducting and non-conducting states of the first switch element. Similarly, the resonant frequency of the second parallel-arm circuit is changed by switching between the conducting and non-conducting states of the second switch element. The resonant frequency of the first parallel-arm circuit and the resonant frequency of the second parallel-arm circuit form the attenuation pole of the radio-frequency filter, and thus the radio-frequency filter can change the frequency of the attenuation pole by switching between the conducting and non-conducting states of the first switch element and the second switch element.

The first impedance element and the first switch element may be connected in parallel in the first switch circuit, and the second impedance element and the second switch element may be connected in parallel in the second switch circuit.

Accordingly, switching between the conducting and non-conducting states of the first switch element can switch (change) the frequency of the attenuation pole on a passband low-frequency side to another frequency.

The first switch circuit may further include a third impedance element connected in series to the first switch element, the third impedance element being an other of the inductor and the capacitor and different from the first impedance element. The second switch circuit may further include a fourth impedance element connected in series to the second switch element, the fourth impedance element being an other of the inductor and the capacitor and different from the second impedance element. A circuit constituted by the third impedance element and the first switch element connected in series may be connected in parallel to the first impedance element. A circuit constituted by the fourth impedance element and the second switch element connected in series may be connected in parallel to the second impedance element.

Accordingly, this increases a range in which the frequency of the attenuation pole on the passband low-frequency side can be changed.

The first switch circuit may include a plurality of circuits each of which is the circuit constituted by the third impedance element and the first switch element connected in series, and the second switch circuit may include a plurality of circuits each of which is the circuit constituted by the fourth impedance element and the second switch element connected in series.

Accordingly, the frequency of the attenuation pole on the passband low-frequency side can be changed finely.

The first parallel-arm circuit may further include a third parallel-arm resonator connected in parallel to a circuit constituted by the first parallel-arm resonator and the first switch circuit connected in series. The second parallel-arm circuit may further include a fourth parallel-arm resonator connected in parallel to a circuit constituted by the second parallel-arm resonator and the second switch circuit connected in series. A resonant frequency of the first parallel-arm resonator may be lower than a resonant frequency of the third parallel-arm resonator. An antiresonant frequency of the first parallel-arm resonator may be lower than an antiresonant frequency of the third parallel-arm resonator. A resonant frequency of the second parallel-arm resonator may be lower than a resonant frequency of the fourth parallel-arm resonator. An antiresonant frequency of the second parallel-arm resonator may be lower than an antiresonant frequency of the fourth parallel-arm resonator.

Accordingly, the frequency of the attenuation pole on the passband low-frequency side can be changed without increasing insertion loss at a passband low-frequency edge.

The first parallel-arm circuit may further include a third parallel-arm resonator connected in parallel to a circuit constituted by the first parallel-arm resonator and the first switch circuit connected in series. The second parallel-arm circuit may further include a fourth parallel-arm resonator connected in parallel to a circuit constituted by the second parallel-arm resonator and the second switch circuit connected in series. A resonant frequency of the first parallel-arm resonator may be higher than a resonant frequency of the third parallel-arm resonator. An antiresonant frequency of the first parallel-arm resonator may be higher than an antiresonant frequency of the third parallel-arm resonator. A resonant frequency of the second parallel-arm resonator may be higher than a resonant frequency of the fourth parallel-arm resonator. An antiresonant frequency of the second parallel-arm resonator may be higher than an antiresonant frequency of the fourth parallel-arm resonator.

Accordingly, the frequency of the attenuation pole on a passband high-frequency side can be changed without increasing insertion loss at a passband high-frequency edge.

The first parallel-arm circuit may further include: a third parallel-arm resonator; and a third switch circuit connected in series to the third parallel-arm resonator. The second parallel-arm circuit may further include: a fourth parallel-arm resonator; and a fourth switch circuit connected in series to the fourth parallel-arm resonator. The third switch circuit may include: a fifth impedance element that is one of an inductor and a capacitor; and a third switch element that is connected to the fifth impedance element, and includes one or more transistors. The fourth switch circuit may include: a sixth impedance element that is one of an inductor and a capacitor; and a fourth switch element that is connected to the sixth impedance element, and includes one or more transistors. A circuit constituted by the first parallel-arm resonator and the first switch circuit connected in series and a circuit constituted by the third parallel-arm resonator and the third switch circuit connected in series may be connected in parallel. A circuit constituted by the second parallel-arm resonator and the second switch circuit connected in series and a circuit constituted by the fourth parallel-arm resonator and the fourth switch circuit connected in series may be connected in parallel.

Accordingly, the frequencies of the attenuation poles on the passband low-frequency side and the passband high-frequency side can be changed without increasing insertion loss at the passband edges.

A gate width of each of the one or more transistors included in the third switch element may be greater than a gate width of at least one of the one or more transistors included in the fourth switch element.

Also in the radio-frequency filter having such a configuration, a greater current flows through a switch element of the parallel-arm circuit in the conducting state as the switch element is connected closer to the input terminal, as described above. Accordingly, the gate width of each of the one or more transistors included in the third switch element is greater than the gate width of at least one of the one or more transistors included in the fourth switch element, and thus the same as the above description of the first switch element and the second switch element also applies to the third switch element and the fourth switch element. Thus, current withstand capability of the third switch element and the fourth switch element that achieves power durability that the radio-frequency filter is to have can be ensured while a total size of the third switch element and the fourth switch element is decreased. Further, insertion loss in the passband of the radio-frequency filter can be reduced when the third switch element is conducting. Specifically, power durability of the radio-frequency filter that is frequency-tunable without increasing insertion loss at the passband edge can be ensured, while achieving reduction in size and passband insertion loss of the filter.

When a stack count indicates a total number of transistors connected in series, the fourth switch element may have a stack count lower than a stack count of the third switch element.

Accordingly, resistance of the fourth switch element having a relatively narrow gate width when in the conducting state can be decreased by making the stack count of the fourth switch element lower than the stack count of the third switch element. Accordingly, passband insertion loss of the radio-frequency filter when the fourth switch element is conducting can be reduced, and at the same time, the size of the filter can be reduced.

The radio-frequency filter may have a ladder filter structure that includes: two or more series-arm circuits disposed on the path, the two or more series-arm circuits including the series-arm circuit; and three or more parallel-arm circuits that include the first parallel-arm circuit and the second parallel-arm circuit. The three or more parallel-arm circuits may include a third parallel-arm circuit connected to the ground and a node between the first node on the path and the output terminal. The third parallel-arm circuit may include a fifth parallel-arm resonator and a fifth switch circuit connected in series to the fifth parallel arm resonator. The fifth switch circuit may include a fifth switch element that includes one or more transistors. A gate width of each of the one or more transistors included in the fifth switch element may be narrower than a gate width of each of the one or more transistors included in the first switch element.

Accordingly, also in a configuration that includes three or more parallel-arm circuits, a total size of the first switch element, the second switch element, and the fifth switch element is decreased, and at the same time, current withstand capability that achieves power durability that the radio-frequency filter is to have can be ensured. The conducting and non-conducting states of the first switch element, the second switch element, and the fifth switch element can be switched as appropriate, and thus the frequency of the attenuation pole and the number of attenuation poles can be adjusted finely. Accordingly, the size of the radio-frequency filter which can finely adjust the frequency of the attenuation pole and the number of attenuation poles can be reduced, and power durability that the filter is to have can be ensured.

A multiplexer according to an aspect of the present disclosure includes: a plurality of filters that include a first filter that is the radio-frequency filter described above. Input terminals or output terminals of the plurality of filters are directly or indirectly connected to a common terminal.

Such a multiplexer can ensure power durability while achieving reduction in size and passband insertion loss.

The multiplexer may further include: a change circuit that changes a filter connected to the common terminal from one filter to another filter out of the plurality of filters. The change circuit may include a sixth switch element that switches between (i) a conducting state in which one of the input terminal and the output terminal of the first filter is connected to the common terminal and (ii) a non-conducting state in which the one of the input terminal and the output terminal of the first filter is disconnected from the common terminal. The sixth switch element may include one or more transistors. A gate width of each of the one or more transistors included in the sixth switch element may be greater than a gate width of at least one of the one or more transistors included in the first switch element.

Current withstand capability that achieves power durability that such a multiplexer is to have is to be ensured for the switch elements included in the multiplexer. In this regard, the sixth switch element is disposed in series on the main path of a high-frequency signal input or output through the common terminal, and thus is to have higher current withstand capability than a switch element of a parallel-arm circuit disposed on a path that connects the main path and the ground. The sixth switch element is disposed on the main path as described above, and thus the resistance of the sixth switch element in the conducting state gives greater influence on insertion loss in the entire passband than the switch element of the parallel-arm circuit. Thus, by making the gate width of the sixth switch element greater than the gate width of the first switch element, current withstand capability of the sixth switch element that achieves power durability that the multiplexer is to have can be ensured, and the resistance of the sixth switch element in the conducting state can be reduced. Accordingly, power durability of a multiplexer that includes the radio-frequency filter having a frequency-tunable function can be ensured while achieving reduction in size and passband insertion loss of the multiplexer.

The change circuit may further include a seventh switch element that switches between (i) a conducting state in which a node connected with the sixth switch element and the one of the input terminal and the output terminal is connected to the ground and (ii) a non-conducting state in which the node is disconnected from the ground. When one of the sixth switch element and the seventh switch element is conducting, an other of the sixth switch element and the seventh switch element may be non-conducting. The seventh switch element may include one or more transistors. A gate width of each of the one or more transistors included in the seventh switch element may be narrower than a gate width of each of the one or more transistors included in the first switch element.

Stated differently, the sixth switch element and the seventh switch element are switched between the conducting and non-conducting states mutually exclusively. Accordingly, the seventh switch element having the conducting and non-conducting states switched mutually exclusively from the sixth switch element is included, and thus when the sixth switch element is non-conducting, the isolation between the common terminal and the first filter can be improved. Further, an increase in the amount of attenuation can be inhibited in a portion of the attenuation band of a filter having a passband different from the passband of the first filter, the portion corresponding to the passband of the first filter. Almost no current flows through the seventh switch element both in the conducting and non-conducting states, and resistance of the seventh switch element in the conducting state hardly influences passband insertion loss. In view of this, the gate width of each of the one or more transistors included in the seventh switch element is narrower than the gate width of at least one of the one or more transistors included in the first switch element, and thus the current withstand capability that achieves power durability that the multiplexer is to have can be ensured for the seventh switch element, and the size of the seventh switch element can be reduced.

A radio-frequency front-end circuit according to an aspect of the present disclosure includes: a first filter that is the radio-frequency filter described above or the multiplexer described above; and an amplifier circuit directly or indirectly connected to the radio-frequency filter or the multiplexer.

Such a radio-frequency front-end circuit can ensure power durability, while achieving reduction in size and passband insertion loss.

The amplifier circuit may be a power amplifier that amplifies a high-frequency signal to be transmitted, and the high-frequency signal amplified by the power amplifier may be input through the input terminal of the first filter.

Such a transmitter radio-frequency front-end circuit can ensure power durability, while achieving reduction in size and passband insertion loss.

The amplifier circuit may be a low-noise amplifier that amplifies a high-frequency signal received, and the high-frequency signal amplified by the low-noise amplifier may be output through the output terminal of the first filter.

Such a receiver radio-frequency front-end circuit can ensure power durability, while achieving reduction in size and passband insertion loss.

A communication device according to an aspect of the present disclosure includes: a radio-frequency (RF) signal processing circuit that processes a high-frequency signal to be transmitted by an antenna element, and a high-frequency signal received by the antenna element; and the radio-frequency front-end circuit according to any one of claims 16 to 18 that conveys the high-frequency signals between the antenna element and the RF signal processing circuit.

Such a communication device can ensure power durability, while achieving reduction in size and passband insertion loss.

Advantageous Effects

According to the present disclosure, power durability can be ensured for a radio-frequency filter having a frequency-tunable function, and a multiplexer, a radio-frequency front-end circuit, and a communication device each including the radio-frequency filter, while achieving reduction in size and passband insertion loss.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1A:
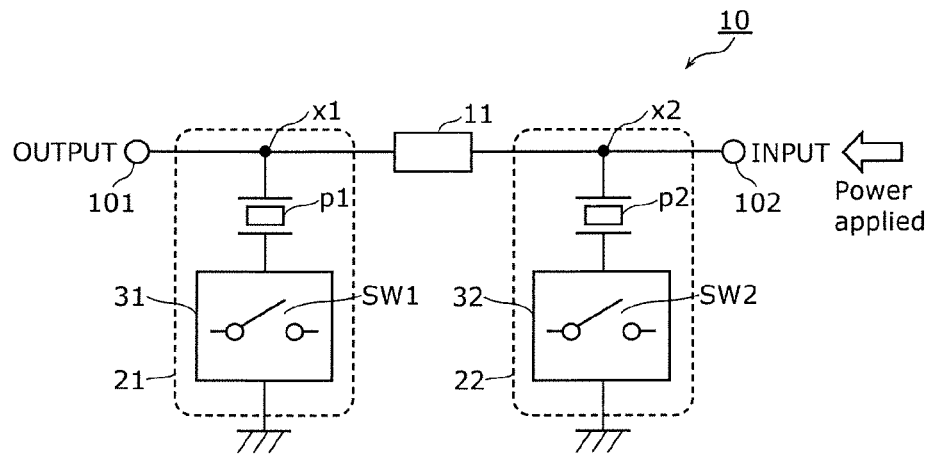
FIG. 1A is a circuit block diagram illustrating a filter according to Embodiment 1.

The following describes in detail embodiments of the present disclosure, using examples and drawings. Note that the embodiments described below each show a general or specific example. The numerical values, shapes, materials, elements, the arrangement and connection of the elements, and others indicated in the following embodiments are mere examples, and therefore are not intended to limit the present disclosure. Thus, among the elements in the following embodiments, elements not recited in any independent claim are described as arbitrary elements. In addition, the sizes of elements and the ratios of the sizes illustrated in the drawings are not necessarily accurate. Throughout the drawings, the same numeral is given to substantially the same element, and redundant description is omitted or simplified.

In the following, a "passband low-frequency edge" means "the lowest frequency in a passband". A "passband high-frequency edge" means "the highest frequency in a passband". In the following, a "passband low-frequency side" means "a lower frequency side relative to a passband, which is outside the passband". A "passband high-frequency side" means "a higher frequency side relative to a passband, which is outside the passband". "High-frequency" generally means frequencies in the radio frequency (RF) band (e.g., 800 MHz to 900 MHz range), and thus radio-frequency filter and RF filter are used synonymously herein.

A resonant frequency of a resonator or a circuit is for forming an attenuation pole in or near a passband of a filter that includes the resonator or the circuit, and is a frequency at a "resonance point" that is a singular point at which impedance of the resonator or the circuit has a local minimum value (a point at which the impedance is ideally 0), unless otherwise stated.

An antiresonant frequency of a resonator or a circuit is for forming an attenuation pole in or near a passband of a filter that includes the resonator or the circuit, and is a frequency at an "antiresonance point" that is a singular point at which impedance of the resonator or the circuit has a local maximum value (a point at which the impedance is ideally infinite), unless otherwise stated.

Note that a series-arm circuit and a parallel-arm circuit in the following embodiments are defined as follows.

A parallel-arm circuit is disposed between the ground and a node on a path that connects a first input/output terminal and a second input/output terminal.

A series-arm circuit is disposed between the node on the path connected with the parallel-arm circuit and the first input/output terminal or the second input/output terminal, or is disposed between a node on the path connected with a parallel-arm circuit and another node on the path connected with another parallel-arm circuit.

Embodiment 1

1. Basic Configuration of Radio-Frequency Filter

FIG. 1A is a circuit block diagram illustrating filter 10 according to Embodiment 1. Filter 10 illustrated in FIG. 1A includes series-arm circuit 11, parallel-arm circuits 21 and 22, output terminal 101, and input terminal 102.

Filter 10 is a radio-frequency filter that allows a portion of a high-frequency signal input through input terminal 102 that has a desired frequency to pass through and to be output through output terminal 101. In other words, input terminal 102 is a terminal through which high-frequency power is applied.

Note that high-frequency power may be applied through output terminal 101 when filter 10 is used as a multiplexer or a time division duplex filter (TDD). Specifically, a high-frequency signal may be input through input terminal 102 and output through output terminal 101 during one period, and a high-frequency signal may be input through output terminal 101 and output through input terminal 102 during another period. Note that even in this case, a comparison between high-frequency power applied through input terminal 102 during one period and high-frequency power applied though output terminal 101 during another period shows that the former power is greater than the latter power. Stated differently, in this case, input terminal 102 of filter 10 is a terminal through which greater high-frequency power is applied, out of output terminal 101 and input terminal 102 through which high-frequency power can be applied.

Series-arm circuit 11 is disposed on a path that connects output terminal 101 and input terminal 102. Series-arm circuit 11 may include a series-arm resonator that is an elastic wave resonator, for example, or may be a resonant circuit that includes a plurality of resonators such as longitudinally coupled resonators. Series-arm circuit 11 may be an LC resonant circuit, or may be an impedance element such as an inductor or a capacitor, rather than being limited to a resonant circuit.

Parallel-arm circuit 21 is a second parallel-arm circuit connected to the ground and node x1 that is a second node on the path, between output terminal 101 and series-arm circuit 11. Parallel-arm circuit 22 is a first parallel arm circuit connected to the ground and node x2 that is a first node on the path, between input terminal 102 and series-arm circuit 11. Parallel-arm circuits 21 and 22 each include a below-described parallel-arm resonator, and a below-described switch circuit connected in series to the parallel-arm resonator.

Specifically, parallel-arm circuit 21 includes parallel-arm resonator p1 that is a second parallel-arm resonator, and switch circuit 31 that is a second switch circuit. Parallel-arm circuit 22 includes parallel-arm resonator p2 that is a first parallel-arm resonator, and switch circuit 32 that is a first switch circuit. Here, switch circuit 31 includes switch SW1 that is a second switch element. Switch circuit 32 includes switch SW2 that is a first switch element.

Parallel-arm circuit 21 and parallel-arm circuit 22 have the same configuration except that nodes connected therewith and circuit constants thereof are different. Specifically, parallel-arm resonator p1 and switch circuit 31 in parallel-arm circuit 21 correspond to parallel-arm resonator p2 and switch circuit 32 in parallel-arm circuit 22, respectively. Below-described switch SW1 in switch circuit 31 corresponds to below-described switch SW2 in switch circuit 32. Accordingly, parallel-arm circuit 21 is described in the following while description of parallel-arm circuit 22 is simplified.

Note that parallel-arm resonator p1 and parallel-arm resonator p2 may include different numbers of split resonators. Parallel-arm circuit 21 and parallel-arm circuit 22 may have different configurations due to at least one of the parallel-arm circuits including a certain element other than the circuit configuration as described below. These matters also apply to the description of circuit configurations in the following.

Parallel-arm resonator p1 is an elastic wave resonator that uses elastic waves, and is, for example, a resonator that uses surface acoustic waves (SAWs), a resonator that uses bulk acoustic waves (BAWs), or a film bulk acoustic resonator (FBAR), for instance. Note that SAWs include not only surface waves, but also boundary waves. Furthermore, parallel-arm resonators p1 and p2 are each represented by an equivalent circuit model that includes an inductance component and a capacitance component (for example, a Butterworth Van Dyke (BVD) model). Note that hereinafter, not only for a resonator but also for a resonance circuit, a frequency at which impedance has a local minimum value is referred to as a "resonant frequency", and a frequency at which impedance has a local maximum value is referred to as an "antiresonant frequency".

Switch circuit 31 is connected in series to parallel-arm resonator p1, and is connected in series to parallel-arm resonator p1, between parallel-arm resonator p1 and the ground in the present embodiment. Note that switch circuit 31 may be connected in series to parallel-arm resonator p1, between node x1 and parallel-arm resonator p1, yet may be preferably connected in the location as in the present embodiment, from the viewpoint of size reduction. This will be described below using examples.

Switch SW1 is a single pole single throw (SPST) switch element that includes one or more transistors that are semiconductor elements. Specifically, switch SW1 includes one or more field effect transistors (FETs), and are for example, GaAs transistors or complementary metal oxide semiconductor (CMOS) transistors. A switch for which such semiconductors are used is small, and thus filter 10 can be miniaturized.

Switch SW1 includes one or more transistors, and includes a plurality of transistors in the present embodiment.

Note that details of the configuration of switch SW1 will be described later together with details of the configuration of switch SW2.

Figure 1B:
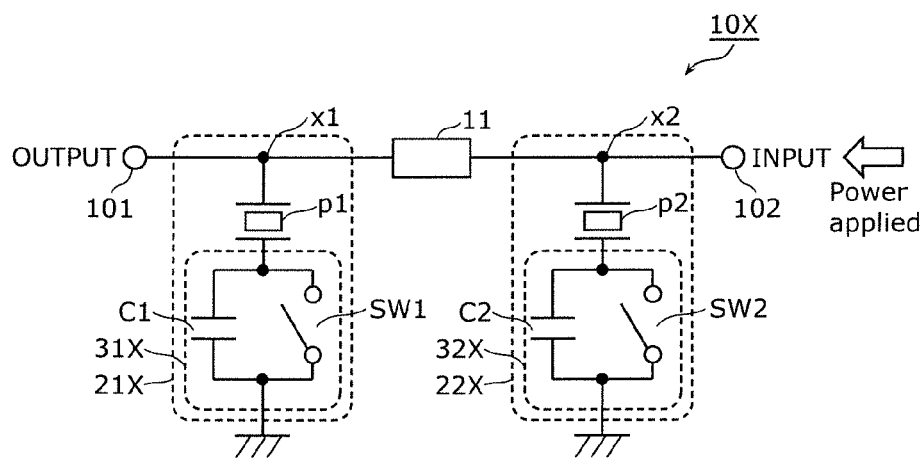
FIG. 1B illustrates a circuit configuration of a filter according to Embodiment 1.

FIG. 1B illustrates a circuit configuration of filter 10X according to Embodiment 1. Filter 10X illustrated in FIG. 1B is a specific example of a circuit configuration of filter 10. Filter 10X includes series-arm circuit 11, parallel-arm circuits 21X and 22X, output terminal 101, and input terminal 102. In the following, description of the configuration of filter 10X same as the configuration of filter 10 is omitted, and a configuration of filter 10X different therefrom is mainly described.

Parallel-arm circuit 21X is an example of parallel-arm circuit 21 described above, and includes switch circuit 31X that is an example of switch circuit 31. Parallel-arm circuit 22X is an example of parallel-arm circuit 22 described above, and includes switch circuit 32X that is an example of switch circuit 32. Specifically, switch circuit 31X includes switch SW1 (second switch element), and capacitor C1 that is one of an inductor and a capacitor and is an example of a second impedance element connected to switch SW1. Switch circuit 32X includes switch SW2 (first switch element), and capacitor C2 that is one of an inductor and a capacitor and is an example of a first impedance element connected to switch SW2.

Switch circuit 31X and switch circuit 32X have the same configuration except that different parallel-arm resonators are connected. Specifically, switch SW1 and capacitor C1 in switch circuit 31X correspond to switch SW2 and capacitor C2 in switch circuit 32X, respectively. Accordingly, switch circuit 31X is described in the following while description of switch circuit 32X is simplified.

As illustrated in FIG. 1B, switch circuit 31X is a circuit constituted by capacitor C1 and switch SW1 connected in parallel. The impedance of switch circuit 31 is changed by switching between on and off of switch SW1 according to a control signal from a controller (not illustrated) such as a radio frequency integrated circuit (RFIC).

The resonant frequency of parallel-arm circuit 21X that includes switch circuit 31X forms an attenuation pole on the passband low-frequency side of filter 10X. The range in which a frequency of the attenuation pole on the passband low-frequency side of filter 10X can be changed is dependent on the element value of capacitor C1, and for example, the smaller the element value of capacitor C1 is, the greater the range in which the frequency can be changed is. Accordingly, the element value of capacitor C1 may be determined as appropriate according to the frequency specification that filter 10X is to have. Capacitor C1 may be a variable capacitor such as a digitally tunable capacitor (DTC).

The above circuit configuration switches between on and off of switch SW1, thus changing the impedance of switch circuit 31X, so that the resonant frequency of parallel-arm circuit 21X is changed. Specifically, parallel-arm circuit 21X has a resonant frequency and an antiresonant frequency, and the resonant frequency is switched to a lower or higher frequency according to on (conducting state) and off (nonconducting state) of switch SW1.

In filter 10X, switch circuit 31X includes capacitor C1 and switch SW1 connected in parallel, and thus the resonant frequency of parallel-arm circuit 21X is switched to a higher frequency by switching switch SW1 from on to off. A passband and an attenuation band of filter 10X are determined by the resonant frequencies and the antiresonant frequencies of series-arm circuit 11 and parallel-arm circuits 21X and 22X, and thus the frequency ranges of the passband and the attenuation band of filter 10X can be changed by switching between on and off of switches SW1 and SW2.

Note that filter 10 according to the present embodiment may not have a configuration in which a switch circuit includes a capacitor, as filter 10X does.

Figure 1C:
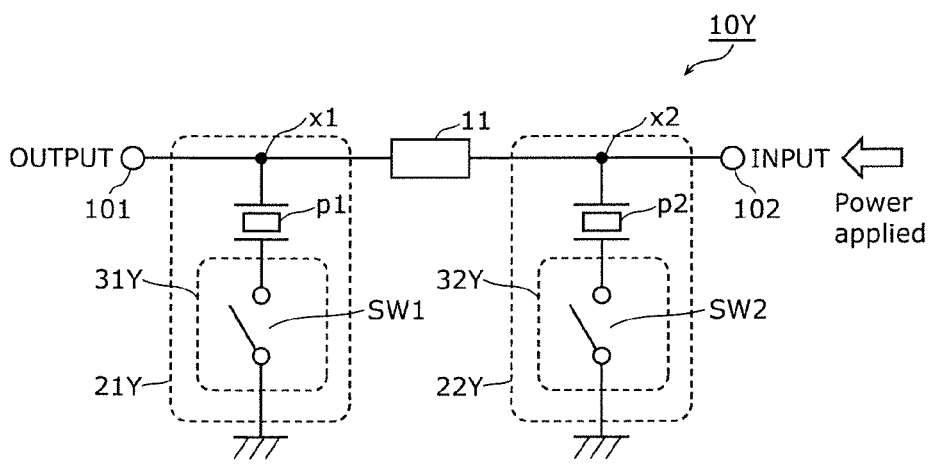
FIG. 1C illustrates a circuit configuration of a filter according to a variation of Embodiment 1.

FIG. 1C illustrates a circuit configuration of filter 10Y according to a variation of Embodiment 1. Filter 10Y illustrated in FIG. 1C is a specific example of a circuit configuration of filter 10. Filter 10Y includes series-arm circuit 11, parallel-arm circuits 21Y and 22Y, output terminal 101, and input terminal 102. In the following, description of the configuration of filter 10Y same as the configuration of filter 10 is omitted, and a configuration of filter 10Y different therefrom is mainly described.

Parallel-arm circuit 21Y is another example of parallel-arm circuit 21 described above, and includes switch circuit 31Y that is another example of switch circuit 31. Switch circuit 31Y is different from switch circuit 31X in a point that capacitor C1 is not included. Parallel-arm circuit 22Y is another example of parallel-arm circuit 22 described above, and includes switch circuit 32Y that is another example of switch circuit 32. Switch circuit 32Y is different from switch circuit 32X in a point that capacitor C1 is not included.

The above circuit configuration switches between the conducting and non-conducting states of switch SW1, thus changing the impedance of switch circuit 31Y. Further, the above circuit configuration switches between the conducting and non-conducting states of switch SW2, thus changing the impedance of switch circuit 32Y. More specifically, when switches SW1 and SW2 are non-conducting, the passing characteristics of filter 10Y are characteristics that only series-arm circuit 11 contributes (for example, trapping characteristics achieved by series-arm circuit 11). On the other hand, when switches SW1 and SW2 are conducting, the passing characteristics of filter 10Y are characteristics of a ladder filter that includes series-arm circuit 11 and parallel-arm resonators p1 and p2. Specifically, the frequency ranges of the passband and the attenuation band of filter 10Y can be changed by switching between the conducting and non-conducting states of switches SW1 and SW2.

The following describes in detail the structures of switches SW1 and SW2 included in filter 10, using switch IC50.

2. Structure and Characteristics of Switch Element

Figure 2A:
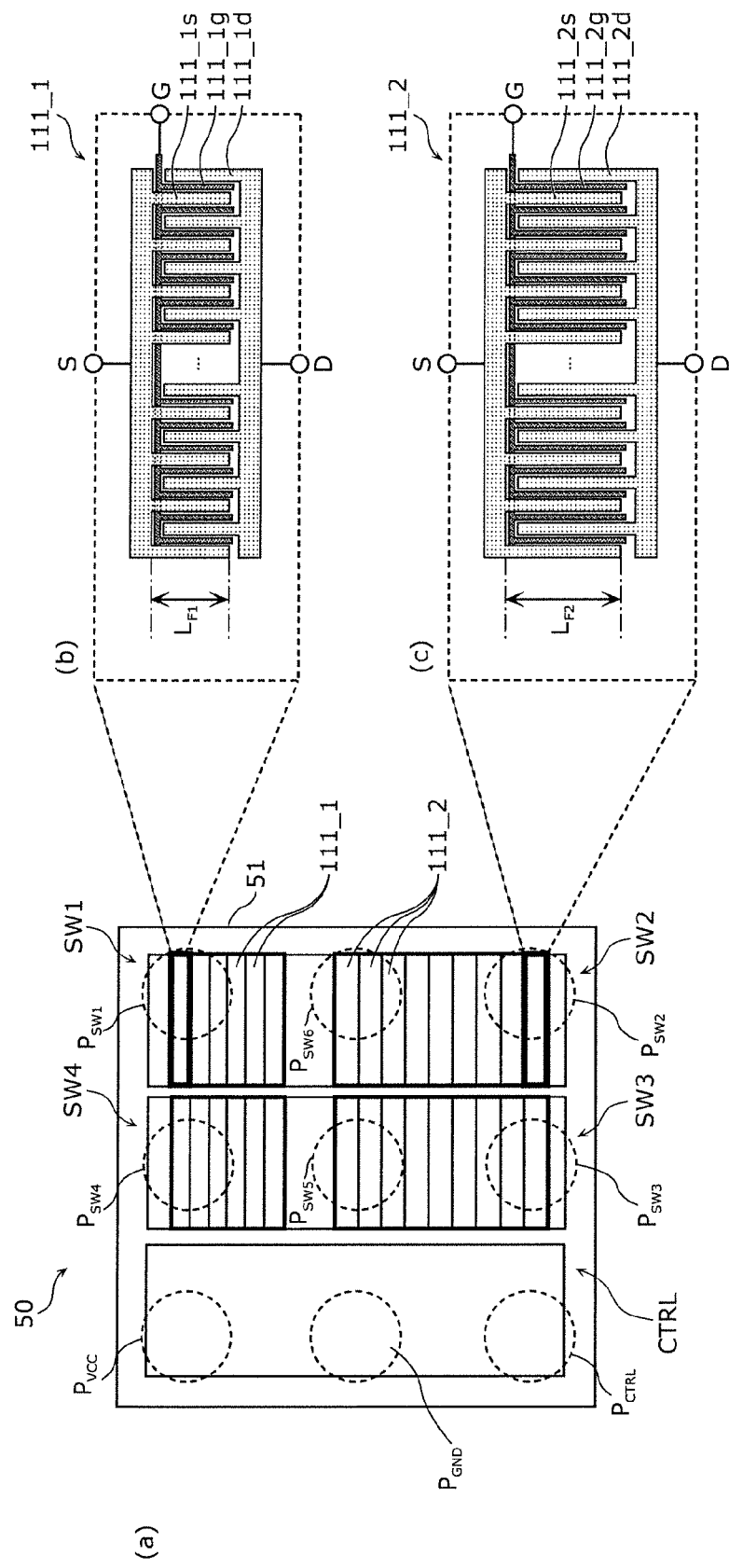
FIG. 2A is a schematic diagram illustrating a configuration of a switch.
Figure 2B:
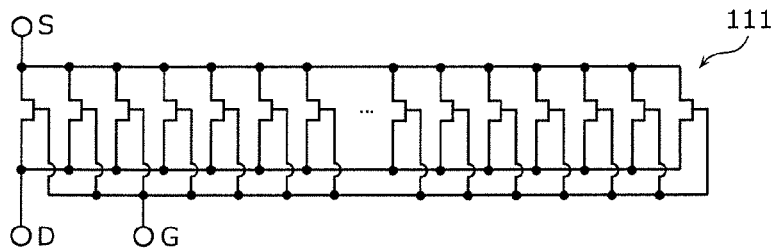
FIG. 2B illustrates a circuit configuration of a transistor included in the switch.

FIG. 2A is a schematic diagram illustrating a configuration of switch IC50 according to Embodiment 1. FIG. 2B illustrates a circuit configuration of transistor 111 included in switch IC50. Part (a) of FIG. 2A illustrates implementation of switch IC that includes four switches SW1 to SW4 including two switches SW1 and SW2 that are included in filter 10 according to Embodiment 1. Note that the configuration of switch IC50 used for filter 10 in FIG. 1A is not limited to the configuration illustrated in FIG. 2A, and may be a configuration that includes only switches SW1 and SW2 out of switches SW1 to SW4 illustrated in FIG. 2A.

As illustrated in (a) of FIG. 2A, switches SW1 to SW4 are formed on substrate 51. Power supply terminal $P_{VCC}$, control terminal $P_{CTRL}$, three ground terminals $P_{GND}$, and switch terminals $P_{SW1}$, $P_{SW2}$, $P_{SW3}$, $P_{SW4}$, $P_{SW5}$, and $P_{SW6}$ are disposed on the back surface of substrate 51. Switch SW1 is connected between switch terminals $P_{SW1}$ and $P_{SW6}$, switch SW2 is connected between switch terminals $P_{SW2}$ and $P_{SW6}$, switch SW3 is connected between switch terminals $P_{SW3}$ and $P_{SW5}$, and switch SW4 is connected between switch terminals $P_{SW4}$ and $P_{SW5}$.

Control circuit CTRL that operates using power supply voltage VCC supplied from a power supply circuit such as, for example, a power management IC, and generates switch driving voltages for turning on and off switches SW1 to SW4 individually according to, for example, control signals input from the RFIC is disposed on substrate 51.

Each of switches SW1 to SW4 includes one or more transistors 111, and here has a configuration in which a plurality of transistors 111 are connected in series.

As illustrated in (b) of FIG. 2A, transistor 111_1 included in switch SW1 is an FET that includes, for example, a source electrode that includes a plurality of source electrode fingers 111_1s, a drain electrode that includes a plurality of drain electrode fingers 111_1d, and a gate electrode that includes a plurality of gate electrode fingers 111_1g. As illustrated in (c) of FIG. 2A, transistor 111_2 included in switch SW2 is an FET that includes, for example, a source electrode that includes a plurality of source electrode fingers 111_2s, a drain electrode that includes a plurality of drain electrode fingers 111_2d, and a gate electrode that includes a plurality of gate electrode fingers 111_2g. In other words, in each of transistors 111 (111_1 and 111_2), a plurality of unit FETs that each include a source electrode finger, a drain electrode finger, and a gate electrode finger facing one another are disposed in parallel (to be pectinate).

In switches SW1 to SW4 having such a configuration, the common length of the electrode fingers included in one transistor 111 is referred to as finger length $L_F$, and a product of finger length $L_F$ and finger count $N_F$ is referred to as gate width W. Further, the number of transistors 111 connected in series and included in one switch is referred to as stack count Ns.

Here, gate width W2 of each of one or more (here, a plurality of) transistors 111_2 included in switch SW2 that is the first switch element is greater than gate width W1 of at least one of one or more (here, a plurality of) transistors 111_1 included in switch SW1 that is the second switch element. The following gives a description, assuming that switch SW2 includes a plurality of transistors 111_2 having the same configuration, and switch SW1 includes a plurality of transistors 111_1 having the same configuration, to simplify the description. At this time, gate width W2 of each of transistors 111_2 included in switch SW2 is greater than gate width W1 of each of transistors 1111 included in switch SW1. Note that in the following, the gate width of a transistor included in a switch may be simply referred to as a "gate width of a switch".

For example, when finger count $N_{F1}$ of switch SW1 and finger count $N_{F2}$ of switch SW2 are the same, finger length $L_{F2}$ of switch SW2 is longer than finger length $L_{F1}$ of switch SW1, as illustrated in (b) and (c) of FIG. 2A. Note that the present embodiment is not limited thereto, and finger length $L_{F2}$ of switch SW2 may be the same as finger length $L_{F1}$ of switch SW1. In this case, finger count $N_{F2}$ of switch SW2 is higher than finger count $N_{F1}$ of switch SW1. It is sufficient if switches SW1 and SW2 have gate widths that satisfy the above relations, switches SW1 and SW2 may have different finger lengths and different finger counts.

As illustrated in (a) of FIG. 2A, stack count Ns2 of transistors 111_2 (here, nine transistors) included in switch SW2 is higher than stack count Ns1 of transistors 111_1 (here, six transistors) included in switch SW1. In other words, stack count Ns1 of switch SW1 that is the second switch element in parallel-arm circuit 21 (second parallel-arm circuit) is lower than stack count Ns2 of switch SW2 that is the first switch element in parallel-arm circuit 22 (first parallel-arm circuit). Note that in the following, the stack count of transistors included in a switch may be simply referred to as "a stack count of a switch".

Switches SW1 and SW2 are designed as follows in filter 10 having a frequency-tunable function achieved by switch SW1 of parallel-arm circuit 21 and switch SW2 of parallel-arm circuit 22 as described above. Specifically, gate width W2 of switch SW2 of parallel-arm circuit 22 connected closer to input terminal 102 is designed to be greater than gate width W1 of switch SW1 in parallel-arm circuit 21. Stack count Ns1 of switch SW1 is designed to be lower than stack count Ns2 of switch SW2.

Accordingly, filter 10 can ensure power durability, while achieving reduction in size and passband insertion loss. This is to be described, using a relation between gate width W and switch characteristics and a relation between stack count Ns and switch characteristics.

Figure 3A:
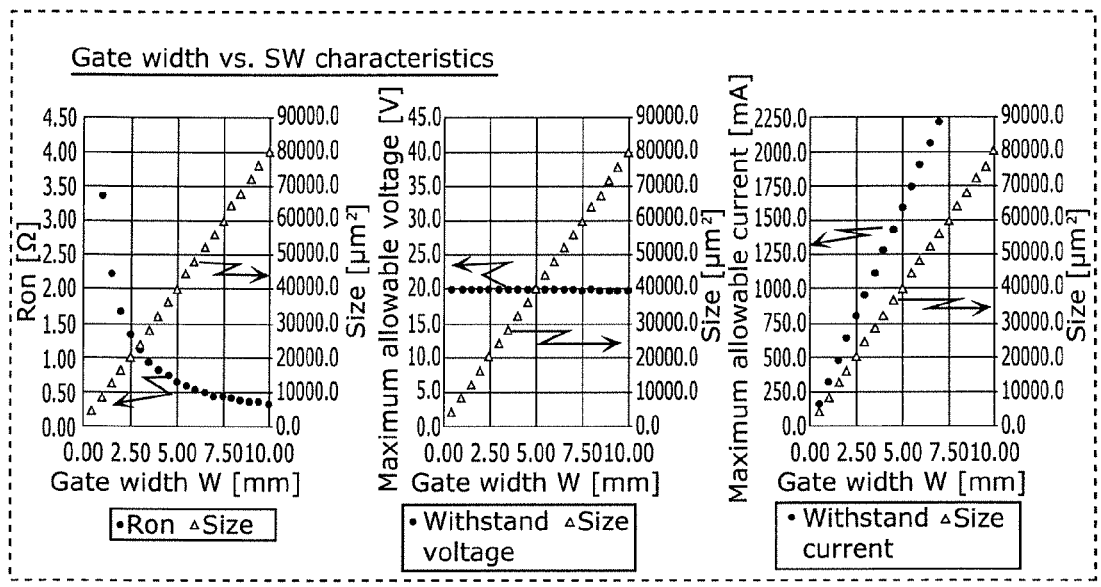
FIG. 3A illustrates graphs showing relations between a gate width and characteristics of the switch according to Embodiment 1.
Figure 3B:
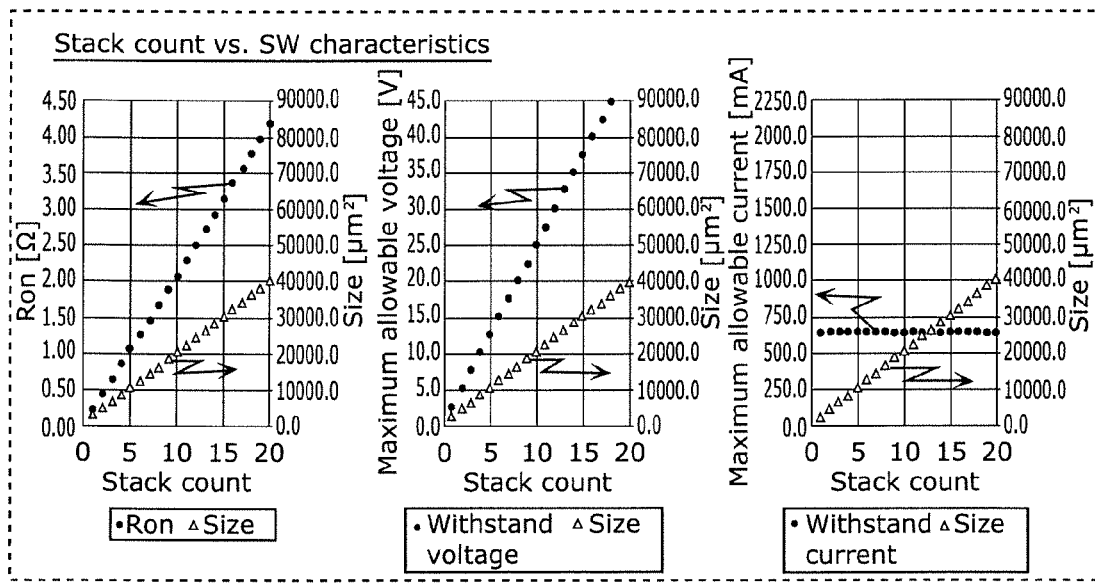
FIG. 3B illustrates graphs showing relations between a stack count and characteristics of the switch according to Embodiment 1.

FIG. 3A illustrates graphs showing a relation between gate width W and switch characteristics of a switch that includes transistors 111 when stack count Ns is fixed. FIG. 3B illustrates graphs showing a relation between stack count Ns and switch characteristics of a switch that includes transistors 111 when gate width W is fixed.

As illustrated in the left graph in FIG. 3A, when stack count Ns is fixed, the greater gate width W of a switch is, the lower on resistance Ron of the switch is. Here, on resistance is a resistance when a switch is conducting. In this case, the withstand voltage (the maximum allowable voltage when a switch is off) is constant, independently of gate width W as illustrated in the center graph in FIG. 3A. As illustrated in the right graph in FIG. 3A, the greater gate width W of a switch is, the greater the withstand current of the switch (the maximum allowable current when the switch is on) is. Further, in this case, the greater gate width W of a switch is, the greater the size of the switch is, as illustrated in the left graph, the center graph, and the right graph in FIG. 3A.

Note that when stack count Ns is fixed, the withstand voltage and the withstand current of transistor 111 depend on widths of source electrode finger 111s and drain electrode finger 111d and the gap between electrode fingers, and thus are restricted by the limit to mechanical machining and the material of transistor 111. One transistor 111 has a withstand voltage of about 2.5 V and a withstand current of about 318 mA/mm for the gate width.

When gate width W is fixed, the higher stack count Ns of a switch is, the higher on resistance Ron and the withstand voltage of the switch are, as illustrated in the left graph and the center graph in FIG. 3B. As illustrated in the right graph in FIG. 3B, the withstand current is constant independently of stack count Ns, in this case. Further, in this case, the higher stack count Ns is, the greater the size is, as illustrated in the left graph, the center graph, and the right graph in FIG. 3B.

Thus, a switch that includes transistors 111 is in a trade-off relationship that the on resistance decreases with an increase in gate width W, which results in an increase in the size on the contrary. Furthermore, the switch is in a trade-off relationship that the withstand voltage increases with an increase in stack count Ns, which results in an increase in the on resistance and also an increase in the size on the contrary.

Note that even if transistors have identical gate width W, the shorter finger length $L_F$ is and the higher finger count Nf is, the lower on resistance is. This is due to a decrease in the resistance component of an electrode finger in the longitudinal direction with a decrease in finger length $L_F$. Accordingly, when gate width W is fixed, a configuration in which the finger count is increased while finger length $L_F$ is decreased can further decrease the on resistance and also improve the current withstand capability, as compared with a configuration in which the finger count is decreased while finger length $L_F$ is increased.

The inventor of the present application has found the following from these relations, with regard to a radio-frequency filter having a frequency-tunable function achieved by switches SW1 and SW2 of parallel-arm circuits 21 and 22.

Specifically, greater current flows through switch SW2 of parallel-arm circuit 22 connected closer to input terminal 102 when switch SW2 is on than current that flows through switch SW1 of parallel-arm circuit 21. Thus, switch SW2 is to have high current withstand capability, whereas the current withstand capability that switch SW1 is to have is not high. Accordingly, filter 10 can be miniaturized while ensuring current withstand capability, by making gate width W2 of switch SW2 greater than gate width W1 of switch SW1. Further, the on resistance of switch SW2 can be decreased, and thus loss can be reduced when switch SW2 is on.

A higher voltage may be applied to switch SW2 of parallel-arm circuit 22 connected closer to input terminal 102 when switch SW2 is off than a voltage applied to switch SW1 of parallel-arm circuit 21. This is due to the configuration of filter 10X in which switch SW1 is connected in parallel to capacitor C1, and switch SW2 is connected in parallel to capacitor C2. Accordingly, in this case, switch SW2 is to have high voltage withstand capability, whereas the voltage withstand capability that switch SW1 is to have is not high. Accordingly, filter 10 can be miniaturized, while voltage withstand capability is ensured, by making stack count Ns1 of switch SW1 lower than stack count Ns2 of switch SW2. The on resistance per transistor 111 is high since switch SW1 has a narrower gate width than that of switch SW2, yet switch SW1 has a lower stack count than that of switch SW2. Accordingly, the on resistance of entire switch SW1 that is represented by a value as a result of multiplying the on resistance per transistor 111 by the stack count can be reduced. Accordingly, loss can be reduced when switch SW1 is on.

Note that in the following, a voltage applied to a switch may be referred to as "a voltage across a switch" or "a voltage across a switch element".

3. Relation Between Voltage Across Switch Element and Structure of Switch Element The magnitudes of voltage Vs1 across switch SW1 and voltage Vs2 across switch SW2 are proportional to the magnitude of high-frequency power applied to filter 10. In particular, when switches SW1 and SW2 are off in a configuration in which switch SW1 is connected in parallel to capacitor C1 and switch SW2 is connected in parallel to capacitor C2, the impedance of switches SW1 and SW2 is high, and thus voltages Vs1 and Vs2 are high.

In a typical switch element, a plurality of transistors are stacked (connected in series) so that a voltage applied to the transistors is divided. However, if the stack count is increased, the size of the switch element increases, and also the on resistance of the switch element increases.

Specifically, if the number of stacked transistors is increased, the power durability of the filter improves, but nevertheless the size of the filter increases and also the on resistance increases, and thus passband insertion loss when the switch element is on increases. On the other hand, if the number of stacked transistors is reduced, power durability of the filter decreases, yet the size of the filter can be decreased and also the on resistance can be decreased, and thus passband insertion loss when the switch element is on is decreased. Thus, adjusting the number of stacked transistors included in a switch element is in a relationship of trade-off between (i) power durability and (ii) the size of the switch element and passband insertion loss.

From the above viewpoint, if parallel-arm circuits include switch elements having the same stack count in order to achieve power durability that a radio-frequency filter having a frequency-tunable function is to have, this raises a problem that either power durability lowers or the size of the filter and passband insertion loss increase.

In filter 10 according to the present embodiment, the magnitude of voltage Vs1 across switch SW1 is dependent on which of output terminal 101 and input terminal 102 high-frequency power is applied through (high-frequency power application direction), and the resonant frequency of parallel-arm resonator p1. Further, the magnitude of voltage Vs2 across switch SW2 is dependent on the high-frequency power application direction and the resonant frequency of parallel-arm resonator p2. For example, a high-frequency voltage due to the application of high-frequency power to input terminal 102 is higher as closer to input terminal 102. Stated differently, when high-frequency power is applied through input terminal 102, a high-frequency voltage applied to parallel-arm circuit 22 is higher than a high-frequency voltage applied to parallel-arm circuit 21. Further, the high-frequency voltage applied to parallel-arm circuit 22 is divided by parallel-arm resonator p2 and switch circuit 32, yet the ratio at which the voltage is divided depends on the impedance of parallel-arm resonator p2 and switch circuit 32. Impedance of parallel-arm resonator p2 greatly changes due to the resonant frequency and the antiresonant frequency, and thus out of the high-frequency voltage applied to parallel-arm circuit 22, a high-frequency voltage applied to switch circuit 32 changes due to resonance characteristics of parallel-arm resonator p2.

Thus, the magnitudes of voltages Vs1 and Vs2 across switches SW1 and SW2 are dependent on which of output terminal 101 and input terminal 102 high-frequency power is applied through (high-frequency power application direction), and resonant frequencies of parallel-arm resonators p1 and p2 (parallel-arm circuits 21 and 22).

According to the above configuration, stack count Ns1 of switch SW1 is designed to be lower than stack count Ns2 of switch SW2 in a configuration in which voltage Vs1 across switch SW1 is lower than voltage Vs2 across switch SW2.

According to this, in order to ensure a withstand voltage against input high-frequency power, if stack count Ns1 of switch SW1 is made lower than stack count Ns2 of switch SW2 in filter 10 having the above circuit configuration, as compared with a conventional configuration in which all the switch elements are equally configured, that is, all the switch elements have the same stack count, the following advantageous effects can be yielded. Accordingly, as compared with the above conventional configuration, a circuit can be miniaturized along with a reduction in stack count Ns1. In addition, stack count Ns1 of switch SW1 is relatively decreased, and thus the on resistance of switch SW1 can be decreased, so that passband insertion loss of filter 10 when switch SW1 is on can be reduced. On the other hand, stack count Ns2 of switch SW2 across which a relatively high voltage is applied is higher than stack count Ns1 of switch SW1 so that power durability of filter 10 is ensured. Thus, power durability can be ensured while achieving reduction in size of the filter and loss when the switches in parallel-arm circuits 21 and 22 are conducting.

4. Analysis of Voltage Applied to Switch

Here, a result of analyzing what kind of circuit parameter a voltage across a switch included in a parallel-arm circuit as described above influences is to be described.

Figure 4:
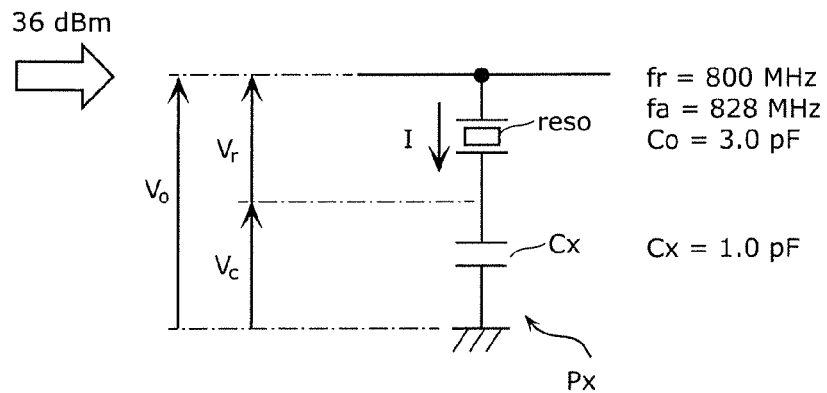
FIG. 4 illustrates an equivalent circuit of a parallel-arm circuit.

FIG. 4 illustrates an equivalent circuit of parallel-arm circuit Px corresponding to parallel-arm circuit Py (see FIG. 6A) and parallel-arm circuit Pz (see FIG. 6E) as will be described below. In FIG. 4, parallel-arm circuit Px has a configuration in which resonator reso and capacitor Cx are connected in series. Capacitance Cx of capacitor Cx corresponds to the off capacitance of a switch in parallel-arm circuit Py, or a combined capacitance of the off capacitance of a switch and the capacitance of a capacitor connected in parallel to the switch in parallel-arm circuit Pz. Here, "off capacitance of a switch" is a capacitance component when the switch is non-conducting (off).

Figure 5:
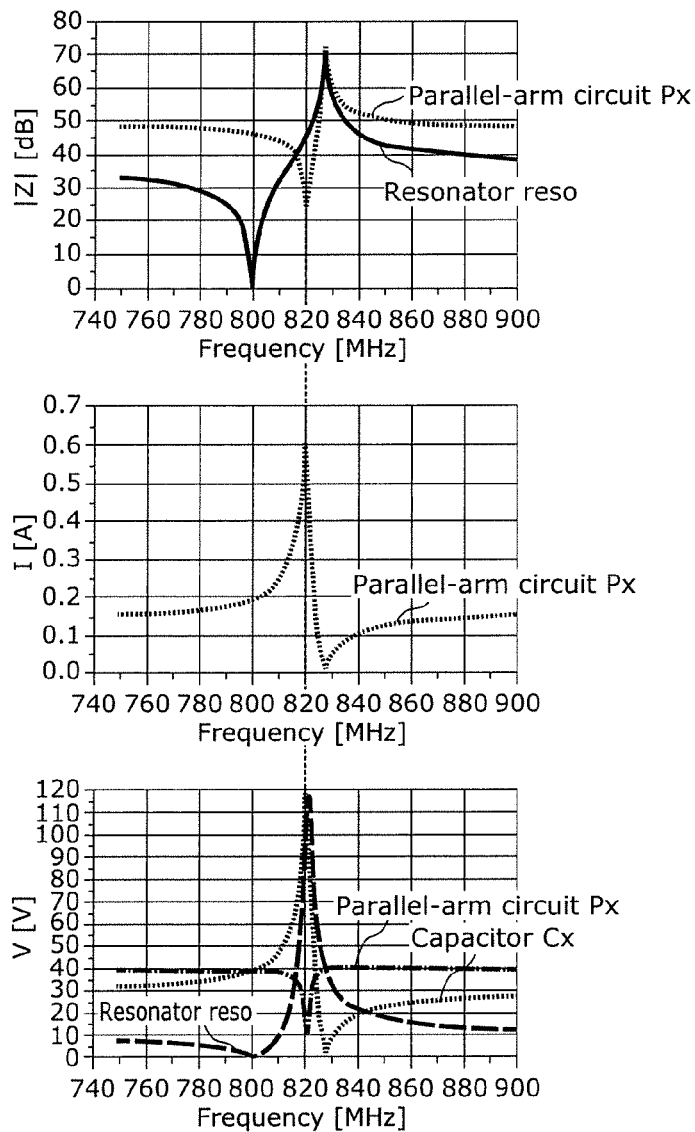
FIG. 5 illustrates graphs showing impedance characteristics, current characteristics, and voltage characteristics of the parallel-arm circuit.

FIG. 5 illustrates graphs showing impedance characteristics, current characteristics, and voltage characteristics of parallel-arm circuit Px. Note that FIG. 5 may also represent the characteristics of resonator reso and capacitor Cx included in parallel-arm circuit Px, in addition to the characteristics of parallel-arm circuit Px.

As illustrated in the top graph in FIG. 5, the resonant frequency of parallel-arm circuit Px is higher than the resonant frequency of resonator reso. As illustrated in the middle graph in FIG. 5, current I that flows through parallel-arm circuit Px is the greatest at the resonant frequency of parallel-arm circuit Px. This is due to the impedance of parallel-arm circuit Px having a local minimum value at the resonant frequency of parallel-arm circuit Px. As illustrated in the bottom graph in FIG. 5, voltage $V_O$ applied to parallel-arm circuit Px has a local minimum value at the resonant frequency of parallel-arm circuit Px, yet (the absolute value of) voltage $V_c$ applied to capacitor Cx and (the absolute value of) voltage $V_r$ applied to resonator reso have local maximum values at the resonant frequency of parallel-arm circuit Px. Thus, voltage $V_C$ applied to capacitor Cx and current I flowing therethrough are the highest/greatest at the resonant frequency of parallel-arm circuit Px. Stated differently, a voltage applied to and a current flowing through an off capacitor having the off capacitance and a combined capacitor having the combined capacitance, which are described above as corresponding to capacitance Cx of capacitor Cx connected in series to resonator reso, can be the highest/greatest at the resonant frequency of parallel-arm circuit Px.

Figure 6A:
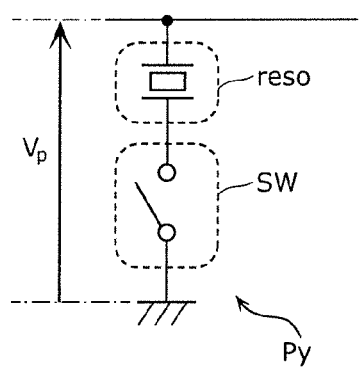
FIG. 6A illustrates a circuit configuration of a parallel-arm circuit.
Figure 6B:
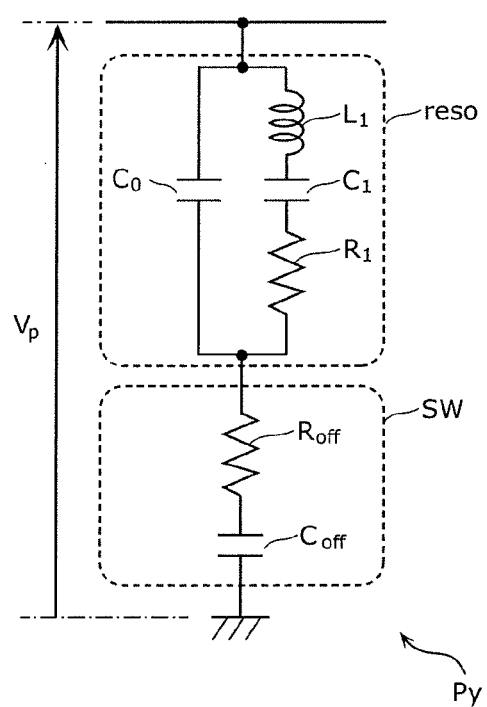
FIG. 6B illustrates an equivalent circuit of the parallel-arm circuit when the switch is off.
Figure 6C:
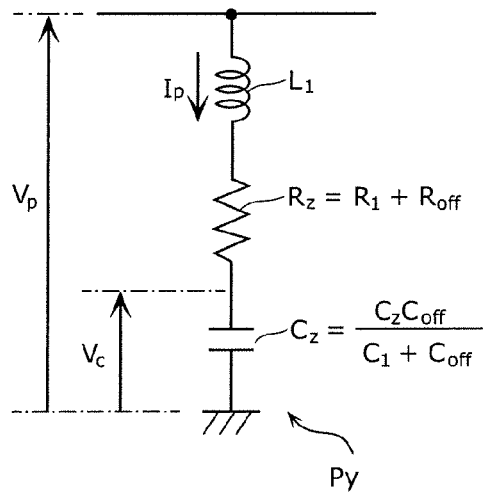
FIG. 6C illustrates an equivalent circuit of the parallel-arm circuit at a resonant frequency thereof when the switch is off.

FIG. 6A illustrates a circuit configuration of parallel-arm circuit Py. FIG. 6B illustrates an equivalent circuit of parallel-arm circuit Py when the switch is off. FIG. 6C illustrates an equivalent circuit of parallel-arm circuit Py at a resonant frequency thereof when the switch is off.

As illustrated in FIG. 6A, parallel-arm circuit Py is a circuit constituted by resonator reso and switch SW connected in series. As illustrated in FIG. 6B, resonator reso is represented by a circuit in which capacitor $C_0$ having electrostatic capacitance $C_0$ of resonator reso is connected in parallel to a circuit constituted by inductor $L_1$ having inductance $L_1$, capacitor $C_1$ having capacitance $C_1$, and resistor $R_1$ having resistance $R_1$ connected in series. Switch SW is represented by a circuit constituted by resistor $R_{off}$ having resistance $R_{off}$ and off capacitor $C_{off}$ having off capacitance $C_{off}$ connected in series. Here, "resistor $R_{off}$" is a resistance component when a switch is non-conducting (off). Further, an equivalent circuit of parallel-arm circuit Py at the resonant frequency thereof is represented by a circuit in which inductor $L_1$, resistor $R_z$ having resistance $R_z$, and capacitor $C_z$ having capacitance $C_z$ are connected in series as in FIG. 6C. Here, resistance $R_z$ and capacitance $C_z$ are represented by Expression 1 and Expression 2, respectively.

[Math 1]
$$R_Z = R_1 + R_{off} \quad \text{(Expression 1)}$$

[Math 2]
$$C_Z = \frac{C_1 \cdot C_{off}}{C_1 + C_{off}} \quad \text{(Expression 2)}$$

Impedance Zp of parallel-arm circuit Py at the resonant frequency of parallel-arm circuit Py is represented by Expression 3 based on the equivalent circuit in FIG. 6C, and current Ip flowing through parallel-arm circuit Py when reference voltage Vp is applied to parallel-arm circuit Py is represented by Expression 4.

[Math 3]
$$Z_p = R_Z + j\omega_r L_1 + \frac{1}{j\omega_r C_Z} \quad \text{(Expression 3)}$$

[Math 4]
$$I_p = \frac{V_p}{R_Z + j\omega_r L_1 + \frac{1}{j\omega_r C_Z}} \quad \text{(Expression 4)}$$

Here, Expression 5 holds at the resonant frequency of parallel-arm circuit Py.

[Math 5]
$$j\omega L_1 = \frac{1}{j\omega_r C_Z} \quad \text{(Expression 5)}$$

Accordingly, current Ipr flowing through parallel-arm circuit Py at the resonant frequency of parallel-arm circuit Py is represented by Expression 6.

[Math 6]
$$I_{pr} = \frac{V_p}{R_Z} \quad \text{(Expression 6)}$$

Voltage Vc applied to capacitor Cz at the resonant frequency of parallel-arm circuit Py is represented by Expression 7.

[Math 7]
$$|V_C| = \left|I_p \frac{1}{j\omega_r C_Z}\right| = I_p \frac{1}{\omega_r C_Z} = \frac{V_p}{\omega_r C_Z R_Z} \quad \text{(Expression 7)}$$

At the resonant frequency of parallel-arm circuit Py, $\omega r = 1/\sqrt{(L_1 C_z)}$ is satisfied, and thus if this is substituted into Expression 7, voltage Vc is as represented by Expression 8.

[Math 8]
$$V_C = I_p \frac{V_p}{\frac{1}{\sqrt{L_1 C_Z}} C_Z R_Z} = \frac{V_p \sqrt{L_1 C_Z}}{C_Z R_Z} = \frac{V_p}{R_Z}\sqrt{\frac{L_1}{C_Z}} \quad \text{(Expression 8)}$$

Note that the sharpness of resonance (Q factor) is represented by Expression 9.

[Math 9]
$$Q = \frac{1}{R_Z}\sqrt{\frac{L_1}{C_Z}} \quad \text{(Expression 9)}$$

From Expressions 8 and 9, voltage Vc is as represented by Expression 10.

[Math 10]
$$V_C = Q \cdot V_p \quad \text{(Expression 10)}$$

Accordingly, Expression 10 shows that voltage Vc applied to capacitor Cz is Q times reference voltage Vp of parallel-arm circuit Py, and a voltage higher than reference voltage Vp is applied to switch SW in parallel-arm circuit Py when switch SW is off.

Figure 6D:
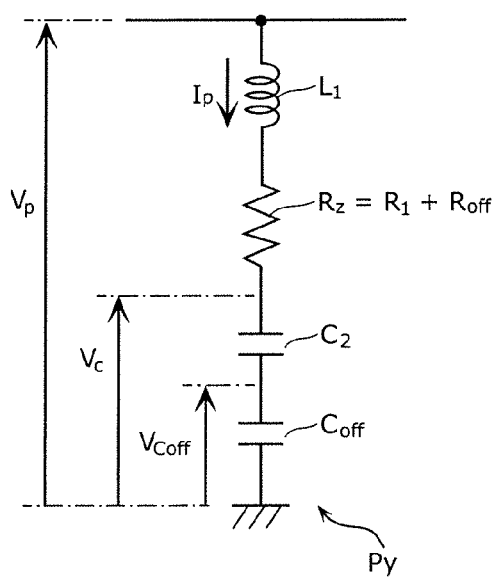
FIG. 6D illustrates an equivalent circuit of the parallel-arm circuit at the resonant frequency thereof when the switch is off.

FIG. 6D illustrates an equivalent circuit of parallel-arm circuit Py at the resonant frequency thereof when switch SW is off. The equivalent circuit illustrated in FIG. 6D is a result of decomposing capacitance Cz into off capacitance $C_{off}$ of switch SW. In this case, voltage $V_{Coff}$ applied to off capacitor $C_{off}$ is represented by Expression 11, and the lower off capacitance $C_{off}$ of switch SW is, the lower a voltage applied to off capacitor $C_{off}$ of switch SW is. The lower the Q factor at the resonant frequency is, the lower the voltage applied to off capacitor $C_{off}$ of switch SW is.

[Math 11]
$$V_{Coff} = \frac{C_{off}}{C_Z}V_C = \frac{C_{off}}{C_1 + C_{off}}V_C = \frac{C_{off}}{C_1 + C_{off}}Q \cdot V_p \quad \text{(Expression 11)}$$

Here, consider a circuit in which capacitor $C_{p1}$ having capacitance $C_{p1}$ is connected in parallel to switch SW, based on parallel-arm circuit Py.

Figure 6E:
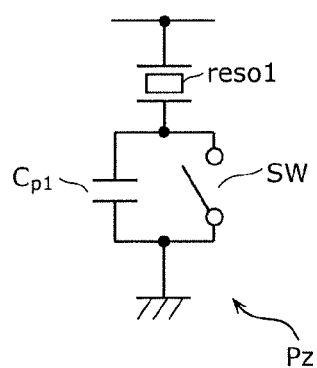
FIG. 6E illustrates a circuit configuration of a parallel-arm circuit.
Figure 6F:
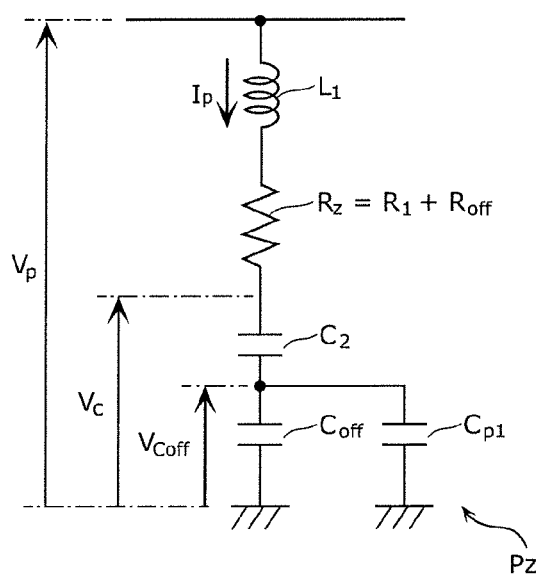
FIG. 6F illustrates an equivalent circuit of the parallel-arm circuit at a resonant frequency thereof when the switch is off.

FIG. 6E illustrates a circuit configuration of parallel-arm circuit Pz. FIG. 6F illustrates an equivalent circuit of parallel-arm circuit Pz at the resonant frequency thereof when switch SW is off.

From the equivalent circuit model of resonator reso illustrated in FIG. 6B, resonant frequency fr and antiresonant frequency fa of resonator reso are represented by Expressions 12 and 13, respectively.

[Math 12]
$$f_a = f_r\sqrt{1 + \frac{C_1}{C_0}} \quad \text{(Expression 12)}$$

-continued

[Math 13]

$$f_r = \frac{1}{2\pi\sqrt{L_1 C_1}} \quad \text{(Expression 13)}$$

From a mathematical expression as a result of changing $C_{off}$ in Expression 11 to ($C_{off}+C_{p1}$) and Expressions 12 and 13, voltage $V_{Coff}$ applied to off capacitor $C_{off}$ in parallel-arm circuit Pz is represented by Expression 14.

[Math 14]

$$V_{Coff} = \frac{C_{off} + C_{p1}}{C_0\left(\left(\frac{f_a}{f_r}\right)^2 - 1\right) + C_{off} + C_{p1}} Q \cdot V_p \quad \text{(Expression 14)}$$

Expression 14 shows the following with regard to voltage $V_{Coff}$ applied to off capacitor $C_{off}$.

(1) The higher electrostatic capacitance $C_0$ of capacitor $C_0$ in resonator reso is, the lower voltage $V_{Coff}$ applied to off capacitor $C_{off}$ in switch SW is.
(2) The higher capacitance Cp1 is, the lower voltage $V_{Coff}$ applied to off capacitor $C_{off}$ in switch SW is.
(3) The narrower the range in which a frequency of parallel-arm circuit Pz can be changed, the lower voltage $V_{Coff}$ applied to off capacitor $C_{off}$ in switch SW is.
(4) The greater the fractional band width (fa−fr)/fr of resonator reso is, the lower voltage $V_{Coff}$ applied to off capacitor $C_{off}$ in switch SW is.

In the present embodiment, the magnitude of voltage Vs across switch SW depends on the high-frequency power application direction and the resonant frequency of the parallel-arm resonator. However, as shown by the results of the analysis, the magnitude of voltage Vs across switch SW also depends on electrostatic capacitance of the parallel-arm resonator, equivalent capacitance $C_{p1}$ of switch SW, the range in which the frequency of the parallel-arm circuit can be changed, and the fractional band width of the parallel-arm resonator.

5. Example and Comparative Example

According to the present embodiment described above, power durability can be ensured for filter 10 having a frequency-tunable function, while achieving reduction in size and passband insertion loss. The following describes advantageous effects using examples (Examples 1 and 2), in comparison with a comparative example thereof (Comparative Example 1). Note that the filter according to Comparative Example 1 has the same configuration as that of the filter according to Examples 1 and 2, except that design parameters are different.

Figure 7:
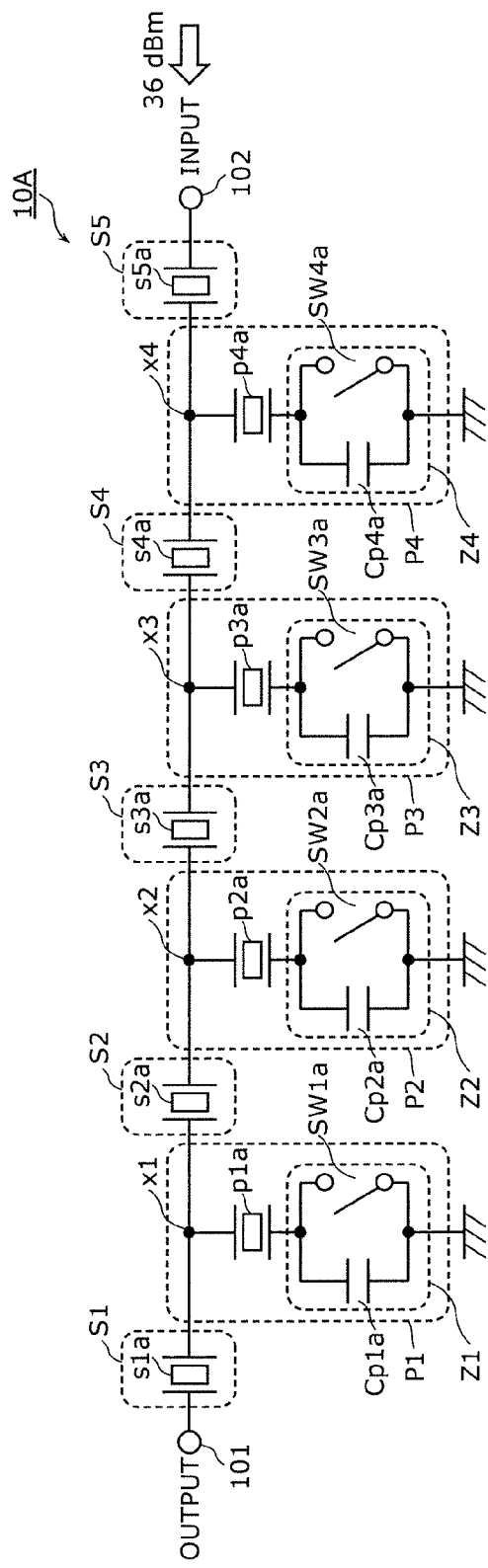
FIG. 7 illustrates a circuit configuration of a filter according to an example of Embodiment 1.

FIG. 7 illustrates a circuit configuration of filter 10A according to an example of Embodiment 1. In filter 10A illustrated in FIG. 7, the number of parallel-arm circuits is different from that of filter 10 according to Embodiment 1. In the following, description of common points of filter 10A according to an example of Embodiment 1 to those of filter 10 according to Embodiment 1 is omitted, and different points are mainly described.

As illustrated in FIG. 7, filter 10A includes series-arm circuits S1, S2, S3, S4, and S5, parallel-arm circuits P1, P2, P3, and P4, output terminal 101, and input terminal 102. Specifically, filter 10A has a ladder filter structure that includes two or more series-arm circuits (five series-arm circuits in this example) disposed on a path that connects output terminal 101 and input terminal 102, and three or more parallel-arm circuits (four parallel-arm circuits in the present embodiment).

Series-arm circuits S1 to S5 are disposed on the path that connects output terminal 101 and input terminal 102. Series-arm circuits S1, S2, S3, S4, and S5 include series-arm resonators s1a, s2a, s3a, s4a, and s5a, respectively.

Parallel-arm circuit P1 is connected to the ground and node x1 (second node) on a path between series-arm circuits S1 and S2, and corresponds to parallel-arm circuit 21 (second parallel-arm circuit) in Embodiment 1. Parallel-arm circuit P2 is connected to the ground and node x2 on a path between series-arm circuits S2 and S3. Parallel-arm circuit P3 is connected to the ground and node X3 on a path between series-arm circuits S3 and S4. Parallel-arm circuit P4 is connected to the ground and node x4 (first node) on a path between series-arm circuits S4 and S5, and corresponds to parallel-arm circuit 22 (first parallel-arm circuit) in Embodiment 1. Specifically, parallel-arm circuits P2 and P3 are each a third parallel-arm circuit connected to the ground and a node between node x4 and output terminal 101.

Parallel-arm circuit P1 includes parallel-arm resonator p1a (second parallel-arm resonator), and switch circuit Z1 (second switch circuit) connected in series to parallel-arm resonator p1a. Parallel-arm circuit P2 includes parallel-arm resonator p2a that is an example of a fifth parallel-arm resonator, and switch circuit Z2 that is an example of a fifth switch circuit connected in series to parallel-arm resonator p2a (fifth parallel-arm resonator). Parallel-arm circuit P3 includes parallel-arm resonator p3a that is another example of the fifth parallel-arm resonator, and switch circuit Z3 that is another example of the fifth switch circuit connected in series to parallel-arm resonator p3a (fifth parallel-arm resonator). Parallel-arm circuit P4 includes parallel-arm resonator p4a (first parallel-arm resonator), and switch circuit Z4 (first switch circuit) connected in series to parallel-arm resonator p4a.

Switch circuit Z1 includes capacitor Cp1a and switch SW1a, and corresponds to switch circuit 31 in Embodiment 1. Switch SW1a is connected in parallel to capacitor Cp1a corresponding to capacitor C1 (second impedance element) in Embodiment 1, and corresponds to switch SW1 (second switch element) in Embodiment 1. Switch circuit Z2 includes capacitor Cp2a and switch SW2a. Switch SW2a is connected in parallel to capacitor Cp2a, and includes one or more transistors (a plurality of transistors in this example) connected in series. Switch circuit Z3 includes capacitor Cp3a and switch SW3a. Switch SW3a is connected in parallel to capacitor Cp3a, and includes one or more transistors (a plurality of transistors in this example) connected in series. Switch circuit Z4 includes capacitor Cp4a and switch SW4a, and corresponds to switch circuit 32 in Embodiment 1. Switch SW4a is connected in parallel to capacitor Cp4a corresponding to capacitor C2 (first impedance element) in Embodiment 1, and corresponds to switch SW2 (first switch element) in Embodiment 1.

In filter 10A, switch circuits (Z1 to Z4) each include one of parallel circuits of capacitors (Cp1a to Cp4a) and one of switches (SW1a to SW4a), and thus switching SW1a to SW4a from on to off switches the resonant frequencies of parallel-arm circuits (P1 to P4) to higher frequencies (from Fron to Froff). The passband and the attenuation band of filter 10A are determined by the resonant frequencies and the antiresonant frequencies of series-arm circuits S1 to S4 and the resonant frequencies and the antiresonant frequencies of parallel-arm circuits P1 to P4, and thus by switching between on and off of switches SW1a to SW4a, the frequency of the attenuation pole on the passband low-frequency side of filter 10A can be changed, thus changing the frequency ranges of the passband and the attenuation band.

Here, in all of Examples 1 and 2 and Comparative Example 1, switches SW1a to SW4a are designed such that current withstand capability and voltage withstand capability that switches SW1a to SW4a are to have are ensured when high-frequency power of +36 dBm is applied through input terminal 102. The following specifically describes the design of switches SW1a to SW4a in Examples 1 and 2 and a comparative example.

The filters according to Examples 1 and 2 and Comparative Example 1 are radio-frequency filters each of which switches, by switching between the conducting and non-conducting states of switches SW1a to SW4a, between first filter characteristics that Band27-Rx (852 to 869 MHz) is a first passband and Band27-Tx (807 to 824 MHz) is a first attenuation band, and second filter characteristics that Band26-Rx (859 to 894 MHz) is a second passband and Band26-Tx (814 to 849 MHz) is a second attenuation band. Specifically, these filters are radio-frequency filters (tunable filters) each having a frequency-tunable function of being switched between a receiving filter for Band 27 and a receiving filter for Band 26, by switching between the conducting and non-conducting states of switches SW1a to SW4a.

5.1 Example 1

In Example 1, the gate widths of transistors included in switches SW1a to SW4a are individually determined according to currents flowing through switches SW1a to SW4a, and specifically, the following relation is satisfied. Thus, the gate widths of transistors in switches SW1a to SW4a are individually determined to ensure current withstand capability that switches SW1a to SW4a are to have. Note that the stack counts of transistors included in switches SW1a to SW4a are set to the same value, according to the highest voltage applied to switches SW1a to SW4a. Accordingly, switches SW1a to SW4a have the same stack count that is determined according to the switch that is to have the highest voltage withstand capability.

Gate width of switch SW1a<Gate width of switch SW4a
Gate width of each of switches SW2a and SW3a=Gate width of switch SW4a Table 1 shows, for instance, design parameters of a filter according to Example 1, current that flows through a switch (hereinafter, referred to as "switch current") and a voltage applied to a switch (hereinafter, referred to as "switch voltage"). Specifically, this table shows, as design parameters, gate widths $W_F$ and stack counts Ns of the switches in the parallel-arm circuits, and resonant frequencies Fri and antiresonant frequencies Fa1 of the parallel-arm circuits when the switches are on and off. Further, the table shows switch currents in the attenuation bands and the passbands as switch currents Is, and switch voltages in the attenuation bands and the passbands as switch voltages Vs. Furthermore, this table shows greatest values Is_max of switch currents in the attenuation bands and the passbands, greatest values Vs_max of switch voltages in the attenuation bands and the passbands, and on resistance Ron. This also applies to the tables in the following. Table 2 shows allowable input currents, allowable input voltages, sizes, and a total size of the switches of the filter according to Example 1. Table 3 shows passband insertion losses of the filter according to Example 1.

Figure 8:
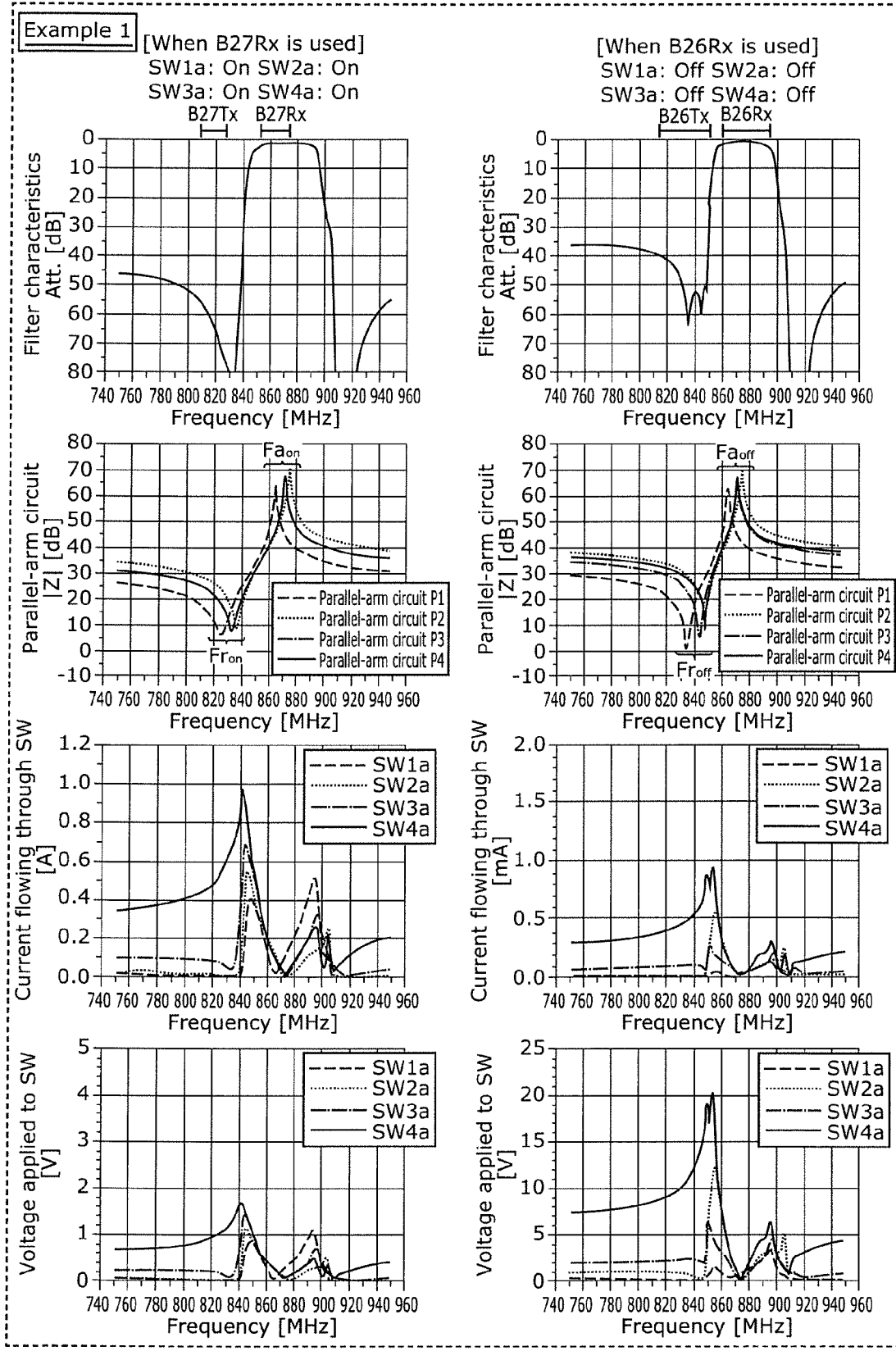
FIG. 8 shows graphs illustrating various characteristics of a filter according to Example 1.

FIG. 8 illustrates graphs showing various characteristics of the filter according to Example 1. Specifically, in FIG. 8, the first graphs from the top (hereinafter, each referred to as "first graph") show passing characteristics of the filter. The second graphs from the top (hereinafter, each referred to as "second graph") show impedance characteristics of parallel-arm circuits P1 to P4. The third graphs from the top (hereinafter, each referred to as "third graph") show switch current characteristics. The fourth graphs from the top (hereinafter, each referred to as "fourth graph") show switch voltage characteristics. The same apply to the graphs showing various characteristics of filters in the following.

Note that typically, high electric power is not applied to a signal having a frequency in the passband of a receiving filter. Yet, when the receiving filter is used in a multiplexer that includes a transmission filter such as a duplexer, high electric power is applied to a signal having a frequency in the attenuation band of the receiving filter, and thus it is important to ensure power durability also for the receiving filter. Here, a transmission filter and a TDD filter are each described as filter 10, and only a passband is to be considered in such cases. Yet such filters may be used as receiver filters, and thus evaluation is made for both the passband and the attenuation band.

TABLE 1

| Ex. 1 | $W_F$ (mm) | Ns (Ct) | sw | Fr1 (MHz) | Fa1 (MHz) | Is @B27Rx (mA) | Is @B26Tx (mA) | Vs @B27Rx (V) | Vs @B26Tx (V) |
|---|---|---|---|---|---|---|---|---|---|
| P-arm ckt P1 | 1.80 | 8 | On | 827.9 | 865.5 | 357 | 6 | 0.73 | 0.01 |
|  |  |  | Off | 835.2 | 865.5 | — | — | — | — |
| P-arm ckt P2 | 1.80 | 8 | On | 837.7 | 875.9 | 380 | 18 | 0.78 | 0.04 |
|  |  |  | Off | 848.9 | 875.9 | — | — | — | — |
| P-arm ckt P3 | 1.80 | 8 | On | 834.5 | 872.7 | 410 | 98 | 0.84 | 0.20 |
|  |  |  | Off | 844.4 | 872.7 | — | — | — | — |
| P-arm ckt P4 | 2.00 | 8 | On | 833.9 | 872.1 | 485 | 53 | 0.89 | 0.97 |
|  |  |  | Off | 848.4 | 872.1 | — | — | — | — |

TABLE 1-continued

| Ex. 1 | Is @B27Rx (mA) | Is @B26Tx (mA) | Vs @B27Rx (V) | Vs @B26Tx (V) | Is_max (mA) | Vs_max (V) | Ron (Ω) |
|---|---|---|---|---|---|---|---|
| P-arm ckt P1 | 0 | 0 | 2.94 | 0.12 | 357 | 2.94 | 2.09 |
| P-arm ckt P2 | 0 | 0 | 8.30 | 1.22 | 380 | 8.30 | 1.86 |
| P-arm ckt P3 | 0 | 0 | 3.46 | 2.28 | 410 | 3.46 | 1.86 |
| P-arm ckt P4 | 0 | 1 | 7.27 | 19.4 | 532 | 19.40 | 1.67 |

TABLE 2

| Ex. 1 | Allowable input current (mA) | Allowable input voltage (V) | Size (μm²) |
|---|---|---|---|
| P-arm ckt P1 (Switch SW1a) | 509 | 20.0 | 12800 |
| P-arm ckt P2 (Switch SW2a) | 572 | 20.0 | 14400 |
| P-arm ckt P3 (Switch SW3a) | 572 | 20.0 | 14400 |
| P-arm ckt P4 (Switch SW4a) | 636 | 20.0 | 16000 |
| Total | 2289 | 80.0 | 57600 |

TABLE 3

| Ex. 1 | SW1a to SW4a | IL @B27Rx (dB) | IL @B26Rx (dB) |
|---|---|---|---|
| Filter charcs. | On | 2.74 | — |
| | Off | — | 2.50 |

5.2 Example 2

In Example 2, the gate widths of switches SW1a to SW4a are individually determined according to currents that flow through switches SW1a to SW4a, similarly to Example 1. Furthermore, in Example 2, the stack counts of switches SW1a to SW4a are individually determined according to voltages applied to switches SW1a to SW4a, and specifically, the following relation is satisfied. Thus, the stack counts of switches SW1a to SW4a are individually determined such that voltage withstand capability that switches SW1a to SW4a are to have are ensured.

Gate width of switch SW1a<Gate width of switch SW4a Gate width of each of switches SW2a and SW3a<Gate width of switch SW4a Stack count of switch SW1a<Stack count of switch SW4a Stack count of each of switches SW2a and SW3a<Stack count of switch SW4a Table 4 shows design parameters of a filter according to Example 2. Table 5 shows allowable input currents, allowable input voltages, sizes, and a total size of the switches of the filter according to Example 2. Table 6 shows passband insertion losses of the filter according to Example 2.

Figure 9:
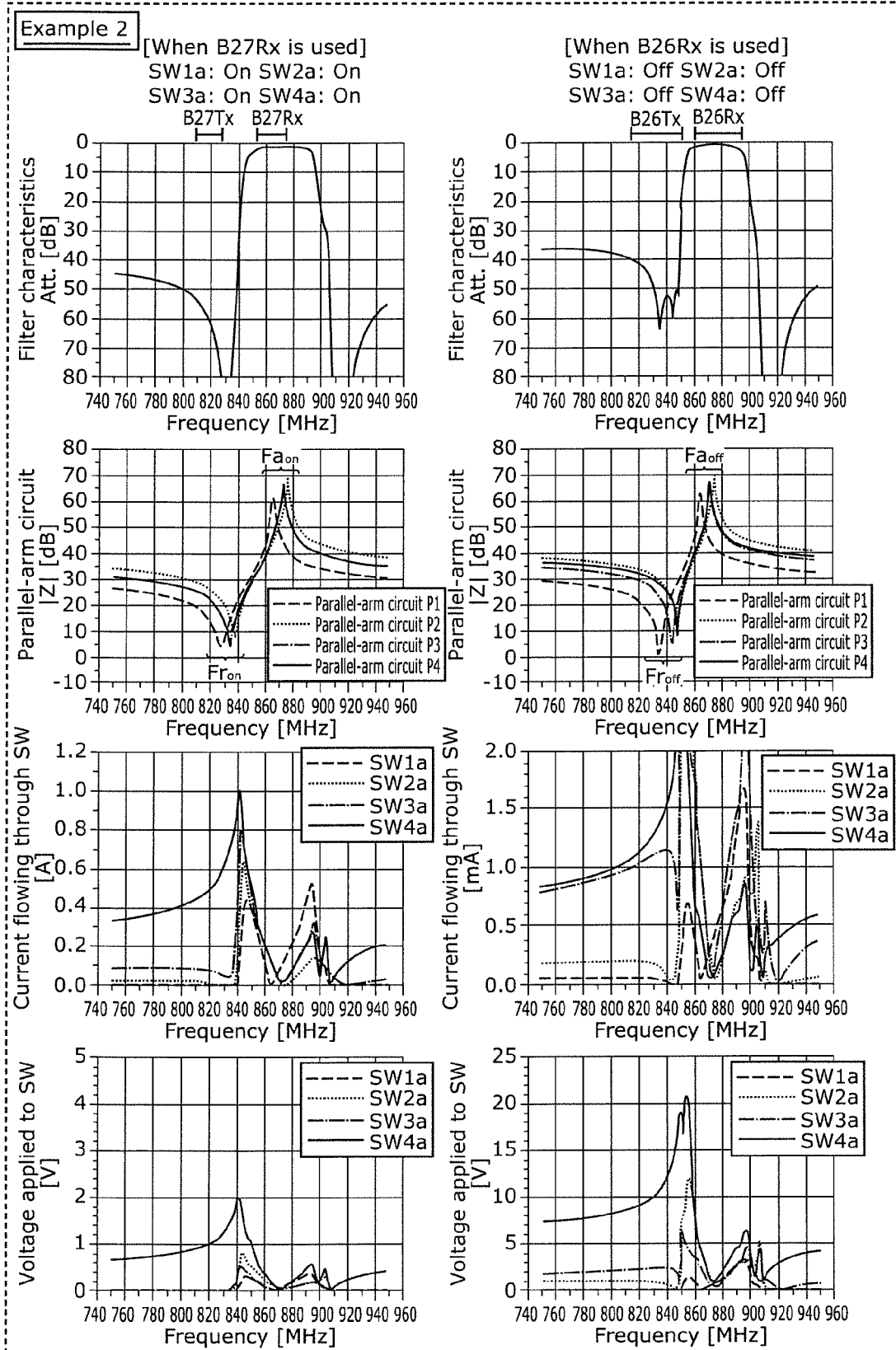
FIG. 9 shows graphs illustrating various characteristics of a filter according to Example 2.

FIG. 9 illustrates graphs showing various characteristics of the filter according to Example 2.

TABLE 4

| Ex. 2 | W_F (mm) | Ns (Ct) | sw | Fr1 (MHz) | Fa1 (MHz) | Is @B27Rx (mA) | Is @B26Tx (mA) | Vs @B27Rx (V) | Vs @B26Tx (V) |
|---|---|---|---|---|---|---|---|---|---|
| P-arm ckt P1 | 1.25 | 2 | On | 827.9 | 865.5 | 356 | 6 | 0.26 | 0.01 |
| | | | Off | 835.2 | 865.5 | — | — | — | — |
| P-arm ckt P2 | 1.40 | 4 | On | 837.8 | 875.9 | 385 | 18 | 0.51 | 0.02 |
| | | | Off | 848.8 | 875.9 | — | — | — | — |
| P-arm ckt P3 | 1.40 | 2 | On | 834.8 | 872.7 | 404 | 95 | 0.27 | 0.06 |
| | | | Off | 844.4 | 872.7 | — | — | — | — |
| P-arm ckt P4 | 1.85 | 8 | On | 833.9 | 872.1 | 484 | 534 | 0.99 | 1.08 |
| | | | Off | 848.4 | 872.1 | — | — | — | — |

| Ex. 2 | Is @B27Rx (mA) | Is @B26Tx (mA) | Vs @B27Rx (V) | Vs @B26Tx (V) | Is_max (mA) | Vs_max (V) | Ron (Ω) |
|---|---|---|---|---|---|---|---|
| P-arm ckt P1 | 2 | 0 | 2.93 | 0.12 | 356 | 2.93 | 0.67 |

TABLE 4-continued

| | | | | | | | |
|---|---|---|---|---|---|---|---|
| P-arm ckt P2 | — | — | — | — | 385 | 8.24 | 1.20 |
| | 2 | 0 | 8.24 | 1.27 | | | |
| P-arm ckt P3 | — | — | — | — | 404 | 3.43 | 0.60 |
| | 2 | 1 | 3.43 | 2.27 | | | |
| P-arm ckt P4 | — | — | — | — | 534 | 19.39 | 1.81 |
| | 1 | 3 | 7.25 | 19.39 | | | |

TABLE 5

| Ex. 2 | Allowable input current (mA) | Allowable input voltage (V) | Size (μm²) |
|---|---|---|---|
| P-arm ckt P1 (Switch SW1a) | 397 | 5.0 | 2500 |
| P-arm ckt P2 (Switch SW2a) | 445 | 10.0 | 5600 |
| P-arm ckt P3 (Switch SW3a) | 445 | 5.0 | 2800 |
| P-arm ckt P4 (Switch SW4a) | 588 | 20.0 | 14800 |
| Total | 1875 | 40.0 | 25700 |

TABLE 6

| Ex. 2 | SW1a to SW4a | IL @B27Rx (dB) | IL @B26Rx (dB) |
|---|---|---|---|
| Filter charcs. | On | 2.40 | — |
| | Off | — | 2.50 |

5.3 Comparative Example 1

In Comparative Example 1, switches SW1a to SW4a have the same gate width determined according to the greatest current of the currents that flow through switches SW1a to SW4a. Switches SW1a to SW4a have the same stack count determined according to the highest voltage of the voltages applied to switches SW1a to SW4a. Thus, switches SW1a to SW4a have the same gate width determined according to a switch that is to have the highest current withstand capability, and have the same stack count determined according to a switch that is to have the highest voltage withstand capability.

Table 7 shows design parameters of a filter according to Comparative Example 1. Table 8 shows allowable input currents, allowable input voltages, sizes, and a total size of the switches of the filter according to Comparative Example 1. Table 9 shows passband insertion losses of the filter according to Comparative Example 1.

Figure 10:
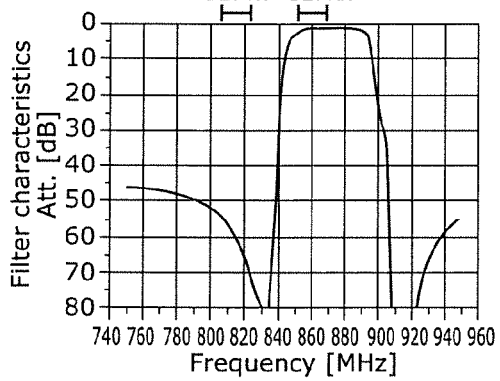
FIG. 10 shows graphs illustrating various characteristics of a filter according to Comparative Example 1.
Figure 10:
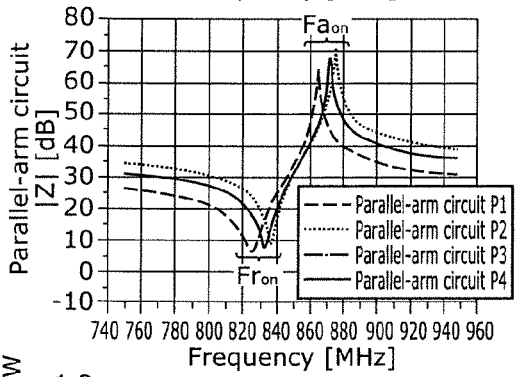
Figure 10:
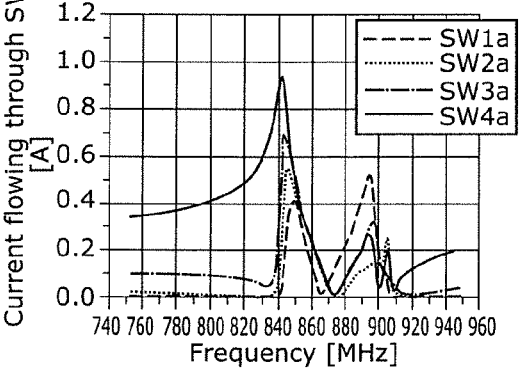
Figure 10:
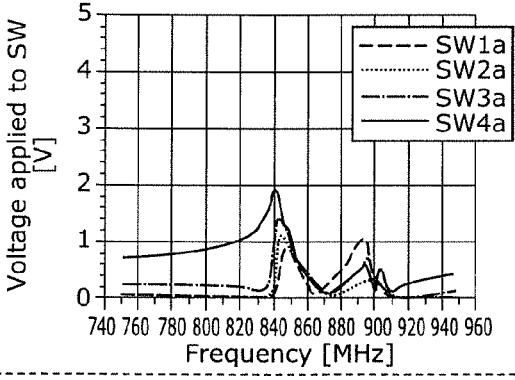
Figure 10:
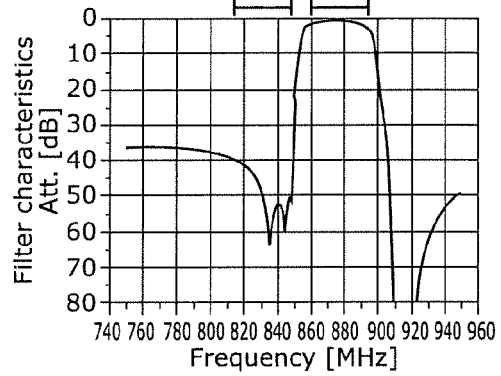
Figure 10:
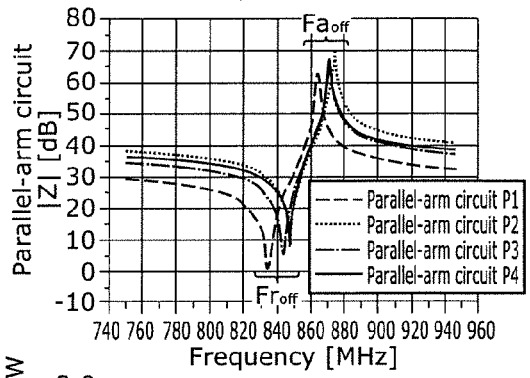
Figure 10:
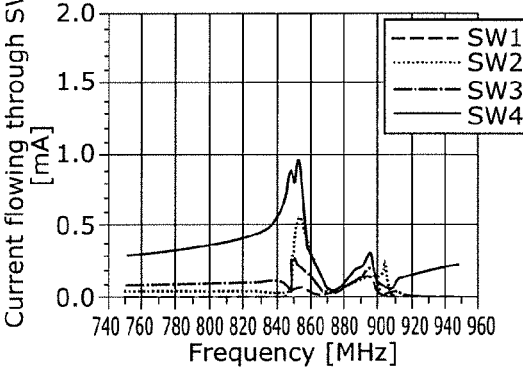
Figure 10:
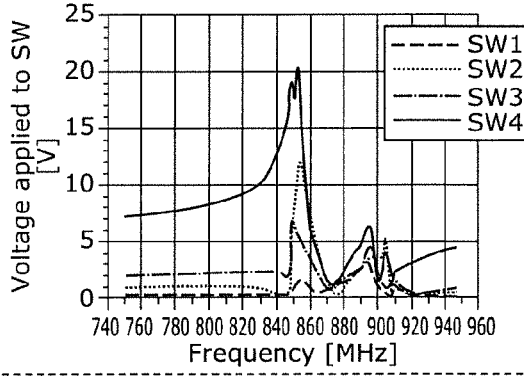

FIG. 10 illustrates graphs showing various characteristics of the filter according to Comparative Example 1.

TABLE 7

| Comp. Ex. 1 | $W_F$ (mm) | Ns (Ct) | SW | Fr1 (MHz) | Fa1 (MHz) | Is @B27Rx (mA) | Is @B26Tx (mA) | Vs @B27Rx (V) | Vs @B26Tx (V) |
|---|---|---|---|---|---|---|---|---|---|
| P-arm ckt P1 | 1.80 | 8 | On | 827.9 | 865.5 | 356 | 6 | 0.73 | 0.01 |
| | | | Off | 835.2 | 865.5 | — | — | — | — |
| P-arm ckt P2 | 1.80 | 8 | On | 837.7 | 875.9 | 379 | 18 | 0.77 | 0.04 |
| | | | Off | 848.9 | 875.9 | — | — | — | — |
| P-arm ckt P3 | 1.80 | 8 | On | 834.5 | 872.7 | 409 | 98 | 0.84 | 0.20 |
| | | | Off | 844.4 | 872.7 | — | — | — | — |
| P-arm ckt P4 | 1.80 | 8 | On | 833.9 | 872.1 | 484 | 533 | 0.99 | 1.08 |
| | | | Off | 848.4 | 872.1 | — | — | — | — |

| Comp. Ex. 1 | Is @B27Rx (mA) | Is @B26Tx (mA) | Vs @B27Rx (V) | Vs @B26Tx (V) | Is_max (mA) | Vs_max (V) | Ron (Ω) |
|---|---|---|---|---|---|---|---|
| P-arm ckt P1 | — | — | — | — | 356 | 2.94 | 1.86 |
| | 0 | 0 | 2.94 | 0.12 | | | |
| P-arm ckt P2 | — | — | — | — | 379 | 8.30 | 1.86 |
| | 0 | 0 | 8.30 | 1.22 | | | |
| P-arm ckt P3 | — | — | — | — | 409 | 3.46 | 1.86 |
| | 0 | 0 | 3.46 | 2.28 | | | |
| P-arm ckt P4 | — | — | — | — | 533 | 19.40 | 1.86 |
| | 0 | 0 | 7.27 | 19.40 | | | |

Table 8

| Comp. Ex. 1 | Allowable input current (mA) | Allowable input voltage (V) | Size (µm²) |
|---|---|---|---|
| P-arm ckt P1 (Switch SW1a) | 572 | 20.0 | 11400 |
| P-arm ckt P2 (Switch SW2a) | 572 | 20.0 | 11400 |
| P-arm ckt P3 (Switch SW3a) | 572 | 20.0 | 14400 |
| P-arm ckt P4 (Switch SW4a) | 572 | 20.0 | 14400 |
| Total | 2288 | 80.0 | 57600 |

TABLE 9

| Comp. Ex. 1 | SW1a to SW4a | IL @B27Rx(dB) | IL @B26Rx(dB) |
|---|---|---|---|
| Filter charcs. | On | 2.76 | — |
| | Off | — | 2.50 |

5.4 Comparison of Examples 1 and 2 and Comparative Example 1

In the filters according to Example 1, Example 2, and Comparative Example 1, parallel-arm circuits P1 to P4 have substantially the same resonance characteristics (resonant frequencies and antiresonant frequencies), as illustrated in FIGS. 8 to 10 and Tables 1, 4, and 7. These filters can switch characteristics between the first filter characteristics for Band 27 and the second filter characteristics for Band 26, as illustrated in the first graphs in FIGS. 8 to 10.

Specifically, as illustrated in the left second graphs in FIGS. 8 to 10, in parallel-arm circuits P1 to P4, impedance of switches SW1a to SW4a is very low (ideally zero), capacitors Cp1a to Cp4a are short-circuited, and thus characteristics of parallel-arm resonators p1a to p4a are dominant when switches SW1a to SW4a are on. Accordingly, in this case, characteristics of parallel-arm circuits P1 to P4 illustrated in the left second graphs in FIGS. 8 to 10 are substantially the same as the characteristics of only parallel-arm resonators p1a to p4a, respectively. Specifically, resonant frequencies ("Fron" in the drawings) of parallel-arm circuits P1 to P4 in this case are substantially the same as the resonant frequencies of parallel-arm resonators p1a to p4a, respectively.

On the other hand, when switches SW1a to SW4a are off, the impedance of switches SW1a to SW4a is very high (ideally infinite), and parallel-arm circuits P1 to P4 are circuits each constituted by one of the parallel-arm resonators (p1a to p14) ad one of the capacitors (Cp1a to Cp4a) connected in series. Accordingly, in this case, as illustrated in the right second graphs in FIGS. 8 to 10, the resonant frequencies ("Froff" in the drawings) of the parallel-arm circuits (P1 to P4) are switched to higher frequencies than the resonant frequencies of the parallel-arm circuits (P1 to P4), respectively, when switches SW1a to SW4a are on.

Accordingly, switching between on and off of switches SW1a to SW4a can change the frequency of the attenuation pole on the passband low-frequency side, and switch between the first filter characteristics and the second filter characteristics.

Here, a comparison between Example 1 and Comparative Example 1 shows that in Example 1, the gate width of switch SW4a is made greater than the gate width of switch SW1a. Thus, according to Example 1, as compared with Comparative Example 1, passband insertion loss when switch SW4a is on (namely, when Band27-Rx is used) can be reduced (2.74 dB: see Table 3, 2.76 dB: see Table 9), while total sizes of switches SW1a to SW4a are the same (57600 µm²: see Tables 2 and 8).

Further, a comparison between Example 2 and Comparative Example 1 shows that in Example 2, the gate width of switch SW4a is made greater than the gate width of switch SW1a, and the stack count of switch SW1a is made lower than the stack count of switch SW4a. Further, the gate widths of switches SW2a and SW3a are each made narrower than the gate width of switch SW4a, and the stack counts of switches SW2a and SW3a are also each made lower than the stack count of switch SW4a. Thus, according to Example 2, as compared with Comparative Example 1, passband insertion loss when switch SW4a is on (namely, when Band27-Rx is used) can be reduced (2.40 dB: see table 6, 2.76 dB: see Table 9), while making the total size of switches SW1a to SW4a smaller (25700 µm²: see Table 5, 57600 µm²: see Table 8).

Specifically, in Comparative Example 1, all of switches SW1a to SW4a are designed according to switch SW4a through which the greatest current flows and to which the highest voltage is applied. Thus, switches SW1a to SW4a are all designed to have great gate widths and high stack counts. Accordingly, the on resistance per transistor included in each of switches SW1a to SW4a is low, yet the stack counts are high, and thus on resistance Ron of the entire switch is 1.86Ω, which is high. Furthermore, in Comparative Example 1, all switches SW1a to SW4a have great gate widths and high stack counts, and thus a total size of switches SW1a to SW4a is also great.

On the other hand, in Example 2, out of switches SW1a to SW4a, switch SW4a through which the greatest current flows and to which the highest voltage is applied is designed to have a great gate width and a high stack count, and thus on resistance Ron is 1.81Ω, which is comparatively high. However, lower current flows through and lower voltage is applied to switches SW1a to SW3a than those of switch SW4a. Thus, the gate widths and the stack counts of switches SW1a to SW3a can be made narrower and lower than those of switch SW4a. Accordingly, the on resistance per transistor included in switches SW1a to SW3a is higher than that of switch SW4a, yet the stack counts of switches SW1a to SW3a can be made lower than that of switch SW4a.

Accordingly, in Example 2, on resistance Ron of each of switches SW1a to SW3a as the entire switch is 0.60 to 1.20Ω, which is lower than the on resistance in Comparative Example 1. Furthermore, the gate widths and the stack counts of switches SW1a to SW3a can be decreased, and thus a total size of switches SW1a to SW4a can be decreased.

In Example 2, as compared with Example 1, on resistance Ron of each of switches SW1a to SW3a having relatively narrow gate widths can be decreased by making the stack counts of switches SW1a to SW3a each lower than the stack count of switch SW4a. Accordingly, passband insertion loss when switches SW1a to SW4a are on (namely, when Band27-Rx is used) can be further reduced (2.74 dB: see Table 3, 2.40 dB: see Table 6).

5.5 Example of Configuration

Figure 11:
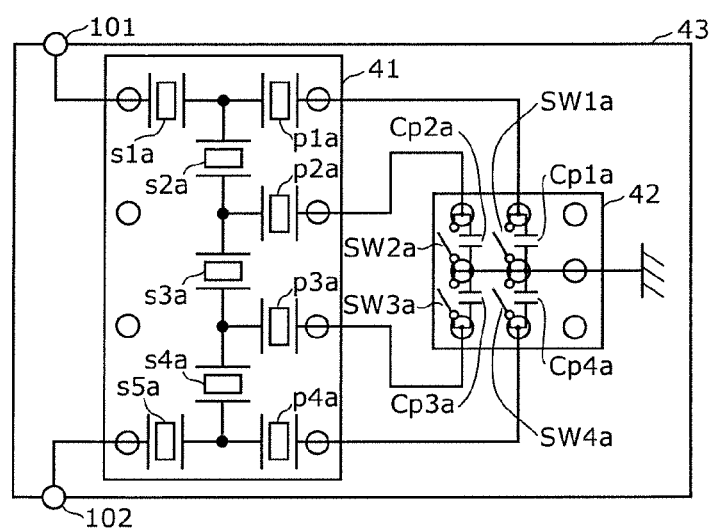
FIG. 11 is a plan view illustrating a structure of the filters according to the example in FIG. 7 and the comparative example.

FIG. 11 is a plan view illustrating a structure of the filters according to the example illustrated in FIG. 7 and the comparative example. Series-arm resonators s1a to s5a and parallel-arm resonators p1a to p4a are surface acoustic wave resonators formed on piezoelectric substrate 41 and each including an inter digital transducer (IDT) electrode, or bulk elastic wave resonators formed on substrate 41, and are formed in a single package. Switches SW1a to SW4a and capacitors Cp1a to Cp4a are formed in package 42 different from the package in which series-arm resonators s1a to s5a and parallel-arm resonators p1a to p4a are formed. These two packages are mounted on wiring board 43, and are connected by lines formed on wiring board 43.

In this configuration, capacitors Cp1a to Cp4a are formed in package 42 in which the switches are formed, yet when capacitors Cp1a to Cp4a are formed using pectinate capacitance electrodes or a metal injection molded (MIM) capacitance electrodes, capacitors Cp1a to Cp4a may be formed on substrate 41 on which the resonators are formed. Note that from the viewpoint of size reduction, capacitors Cp1a to Cp4a are preferably formed in package 42 in which the switches are formed. That is because if capacitors Cp1a to Cp4a are formed in the package that includes the resonators, the package needs to have more terminals, which results in an increase in the size of the package.

In the example of this configuration, the switch circuit that includes the capacitors and the switches is disposed on the ground side, out of the node side on the path that connects output terminal 101 and input terminal 102 and the ground side. In contrast, if the switch circuit is disposed on the node side, both the package that includes the resonators and the package that includes the switches need to have more terminals, which results in an increase in the size of the filter. From this viewpoint, filter 10A can be miniaturized by disposing the switch circuit closer to the ground than the parallel-arm resonators are, out of the node side and the ground side.

6. Summary

As stated above, filter 10 according to Embodiment 1 described using Examples 1 and 2 yields following advantageous effects (1) to (4).

(1) By making the gate width of switch SW2 (corresponding to switch SW4a in Examples 1 and 2) in parallel-arm circuit 22 greater than the gate width of switch SW1 (corresponding to switch SW1a in Examples 1 and 2) in parallel-arm circuit 21, power durability that filter 10 is to have is ensured, and also reduction in size of filter 10 and passband insertion loss when the switches are conducting can be achieved.

(2) The frequency of the attenuation pole on the passband low-frequency side can be switched (changed) to another frequency by switching between the conducting and non-conducting states of the switches.

(3) In a configuration in which voltage across switch SW2 is lower than voltage across switch SW1, by making the stack count of switch SW1 lower than the stack count of switch SW2, power durability that filter 10 is to have is ensured, and further reduction in size of filter 10 and passband insertion loss when the switches are conducting can be achieved.

(4) Filter 10A can be miniaturized by disposing the switch circuit closer to the ground than the parallel-arm resonators are, out of the node side and the ground side.

Specifically, according to Embodiment 1, in order to achieve power durability that filter 10 is to have, current withstand capabilities of switches SW1 and SW2 are to be ensured for filter 10. In this regard, when high-frequency power is applied through input terminal 102, greater current flows though switch SW2 of parallel-arm circuit 22 connected closer to input terminal 102 when switch SW2 is conducting. In view of this, the gate width of each of one or more transistors included in switch SW2 is greater than the gate width of each of one or more transistors included in switch SW1, and thus current withstand capability that achieves power durability that filter 10 is to have can be ensured while making a total size of switches SW1 and SW2 small. In addition, switch SW1 has a relatively great gate width, and thus resistance of switch SW1 (on resistance) in the conducting state can be decreased. Accordingly, passband insertion loss of filter 10 can be reduced when switch SW1 is conducting. Specifically, power durability of the radio-frequency filter having a frequency-tunable function can be ensured while achieving reduction in size and passband insertion loss of the filter.

Resistance of switch SW1 in the conducting state which has a relatively narrow gate width can be decreased by making the stack count of switch SW1 lower than the stack count of switch SW2. Further, switch SW1 can be miniaturized by decreasing the stack count. Thus, passband insertion loss of filter 10 when switch SW1 is conducting can be reduced, and at the same time, the size of filter 10 can be reduced.

According to Examples 1 and 2, also in a configuration that includes three or more parallel-arm circuits (here, four parallel-arm circuits P1 to P4), current withstand capability that achieves power durability that filter 10A is to have can be ensured while making a total size of switch SW4a (first switch element), switch SW1a (second switch element), and switches SW2a and SW3a (fifth switch elements) small. The frequency of an attenuation pole and the number of attenuation poles can be finely adjusted by switching between on and off of switches SW1a to SW4a as appropriate. Accordingly, filter 10A that can finely adjust the frequency of an attenuation pole and the number of attenuation poles can be miniaturized and power durability therefor can be ensured.

Note that the configuration of a parallel-arm circuit is not limited to the configuration described in the present embodiment. In view of this, the following describes, as a variation of Embodiment 1, a filter that includes a parallel-arm circuit having a configuration different from the configuration of a parallel-arm circuit in Embodiment 1.

7. Variation 1 of Embodiment 1 (Example 3)

In Embodiment 1 above, the first switch circuit is a circuit in which the first switch element and the first impedance element that is one of an inductor and a capacitor are connected in parallel. Further, the second switch circuit is a circuit in which the second switch element and the second impedance element that is one of an inductor and a capacitor are connected in parallel. In contrast, in this variation, the first switch circuit further includes a third impedance element that is connected in series to the first switch element, and is the other of the inductor and the capacitor. Further, a circuit constituted by the third impedance element and the first switch element connected in series is connected in parallel to the first impedance element. The second switch circuit further includes a fourth impedance element that is connected in series to the second switch element, and is the other of the inductor and the capacitor. The circuit constituted by the fourth impedance element and the second switch element connected in series is connected in parallel to the second impedance element.

The following describes the filter according to Variation 1 of Embodiment 1 using an example (Example 3).

Figure 12:
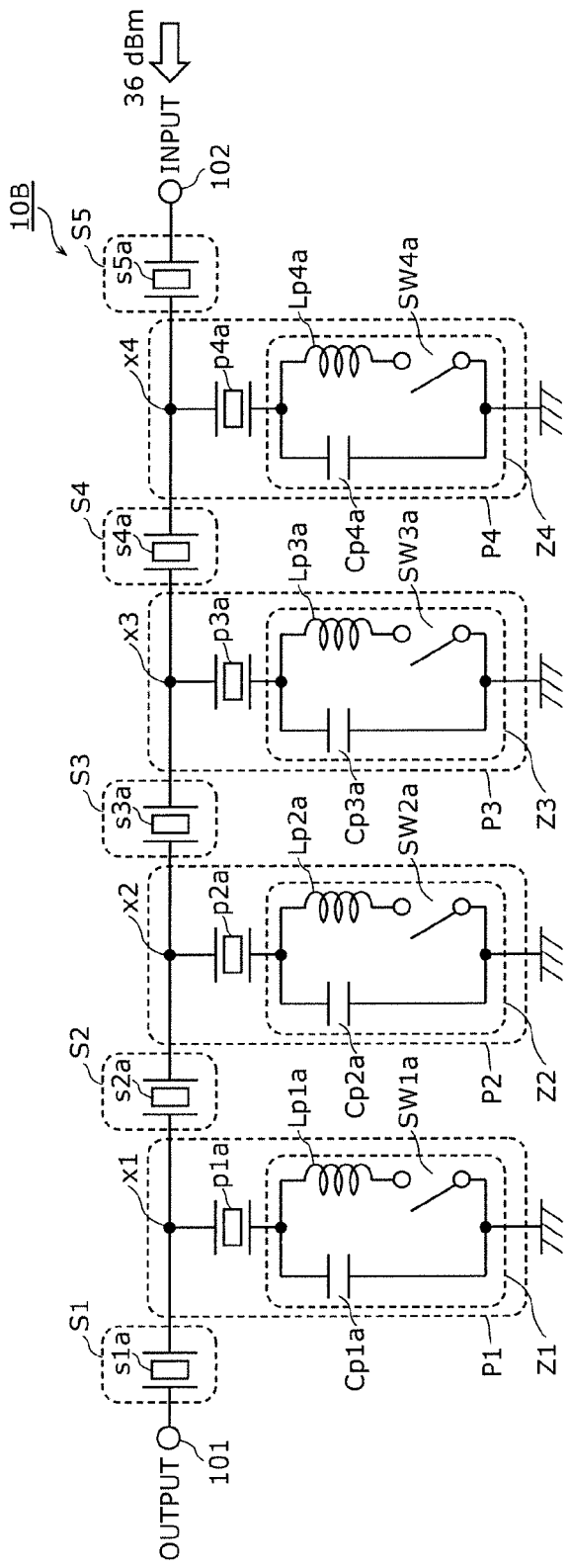
FIG. 12 illustrates a circuit configuration of a filter according to Example 3.

FIG. 12 illustrates a circuit configuration of filter 10B according to Example 3. Filter 10B illustrated in FIG. 12 is different from filter 10A according to Examples 1 and 2 in the configuration of the switch circuit. In the following, description of the common points of filter 10B according to Example 3 to those of filter 10A according to Examples 1 and 2 is omitted, and different points are mainly described.

As illustrated in FIG. 12, filter 10B includes series-arm circuits S1, S2, S3, S4, and S5, parallel-arm circuits P1, P2, P3, and P4, output terminal 101, and input terminal 102.

Parallel-arm circuit P1 includes parallel-arm resonator p1a (second parallel-arm resonator), and switch circuit Z1 (second switch circuit) connected in series to parallel-arm resonator p1a. Parallel-arm circuit P2 includes parallel-arm resonator p2a, and switch circuit Z2 connected in series to parallel-arm resonator p2a. Parallel-arm circuit P3 includes parallel-arm resonator p3a, and switch circuit Z3 connected in series to parallel-arm resonator p3a. Parallel-arm circuit P4 includes parallel-arm resonator p4a (first parallel-arm resonator), and switch circuit Z4 (first switch circuit) connected in series to parallel-arm resonator p4a.

Switch circuit Z1 is a second switch circuit that includes capacitor Cp1a (second impedance element), switch SW1a (second switch element), and inductor Lp1a (fourth impedance element). Inductor Lp1a is connected in series to switch SW1a, and a circuit constituted by inductor Lp1a and switch SW1a connected in series is connected in parallel to capacitor Cp1a. Switch circuit Z2 includes capacitor Cp2a, switch SW2a, and inductor Lp2a. Inductor Lp2a is connected in series to switch SW2a, and a circuit constituted by inductor Lp2a and switch SW2a connected in series is connected in parallel to capacitor Cp2a. Switch circuit Z3 includes capacitor Cp3a, switch SW3a, and inductor Lp3a. Inductor Lp3a is connected in series to switch SW3a, and a circuit constituted by inductor Lp3a and switch SW3a connected in series is connected in parallel to capacitor Cp3a. Switch circuit Z4 is a first switch circuit that includes capacitor Cp4a (first impedance element), switch SW4a (first switch element), and inductor Lp4a (third impedance element). Inductor Lp4a is connected in series to switch SW4a, and a circuit constituted by inductor Lp4a and switch SW4a connected in series is connected in parallel to capacitor Cp4a.

In filter 10B according to this example, switch circuits (Z1 to Z4) each include a parallel circuit in which one of capacitors (Cp1a to Cp4a) is connected in parallel to a series circuit of one of switches (SW1a to SW4a) and one of inductors (Lp1a to Lp4a), and thus the resonant frequencies of parallel-arm circuits (P1 to P4) are switched to higher frequencies (from Fron to Froff) by switching switches SW1a to SW4a from on to off. When switches SW1a to SW4a are on, inductors (Lp1a to Lp4a) connected in series to the switches can locate resonant frequencies Fron of the parallel-arm circuits that are the resonant frequencies when switches SW1a to SW4a are on, at lower frequencies than resonant frequencies of the parallel-arm resonators (p1a to p4a). Accordingly, by switching between on and off of switches SW1a to SW4a, the range in which the frequency of the attenuation pole on the passband low-frequency side can be changed can be made greater than the range of filter 10A according to the example of Embodiment 1. Note that when switches SW1a to SW4a are off, filter 10B has the same characteristics as those of filter 10A according to the example of Embodiment 1.

Specifically, filter 10B according to Example 3 is a radio-frequency filter (tunable filter) having a frequency-tunable function of being switched between a receiving filter for Band 27 and a receiving filter for Band 26, by switching between the conducting and non-conducting states of switches SW1a to SW4a, similarly to the filters according to Examples 1 and 2 and Comparative Example 1.

In Example 3, similarly to Example 2, switches SW1a to SW4a are designed such that current withstand capability and voltage withstand capability that switches SW1a to SW4a are to have can be ensured when high-frequency power of +36 dBm is applied through input terminal 102. Specifically, the gate widths of switches SW1a to SW4a are individually determined according to the currents flowing through switches SW1a to SW4a, and the stack counts of switches SW1a to SW4a are individually determined according to the voltages applied to switches SW1a to SW4a. Thus, the gate widths of transistors in switches SW1a to SW4a are individually determined to ensure current withstand capability that switches SW1a to SW4a are to have, and the stack counts of switches SW1a to SW4a are individually determined to ensure voltage withstand capability that switches SW1a to SW4a are to have.

Table 10 shows design parameters of filter 10B according to Example 3. Table 11 shows allowable input currents, allowable input voltages, sizes, and a total size of the switches of filter 10B according to Example 3. Table 12 shows passband insertion losses of filter 10B according to Example 3.

Figure 13:
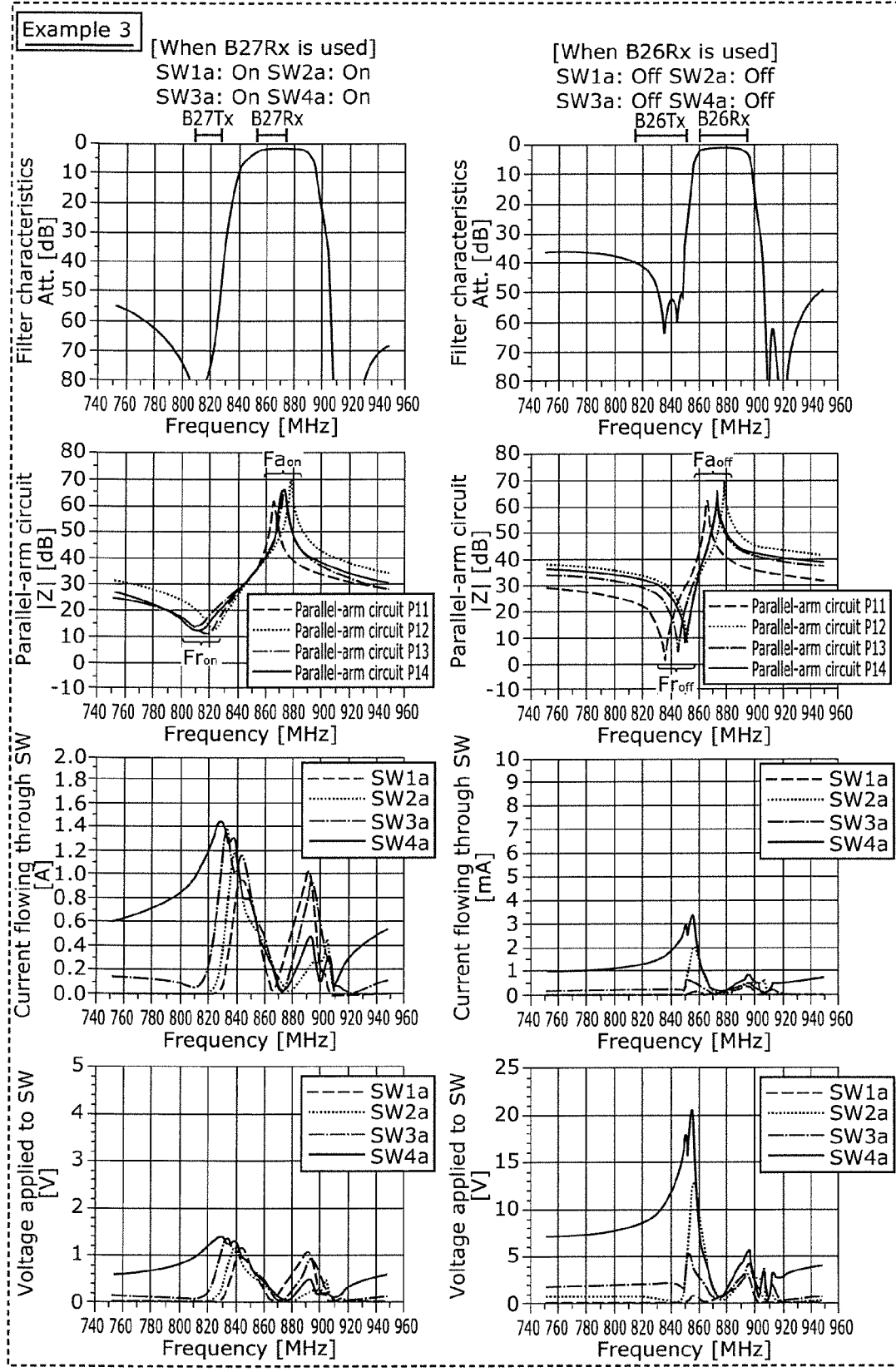
FIG. 13 shows graphs illustrating various characteristics of the filter according to Example 3.

FIG. 13 illustrates graphs showing various characteristics of the filter according to Example 3.

TABLE 10

| Ex. 3 | $W_F$ (mm) | Ns (Ct) | sw | Fr1 (MHz) | Fa1 (MHz) | Is @B27Rx (mA) | Is @B26Tx (mA) | Vs @B27Rx (V) | Vs @B26Tx (V) |
|---|---|---|---|---|---|---|---|---|---|
| P-arm ckt P1 | 2.45 | 2 | On | 816.9 | 866.0 | 710 | 6 | 0.71 | 0.01 |
|  |  |  | Off | 835.8 | 866.0 | — | — | — | — |
| P-arm ckt P2 | 2.00 | 5 | On | 822.7 | 878.1 | 574 | 78 | 0.58 | 0.08 |
|  |  |  | Off | 851.1 | 878.1 | — | — | — | — |
| P-arm ckt P3 | 2.60 | 2 | On | 809.4 | 873.2 | 752 | 466 | 0.75 | 0.46 |
|  |  |  | Off | 845.0 | 873.2 | — | — | — | — |
| P-arm ckt P4 | 4.70 | 7 | On | 811.1 | 873.8 | 719 | 1356 | 0.72 | 1.33 |
|  |  |  | Off | 850.0 | 873.9 | — | — | — | — |

TABLE 10-continued

| Ex. 3 | Is @B27Rx (mA) | Is @B26Tx (mA) | Vs @B27Rx (V) | Vs @B26Tx (V) | Is_max (mA) | Vs_max (V) | Ron (Ω) |
|---|---|---|---|---|---|---|---|
| P-arm ckt P1 | 1 | 0 | 2.86 | 0.11 | 710 | 2.86 | 0.34 |
| P-arm ckt P2 | 2 | 0 | 11.31 | 0.75 | 574 | 11.31 | 1.05 |
| P-arm ckt P3 | 1 | 0 | 3.29 | 2.31 | 752 | 3.29 | 0.32 |
| P-arm ckt P4 | 2 | 3 | 11.41 | 15.95 | 1356 | 15.95 | 0.62 |

TABLE 11

| Ex. 3 | Allowable input current (mA) | Allowable input voltage (V) | Size (μm²) |
|---|---|---|---|
| P-arm ckt P1 (Switch SW1a) | 779 | 5.0 | 4900 |
| P-arm ckt P2 (Switch SW2a) | 636 | 12.5 | 10000 |
| P-arm ckt P3 (Switch SW3a) | 827 | 5.0 | 5200 |
| P-arm ckt P4 (Switch SW4a) | 1494 | 17.5 | 32900 |
| Total | 3736 | 40.0 | 53000 |

TABLE 12

| Ex. 3 | SW1a to SW4a | IL @B27Rx(dB) | IL @B26Rx(dB) |
|---|---|---|---|
| Filter charcs. | On | 2.33 | — |
|  | Off | — | 2.39 |

Here, current Is4a that flows through switch SW4a is greater than current Is1a that flows through switch SW1a, and gate width Ws4a of transistors included in switch SW4a is greater than gate width Ws1a of transistors included in switch SW1a. Accordingly, power durability that filter 10B is to have is secured, and also reduction in size of filter 10B and passband insertion loss when the switches are conducting can be achieved.

Voltage Vs1a across switch SW1a is lower than voltage Vs4a across switch SW4a, and stack count Ns1a that is the number of transistors connected in series and included in switch SW1a is lower than stack count Ns4a that is the number of transistors connected in series and included in switch SW4a. This ensures power durability that filter 10B is to have and also achieves reduction in size of filter 10B and passband insertion loss when the switches are conducting.

As illustrated in the first graphs in FIG. 13, when switches SW1a to SW4a are on, filter 10B according to Example 3 has first filter characteristics that Band27-Rx is a first passband, and Band27-Tx is a first attenuation band. Further, when switches SW1a to SW4a are off, filter 10B has second filter characteristics that Band26-Rx is a second passband, and Band26-Tx is a second attenuation band.

Specifically, as illustrated in the left second graph in FIG. 13, when switches SW1a to SW4a are on in parallel-arm circuits P1 to P4, switch circuits (Z1 to Z4) are each constituted by one of the capacitors (Cp1a to Cp4a) and one of the inductors (Lp1a to Lp4a) connected in parallel, and each of the parallel-arm circuits is a circuit in which one of parallel-arm resonators (p1a to p4a) is connected in series to a circuit constituted by one of the capacitors (Cp1a to Cp4a) and one of the inductors (Lp1a to Lp4a) connected in parallel. Furthermore, frequencies at which the circuits in each of which one of the capacitors (Cp1a to Cp4a) and one of the inductors (Lp1a to Lp4a) are connected in parallel have the local maximum impedance are set to frequencies higher than the resonant frequencies of the parallel-arm resonators (p1a to p4a), and thus the switch circuits (Z1 to Z4) have inductive impedance at the resonant frequencies of the parallel-arm resonators (p1a to p4a). Accordingly, resonant frequencies Fron of the parallel-arm circuits are each located at a frequency lower than the resonant frequencies of the parallel-arm resonators (p1a to p4a).

On the other hand, when switches SW1a to SW4a are off, the impedance of the switches is very high (ideally infinite), and the inductors (Lp1a to Lp4a) do not function. Accordingly, parallel-arm circuits P1 to P4 are each constituted by one of the parallel-arm resonators (p1a to p4a) and one of the capacitors (Cp1a to Cp4a) connected in series. Thus, as illustrated in the right second graph in FIG. 13, resonant frequencies Froff of the parallel-arm circuits are switched to be higher frequencies than the resonant frequencies of the parallel-arm resonators (p1a to p4a).

Accordingly, switching between on and off of switches SW1a to SW4a can change the frequency of the attenuation pole on the passband low-frequency side, and switch between the first filter characteristics and the second filter characteristics.

Figure 14A:
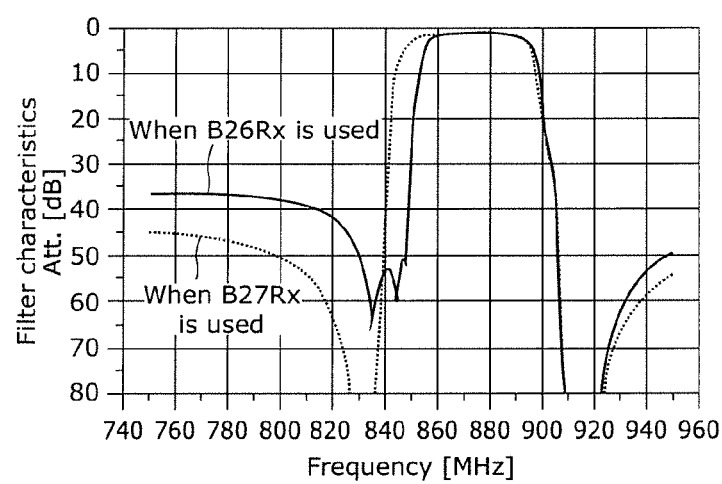
FIG. 14A is a graph showing passing characteristics of the filter according to Example 2.
Figure 14B:
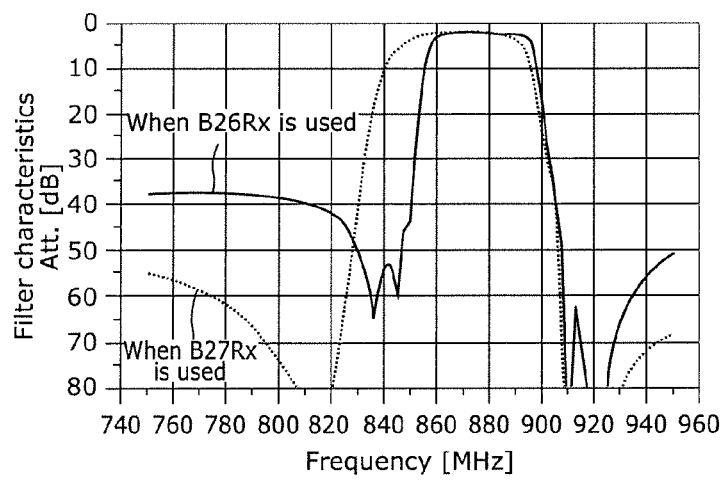
FIG. 14B is a graph showing passing characteristics of the filter according to Example 3.

FIG. 14A is a graph showing passing characteristics of filter 10A according to Example 2. FIG. 14B is a graph showing passing characteristics of filter 10B according to Example 3. FIGS. 14A and 14B show changes in passing characteristics of filters 10A and 10B, respectively, which are caused by switching between on and off of switches SW1a to SW4a. As described above, filter 10B according to Example 3 can further increase, using the inductors (Lp1a to Lp4a) connected in series to the switches (SW1a to SW4a), the range in which the frequency of the attenuation pole on the passband low-frequency side can be changed, as compared with filter 10A according to Example 2. Accordingly, as illustrated in FIGS. 14A and 14B, filter 10B can ensure a greater frequency changeable range of the passband than that of filter 10A.

8. Variation 2 of Embodiment 1 (Example 4)

Note that the first switch circuit may further include a plurality of circuits each constituted by the third impedance element and the first switch element connected in series. Further, the second switch circuit may further include a plurality of circuits each constituted by the fourth impedance element and the second switch element connected in series. The following describes a filter according to Variation 2 of Embodiment 1 having such a configuration using an example (Example 4).

Figure 15A:
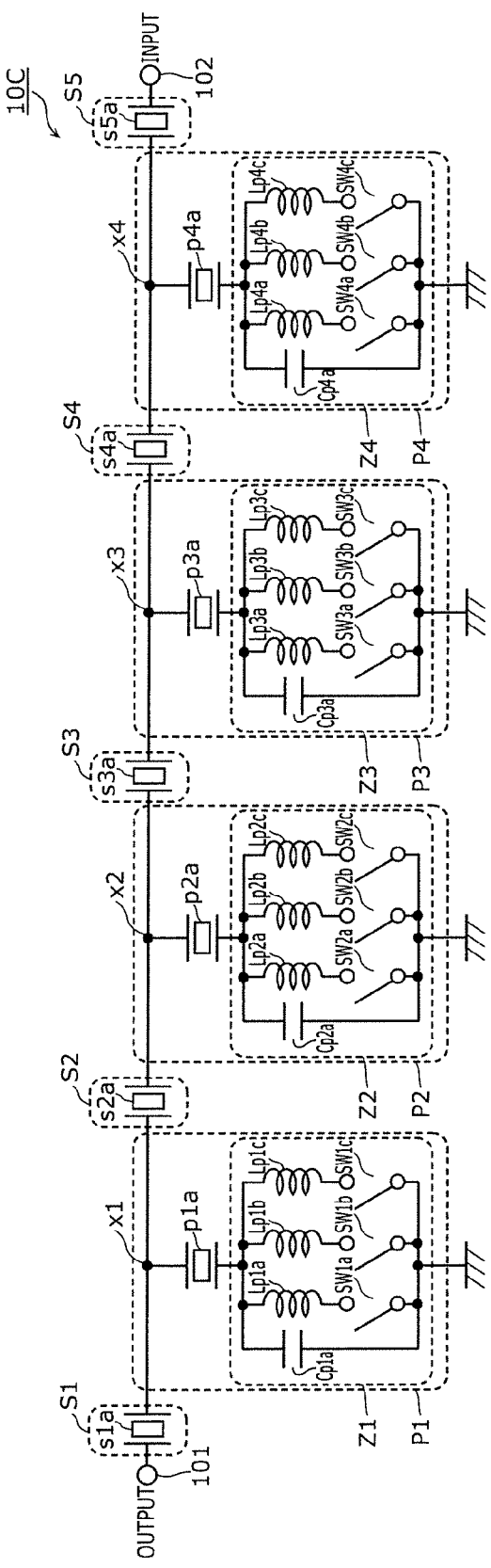
FIG. 15A illustrates a circuit configuration of a filter according to Example 4.

FIG. 15A illustrates a circuit configuration of filter 10C according to Example 4. Filter 10C illustrated in FIG. 15A is different from filter 10B according to Example 3 in the switch circuit configuration. More specifically, in each switch circuit, circuits each constituted by a switch and an inductor connected in series are connected in parallel to a capacitor. In the following, description of the common points of filter 10C according to Example 4 to those of filter 10B according to Example 3 is omitted, and different points are mainly described.

As illustrated in FIG. 15A, filter 10C includes series-arm circuits S1, S2, S3, S4, and S5, parallel-arm circuits P1, P2, P3, and P4, output terminal 101, and input terminal 102.

Parallel-arm circuit P1 includes parallel-arm resonator p1a (second parallel-arm resonator), and switch circuit Z1 (second switch circuit) connected in series to parallel-arm resonator p1a. Parallel-arm circuit P2 includes parallel-arm resonator p2a, and switch circuit Z2 connected in series to parallel-arm resonator p2a. Parallel-arm circuit P3 includes parallel-arm resonator p3a, and switch circuit Z3 connected in series to parallel-arm resonator p3a. Parallel-arm circuit P4 includes parallel-arm resonator p4a (first parallel-arm resonator), and switch circuit Z4 (first switch circuit) connected in series to parallel-arm resonator p4a.

Switch circuit Z1 is a second switch circuit that includes capacitor Cp1a (second impedance element), switches SW1a, SW1b, and SW1c (second switch elements), and inductors Lp1a, Lp1b, and Lp1c (fourth impedance elements). Inductor Lp1a is connected in series to switch SW1a, and a circuit constituted by inductor Lp1a and switch SW1a connected in series is connected in parallel to capacitor Cp1a. Inductor Lp1b is connected in series to switch SW1b, and a circuit constituted by inductor Lp1b and switch SW1b connected in series is connected in parallel to capacitor Cp1a. Inductor Lp1c is connected in series to switch SW1c, and a circuit constituted by inductor Lp1c and switch SW1c connected in series is connected in parallel to capacitor Cp1a. Inductors Lp1a, Lp1b, and Lp1c have different inductance values.

Switch circuit Z2 includes capacitor Cp2a, switches SW2a, SW2b, and SW2c, and inductors Lp2a, Lp2b and Lp2c. Inductor Lp2a is connected in series to switch SW2a, and a circuit constituted by inductor Lp2a and switch SW2a connected in series is connected in parallel to capacitor Cp2a. Inductor Lp2b is connected in series to switch SW2b, and a circuit constituted by inductor Lp2b and switch SW2b connected in series is connected in parallel to capacitor Cp2a. Inductor Lp2c is connected in series to switch SW2c, and a circuit constituted by inductor Lp2c and switch SW2c connected in series is connected in parallel to capacitor Cp2a. Inductors Lp2a, Lp2b, and Lp2c have different inductance values.

Switch circuit Z3 includes capacitor Cp3a, switches SW3a, SW3b, and SW3c, and inductors Lp3a, Lp3b and Lp3c. Inductor Lp3a is connected in series to switch SW3a, and a circuit constituted by inductor Lp3a and switch SW3a connected in series is connected in parallel to capacitor Cp3a. Inductor Lp3b is connected in series to switch SW3b, and a circuit constituted by inductor Lp3b and switch SW3b connected in series is connected in parallel to capacitor Cp3a. Inductor Lp3c is connected in series to switch SW3c, and a circuit constituted by inductor Lp3c and switch SW3c connected in series is connected in parallel to capacitor Cp3a. Inductors Lp3a, Lp3b, and Lp3c have different inductance values.

Switch circuit Z4 is a first switch circuit that includes capacitor Cp4a (first impedance element), switches SW4a, SW4b, and SW4c (first switch elements), and inductors Lp4a, Lp4b, and Lp4c (third impedance elements). Inductor Lp4a is connected in series to switch SW4a, and a circuit constituted by inductor Lp4a and switch SW4a connected in series is connected in parallel to capacitor Cp4a. Inductor Lp4b is connected in series to switch SW4b, and a circuit constituted by inductor Lp4b and switch SW4b connected in series is connected in parallel to capacitor Cp4a. Inductor Lp4c is connected in series to switch SW4c, and a circuit constituted by inductor Lp4c and switch SW4c connected in series is connected in parallel to capacitor Cp4a. Inductors Lp4a, Lp4b, and Lp4c have different inductance values.

Here, current Is4a that flows through switch SW4a, current Is4b that flows through switch SW4b, and current Is4c that flows through switch SW4c are smaller than current Is1a that flows through switch SW1a, current Is1b that flows through switch SW1b, and current Is1c that flows through switch SW1c. In this configuration, gate width Ws4a of transistors included in switch SW4a, gate width Ws4b of transistors included in switch SW4b, and gate width Ws4c of transistors included in switch SW4c are narrower than gate width Ws1a of transistors included in switch SW1a, gate width Ws1b of transistors included in switch SW1b, and gate width Ws1c of transistors included in switch SW1c. This ensures power durability that filter 10C is to have, and also achieves reduction in size of filter 10C and passband insertion loss when the switches are conducting.

Further, voltage Vs1a across switch SW1a, voltage Vs1b across switch SW b, and voltage Vs1c across switch SW1c are lower than voltage Vs4a across switch SW4a, voltage Vs4b across switch SW4b, and voltage Vs4c across switch SW4c. In this configuration, stack count Ns1a of switch SW1a, stack count Ns1b of switch SW1b, and stack count Ns1c of switch SW1c are lower than stack count Ns4a of switch SW4a, stack count Ns4b of switch SW4b, and stack count Ns4c of switch SW4c. This ensures power durability that filter 10C is to have and also achieves reduction in size of filter 10C and passband insertion loss when the switches are conducting.

Figure 15B:
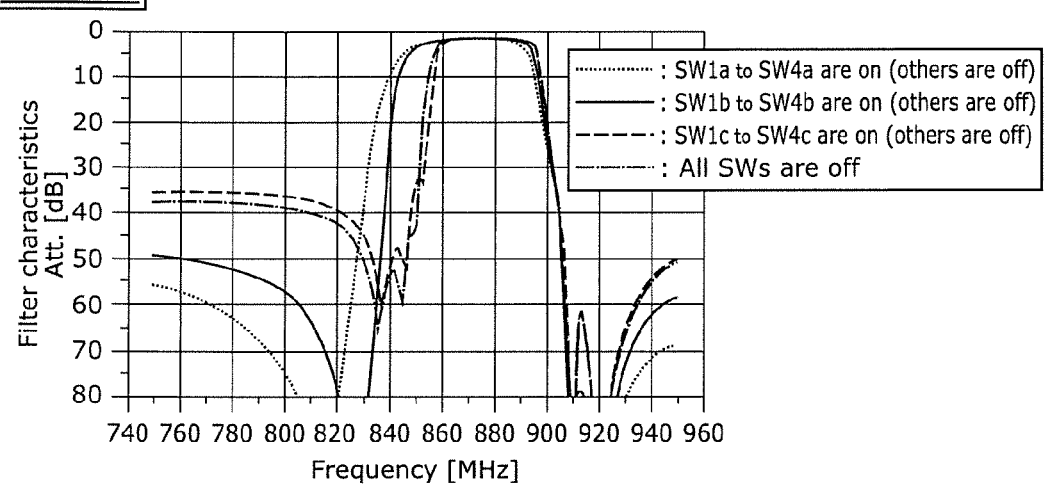
FIG. 15B is a graph showing passing characteristics of the filter according to Example 4.

FIG. 15B is a graph showing passing characteristics of filter 10C according to Example 4. In filter 10C according to this example, in each of the switch circuits (Z1 to Z4), circuits each constituted by a switch and an inductor connected in series are connected in parallel to a capacitor. In this configuration, individually switching between a conducting state and a non-conducting state of three switches in each switch circuit can increase a range in which a frequency of the attenuation pole on the passband low-frequency side is changed, and furthermore finely change the frequency of the attenuation pole, as illustrated in FIG. 14B.

Note that in Example 4, three inductors included in one switch circuit have different inductance values, yet may have the same inductance value. This also can change the inductance value of a switch circuit by changing the number of switches in the conducting state. Also, when a plurality of switches are conducting, the Q factors of the inductors can be improved, and a plurality of switches are provided in parallel. Thus, the Q factors of the resonant frequencies of the parallel-arm circuits can be increased, and the loss of the radio-frequency filter can be reduced.

9. Variation 3 of Embodiment 1 (Example 5)

A description so far is based on a configuration in which one parallel-arm circuit has one parallel-arm resonator, yet one parallel-arm circuit may have two parallel-arm resonators. Thus, the following describes a filter according to Variation 3 of Embodiment 1 having such a configuration, using an example (Example 5), in comparison with a comparative example (Comparative Example 2).

9.1 Example 5

Figure 16:
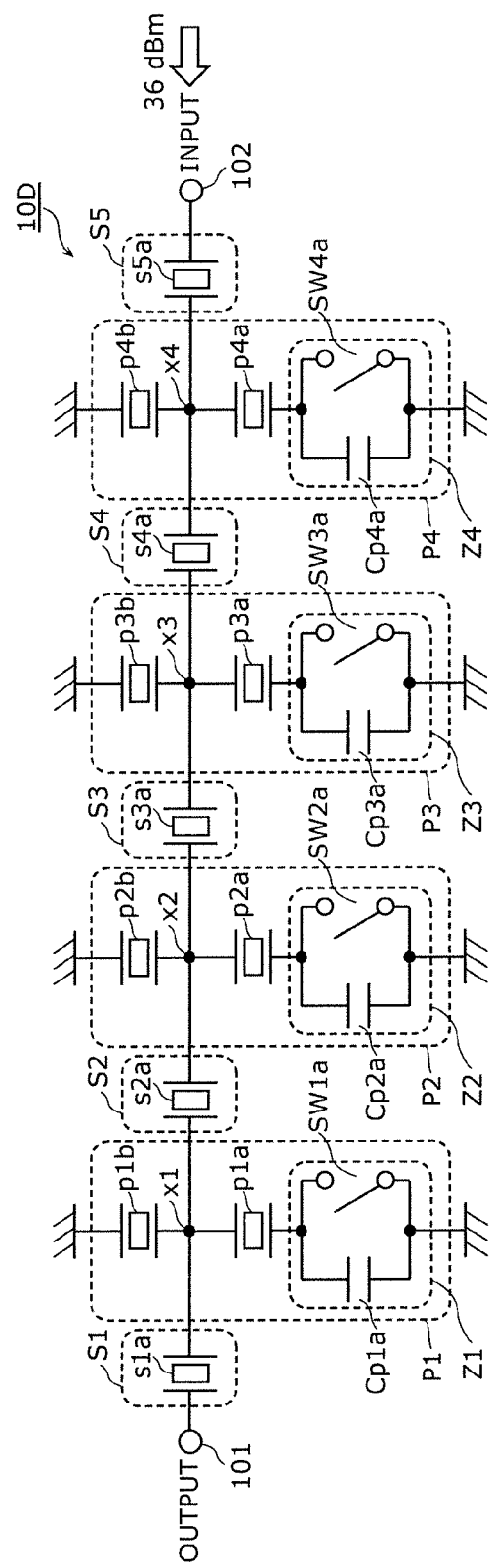
FIG. 16 illustrates a circuit configuration of a filter according to Example 5.

FIG. 16 illustrates a circuit configuration of filter 10D according to Example 5. Filter 10D illustrated in FIG. 16 is different from filter 10A according to examples (Examples 1 and 2) of Embodiment 1 in the configuration of a parallel-arm circuit. More specifically, one parallel-arm circuit includes two parallel-arm resonators. In the following, description of the common points of filter 10D to those of filter 10A is omitted, and different points are mainly described.

As illustrated in FIG. 16, filter 10D includes series-arm circuits S1, S2, S3, S4, and S5, parallel-arm circuits P1, P2, P3, and P4, output terminal 101, and input terminal 102.

Parallel-arm circuit P1 is a second parallel-arms circuit connected to the ground and node x1 (second node) on a path between series-arm circuits S1 and S2. Parallel-arm circuit P2 is connected to the ground and node x2 on a path between series-arm circuits S2 and S3. Parallel-arm circuit P3 is connected to the ground and node X3 on a path between series-arm circuits S3 and S4. Parallel-arm circuit P4 is a first parallel arm circuit connected to the ground and node x4 (first node) on a path between series-arm circuits S4 and S5.

Parallel-arm circuit P1 includes parallel-arm resonator p1a (second parallel-arm resonator), parallel-arm resonator p1b (fourth parallel-arm resonator), and switch circuit Z1 (second switch circuit) connected in series to parallel-arm resonator p1a. Parallel-arm resonator p1b and a circuit constituted by parallel-arm resonator p1a and switch circuit Z1 connected in series are connected in parallel between node x1 and the ground.

Parallel-arm circuit P2 includes parallel-arm resonators p2a and p2b, and switch circuit Z2 connected in series to parallel-arm resonator p2a. Parallel-arm resonator p2b and a circuit constituted by parallel-arm resonator p2a and switch circuit Z2 connected in series are connected in parallel between node x2 and the ground.

Parallel-arm circuit P3 includes parallel-arm resonators p3a and p3b, and switch circuit Z3 connected in series to parallel-arm resonator p3a. Parallel-arm resonator p3b and a circuit constituted by parallel-arm resonator p3a and switch circuit Z3 connected in series are connected in parallel between node x3 and the ground.

Parallel-arm circuit P4 includes parallel-arm resonator p4a (first parallel-arm resonator), parallel-arm resonator p4b (third parallel-arm resonator), and switch circuit Z4 (first switch circuit) connected in series to parallel-arm resonator p4a. Parallel-arm resonator p4b and a circuit constituted by parallel-arm resonator p4a and switch circuit Z4 connected in series are connected in parallel between node x4 and the ground.

Here, resonant frequency frp1a of parallel-arm resonator p1a is lower than resonant frequency frp1b of parallel-arm resonator p1b, and antiresonant frequency fap1a of parallel-arm resonator p1a is lower than antiresonant frequency fap1b of parallel-arm resonator p1b. Resonant frequency frp2a of parallel-arm resonator p2a is lower than resonant frequency frp2b of parallel-arm resonator p2b, and antiresonant frequency fap2a of parallel-arm resonator p2a is lower than antiresonant frequency fap2b of parallel-arm resonator p2b. Resonant frequency frp3a of parallel-arm resonator p3a is lower than resonant frequency frp3b of parallel-arm resonator p3b, and antiresonant frequency fap3a of parallel-arm resonator p3a is lower than antiresonant frequency fap3b of parallel-arm resonator p3b. Resonant frequency frp4a of parallel-arm resonator p4a is lower than resonant frequency frp4b of parallel-arm resonator p4b, and antiresonant frequency fap4a of parallel-arm resonator p4a is lower than antiresonant frequency fap4b of parallel-arm resonator p4b.

Switch circuits Z1 to Z4 according to this example have the same circuit configuration as that of switch circuits Z1 to Z4 according to Examples 1 and 2, and thus a description of the circuit configuration is omitted.

Filter 10D according to this example is a radio-frequency filter that switches, by switching between the conducting and non-conducting states of switches SW1a to SW4a, between first filter characteristics that Band11-Rx (1475.9 to 1495.9 MHz) is a first passband and Band11-Tx (1427.9 to 1447.9 MHz) is a first attenuation band, and second filter characteristics that Band21-Rx (1495.9 to 1510.9 MHz) is a second passband and Band21-Tx (1447.9 to 1462.9 MHz) is a second attenuation band. Specifically, the filter is a radio-frequency filter (tunable filter) having a frequency-tunable function of being switched between a receiving filter for Band 11 and a receiving filter for Band 21, by switching between the conducting and non-conducting states of switches SW1a to SW4a.

In this example, similarly to Examples 2 and 3, switches SW1a to SW4a are designed such that current withstand capability and voltage withstand capability that switches SW1a to SW4a are to have are ensured when high-frequency power of +36 dBm is applied through input terminal 102. Specifically, the gate widths of switches SW1a to SW4a are individually determined according to currents flowing through switches SW1a to SW4a, and the stack counts of switches SW1a to SW4a are individually determined according to the voltages applied to switches SW1a to SW4a. Thus, the gate widths of transistors in switches SW1a to SW4a are individually determined to ensure current withstand capability of switches SW1a to SW4a, and the stack counts are individually determined to ensure voltage withstand capability of switches SW1a to SW4a.

Table 13 shows design parameters of filter 10D according to Example 5. Table 14 shows allowable input currents, allowable input voltages, sizes, and a total size of the switches of filter 10D according to Example 5. Table 15 shows passband insertion losses of filter 10D according to Example 5.

Figure 17:
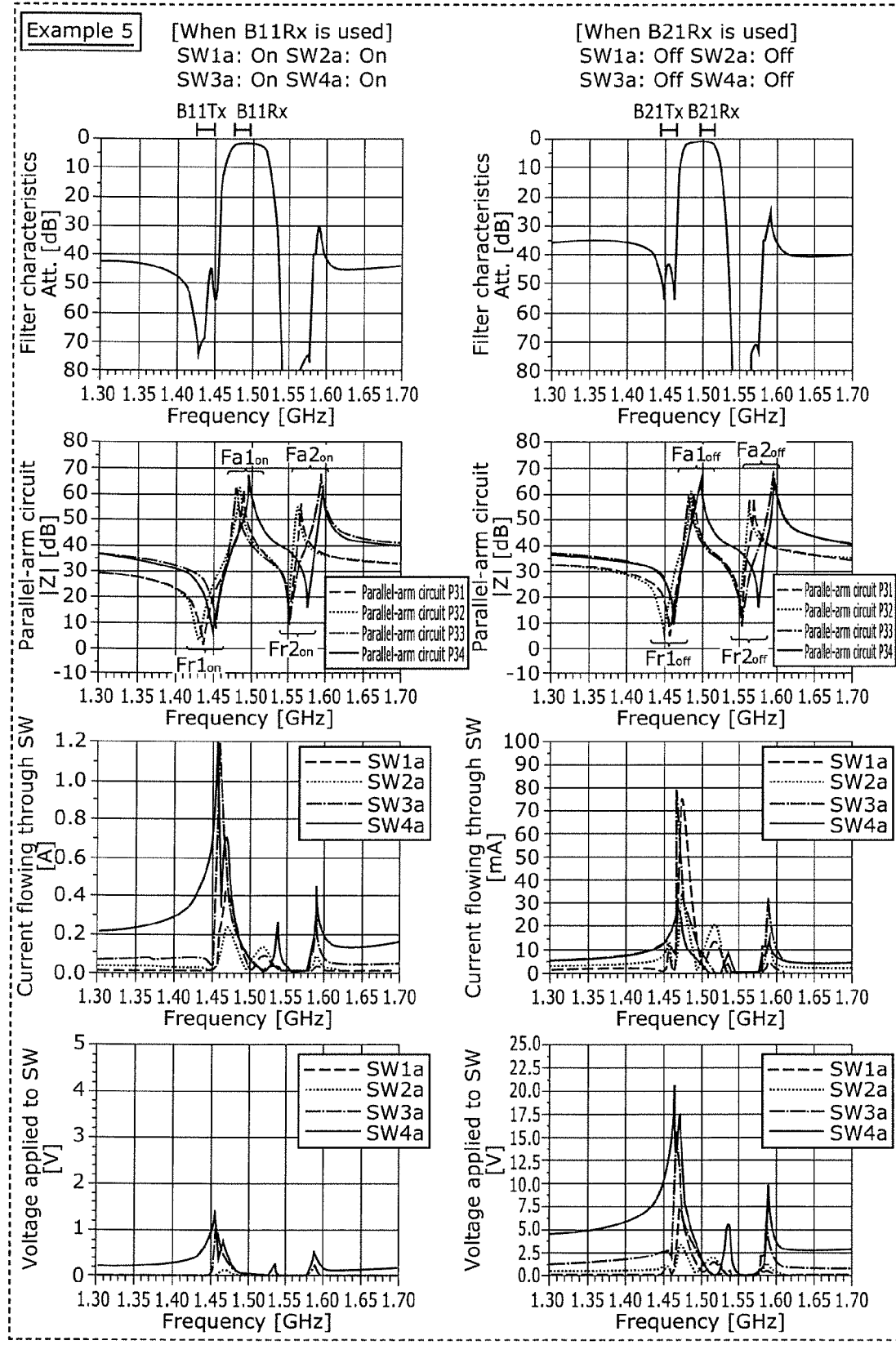
FIG. 17 illustrates graphs showing various characteristics of the filter according to Example 5.

FIG. 17 illustrates graphs showing various characteristics of filter 10D according to Example 5.

TABLE 13

| Ex. 5 | $W_F$ (mm) | Ns (Ct) | sw | Fr1 (MHz) | Fa1 (MHz) | Fr2 (MHz) | Fa2 (MHz) | Is @B11Rx (mA) | Is @B11Tx (mA) | Vs @B11Rx (V) |
|---|---|---|---|---|---|---|---|---|---|---|
| P-arm ckt P1 | 1.10 | 1 | On | 1437 | 1489 | 1552 | 1566 | 306 | 32 | 0.11 |
|  |  |  | Off | 1458 | 1490 | 1552 | 1568 | — | — | — |
| P-arm ckt P2 | 0.70 | 1 | On | 1430 | 1484 | 1549 | 1561 | 186 | 42 | 0.11 |
|  |  |  | Off | 1450 | 1485 | 1549 | 1563 | — | — | — |
| P-arm ckt P3 | 0.85 | 2 | On | 1453 | 1481 | 1553 | 1593 | 242 | 77 | 0.22 |
|  |  |  | Off | 1464 | 1484 | 1553 | 1594 | — | — | — |
| P-arm ckt P4 | 2.35 | 7 | On | 1448 | 1496 | 1575 | 1594 | 300 | 67 | 0.35 |
|  |  |  | Off | 1464 | 1498 | 1575 | 1596 | — | — | — |

| Ex. 5 | Vs @B11Tx (V) | Is @B21Rx (mA) | Is @B21Tx (mA) | Vs @B21Rx (V) | Vs @B21Tx (V) | Is_max (mA) | Vs_max (V) | Ron (Ω) |
|---|---|---|---|---|---|---|---|---|
| P-arm ckt P1 | 0.01 | — | — | — | — | 306 | 104.00 | 0.38 |
|  | — | 10 | 10 | 0.97 | 104 |  |  |  |
| P-arm ckt P2 | 0.02 | — | — | — | — | 186 | 1.72 | 0.60 |
|  | — | 18 | 14 | 1.72 | 1.34 |  |  |  |
| P-arm ckt P3 | 0.07 | — | — | — | — | 242 | 2.68 | 0.98 |
|  | — | 12 | 14 | 2.37 | 2.68 |  |  |  |
| P-arm ckt P4 | 0.77 | — | — | — | — | 670 | 16.02 | 1.25 |
|  | — | 4 | 23 | 2.77 | 15.88 |  |  |  |

TABLE 14

| Ex. 5 | Allowable input current (mA) | Allowable input voltage (V) | Size (μm²) |
|---|---|---|---|
| P-arm ckt P1 (Switch SW1a) | 350 | 2.5 | 1100 |
| P-arm ckt P2 (Switch SW2a) | 223 | 2.5 | 700 |
| P-arm ckt P3 (Switch SW3a) | 270 | 5.0 | 1700 |
| P-arm ckt P4 (Switch SW4a) | 747 | 17.5 | 16450 |
| Total | 1590 | 27.5 | 19950 |

TABLE 15

| Ex. 5 | SW1a to SW4a | IL @B11Rx(dB) | IL @B21Rx(dB) |
|---|---|---|---|
| Filter charcs. | On | 1.64 | — |
|  | Off | — | 1.93 |

9.2 Comparative Example 2

The filter according to Comparative Example 2 has the same configuration as that of the filter according to Example 5 except that design parameters are different. Specifically, in Comparative Example 2, switches SW1a to SW4a have the same gate width determined according to the greatest current of the currents that flow through switches SW1a to SW4a, similarly to Comparative Example 1. Switches SW1a to SW4a have the same stack count determined according to the highest voltage of the voltages applied to switches SW1a to SW4a.

Table 16 shows design parameters of the filter according to Comparative Example 2. Table 17 shows allowable input currents, allowable input voltages, sizes, and a total size of the switches of the filter according to Comparative Example 2. Table 18 shows passband insertion losses of the filter according to Comparative Example 2.

Figure 18:
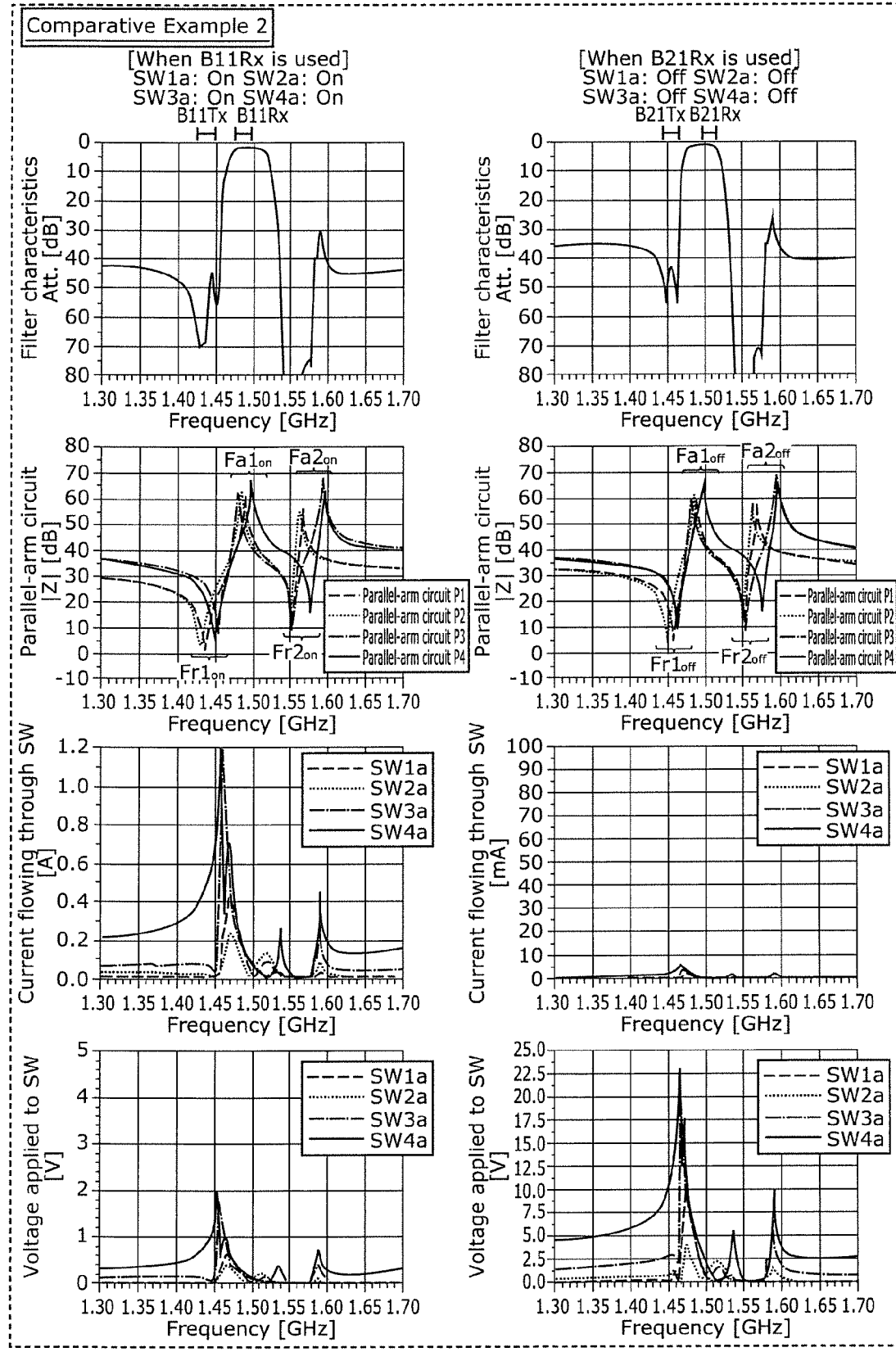
FIG. 18 illustrates graphs showing various characteristics of a filter according to Comparative Example 2.

FIG. 18 illustrates graphs showing various characteristics of the filter according to Comparative Example 2.

TABLE 16

| Comp. Ex. 2 | $W_F$ (mm) | Ns (Ct) | SW | Fr1 (MHz) | Fa1 (MHz) | Fr2 (MHz) | Fa2 (MHz) | Is @B11Rx (mA) | Is @B11Tx (mA) | Vs @B11Rx (V) |
|---|---|---|---|---|---|---|---|---|---|---|
| P-arm ckt P1 | 2.40 | 7 | On | 1436 | 1489 | 1552 | 1566 | 312 | 32 | 0.34 |
|  |  |  | Off | 1461 | 1491 | 1552 | 1569 | — | — | — |
| P-arm ckt P2 | 2.40 | 7 | On | 1429 | 1484 | 1549 | 1561 | 190 | 42 | 0.22 |
|  |  |  | Off | 1453 | 1485 | 1549 | 1563 | — | — | — |

TABLE 16-continued

| P-arm ckt P3 | 2.40 | 7 | On Off | 1453 1465 | 1481 1485 | 1553 1553 | 1593 1595 | 245 — | 78 — | 0.29 — |
| P-arm ckt P4 | 2.40 | 7 | On Off | 1448 1464 | 1496 1498 | 1575 1575 | 1594 1596 | 302 — | 670 — | 0.35 — |

| Comp. Ex. 2 | Vs @B11Tx (V) | Is @B21Rx (mA) | Is @B21Tx (mA) | Vs @B21x (V) | Vs @B21Tx (V) | Is_max (mA) | Vs_max (V) | Ron (Ω) |
|---|---|---|---|---|---|---|---|---|
| P-arm ckt P1 | 0.04 — | — 1 | — 0 | — 1.16 | — 1.11 | 312 | 1.16 | 1.25 |
| P-arm ckt P2 | 0.05 — | — 1 | — 1 | — 2.04 | — 1.5 | 190 | 2.04 | 1.25 |
| P-arm ckt P3 | 0.09 — | — 1 | — 1 | — 2.7 | — 2.84 | 245 | 2.84 | 1.25 |
| P-arm ckt P4 | 0.77 — | — 1 | — 7 | — 2.86 | — 16.02 | 670 | 16.02 | 1.25 |

TABLE 17

| Comp. Ex. 2 | Allowable input current (mA) | Allowable input voltage (V) | Size (μm²) |
|---|---|---|---|
| P-arm ckt P1 (Switch SW1a) | 747 | 17.5 | 16450 |
| P-arm ckt P2 (Switch SW2a) | 747 | 17.5 | 16450 |
| P-arm ckt P3 (Switch SW3a) | 747 | 17.5 | 16450 |
| P-arm ckt P4 (Switch SW4a) | 747 | 17.5 | 16450 |
| Total | 2988 | 70.0 | 65800 |

TABLE 18

| Comp. Ex. 2 | SW1a to SW4a | IL @B11Rx(dB) | IL @B21Rx(dB) |
|---|---|---|---|
| Filter charcs. | On Off | 1.66 — | — 1.93 |

9.3 Comparison with Example 5 and Comparative Example 2

As illustrated in FIGS. 17 and 18 and Tables 13 and 16, resonance characteristics (resonant frequencies and antiresonant frequencies) of parallel-arm circuits P1 to P4 in the filters according to Example 5 and Comparative Example 2 are substantially the same. As illustrated in the first graphs in FIGS. 17 and 18, the filters switch between the first filter characteristics for Band 11, and the second filter characteristics for Band 21.

Here, with reference to the second graphs in FIGS. 17 and 18, impedance characteristics of parallel-arm circuits P1 to P4 are described using in particular parallel-arm circuit P1 as an example. When switch SW1a is on, switch SW1a short-circuits capacitor Cp1a, and thus impedance characteristics of parallel-arm circuit P1 are not influenced by capacitor Cp1a. Thus, in this case, combined characteristics (characteristics of parallel-arm circuit P1 shown by the left second graphs in FIGS. 17 and 18) of two parallel-arm resonators (parallel-arm resonators p1a and p1b) are impedance characteristics of parallel-arm circuit P1.

Specifically, when switch SW1a is on, parallel-arm circuit P1 has impedance characteristics as follows. Parallel-arm circuit P1 has two resonant frequencies Fr1on and Fr2on (at this time, the following are satisfied: Fr1on≈resonant frequency frp1a of parallel-arm resonator p1a; and Fr2on≈resonant frequency frp1b of parallel-arm resonator p1b). Specifically, impedance of parallel-arm circuit P1 has a local minimum value at a frequency substantially the same as resonant frequency frp1a of parallel-arm resonator p1a, and a local minimum value at a frequency substantially the same as resonant frequency frp1b of parallel-arm resonator p1b.

Parallel-arm circuit P1 has two antiresonant frequencies Fa1on and Fa2on (at this time, the following are all satisfied: Fr1on<Fa1on<Fr2on<Fa2on; Fa1on<antiresonant frequency fap1a of parallel-arm resonator p1a; and Fa2on<antiresonant frequency fap1b of parallel-arm resonator p1b). Specifically, impedance of parallel-arm circuit P1 has a local maximum value at a frequency between resonant frequency frp1a of parallel-arm resonator p1a and resonant frequency frp1b of parallel-arm resonator p1b, and a local maximum value at a frequency between antiresonant frequency fap1a of parallel-arm resonator p1a and antiresonant frequency fap1b of parallel-arm resonator p1b.

Here, the reason for Fa1on<fap1a being satisfied is that parallel-arm resonator p1b connected in parallel to parallel-arm resonator p1a operates as a parallel capacitor, in a frequency band near antiresonant frequency fap1a of parallel-arm resonator p1a. The reason for Fa2on<fap1b being satisfied is that parallel-arm resonator p1a connected in parallel to parallel-arm resonator p1b operates as a parallel capacitor, in a frequency band near antiresonant frequency fap1b of parallel-arm resonator p1b.

When configuring a band pass filter using a ladder filter structure, antiresonant frequency Fa1on of parallel-arm circuit P1 and resonant frequency frs1a of series-arm resonator s1a are brought close to each other. Accordingly, when switch SW1a is on, a frequency region near resonant frequency Fr1on at which the impedance of parallel-arm circuit P1 approaches 0 is a low-frequency stop band. If the frequency is higher than resonant frequency Fr1on, the impedance of parallel-arm circuit P1 is high at a frequency near antiresonant frequency Fa1on, and the impedance of series-arm resonator s1a approaches 0 at a frequency near resonant frequency frs. This provides a passband for signals near antiresonant frequency Fa1on and resonant frequency frs1a. Furthermore, if the frequency is increased so as to be near resonant frequency Fr2on and antiresonant frequency fas1a, the impedance of series-arm resonator s1a is increased and the impedance of parallel-arm circuit P1 approaches 0, which provides a high frequency stop band.

Specifically, when switch SW1a is on, filter 10D has first filter characteristics that a passband is determined by antiresonant frequency Fa1on and resonant frequency frs1a, the pole (attenuation pole) on the passband low-frequency side is determined by resonant frequency Fr1on, and the pole (attenuation pole) on the passband high-frequency side is determined by resonant frequency Fr2on and antiresonant frequency fas1a.

On the other hand, when switch SW1a is off, switch SW1a does not short-circuit capacitor Cp1a, and thus the impedance characteristics of parallel-arm circuit P1 are influenced by capacitor Cp1a. Specifically, in this case, combined characteristics (combined characteristics of parallel-arm circuit P1 as shown by the right second graph in FIG. 17 and by the right second graph in FIG. 18) of two parallel-arm resonators (parallel-arm resonators p1a and p1b) and capacitor Cp1a connected in series to parallel-arm resonator p1a are the impedance characteristics of parallel-arm circuit P1.

Specifically, when switch SW1a is off, parallel-arm circuit P1 has impedance characteristics as follows. Parallel-arm circuit P1 has two resonant frequencies Fr1off and Fr2off and two antiresonant frequencies Fa1off and Fa2off (at this time, the following are all satisfied: Fr1off<Fa1off<Fr2off<Fa2off; Fa1off<fap1a; frp1a<Fr1off; and Fa2off<fap1b). Specifically, impedance of parallel-arm circuit P1 has a local minimum value at a frequency higher than resonant frequency frp1a of parallel-arm resonator p1a, and a local minimum value at resonant frequency frp1b of parallel-arm resonator p1b. Further, impedance of parallel-arm circuit P1 has a local maximum value at a frequency between resonant frequency frp1a of parallel-arm resonator p1a and resonant frequency frp1b of parallel-arm resonator p1b, and a local maximum value at a frequency between antiresonant frequency fap1a of parallel-arm resonator p1a and antiresonant frequency fap1b of parallel-arm resonator p1b.

Here, a reason for Fa1off<fap1a being satisfied is that parallel-arm resonator p1b connected in parallel to parallel-arm resonator p1a operates as a parallel capacitor in a frequency band near antiresonant frequency fap1a of parallel-arm resonator p1a. Further, a reason for frp1a<Fr1off being satisfied is that resonance of parallel-arm resonator p1a and capacitor Cp1a occurs in a frequency band near resonant frequency frp1a of parallel-arm resonator p1a. Further, a reason for Fa2off<fap1b being satisfied is that combined characteristics of parallel-arm resonator p1a and capacitor Cp1a connected in parallel to parallel-arm resonator p1b function as a parallel capacitor.

Specifically, when switch SW1a is off, filter 10D has second filter characteristics that a passband is determined by antiresonant frequency Fa1off and resonant frequency frs1a, the pole (attenuation pole) on the passband low-frequency side is determined by resonant frequency Fr1off, and the pole (attenuation pole) on the passband high-frequency side is determined by resonant frequency Fr2off and antiresonant frequency fas1a.

As illustrated in the second graphs in FIGS. 17 and 18, if switches SW1a to SW4a are switched from on to off, impedance characteristics of parallel-arm circuits P1 to P4 are changed as follows. Specifically, a lower resonant frequency of two resonant frequencies and a lower antiresonant frequency of two antiresonant frequencies of each of parallel-arm circuits P1 to P4 are both switched to higher frequencies. In this example, only parallel-arm resonator p1a is connected in series to capacitor Cp1a and switch SW1a, and thus the lower resonant frequency of two resonant frequencies is switched from Fr1on to Fr1off to be a higher frequency. The lower antiresonant frequency is switched from Fa1on to Fa1off to be a higher frequency.

Here, lower antiresonant frequencies and lower resonant frequencies of parallel-arm circuits P1 to P4 determine the attenuation slope on the passband low-frequency side of filter 10D, and are all switched to higher frequencies, as described above. Accordingly, as illustrated in the first graphs in FIGS. 17 and 18, switching switch SW1a from on to off switches passing characteristics of the filters according to Example 5 and Comparative Example 2 to higher-frequency passing characteristics while the attenuation slope on the passband low-frequency side maintains its steepness. In other words, the filters can switch a frequency at the passband low-frequency edge to a higher frequency while switching the attenuation pole on the passband low-frequency side to an attenuation pole at a higher frequency and inhibiting an increase in the insertion loss at the passband low-frequency edge.

Here, a comparison between Example 5 and Comparative Example 2 shows that in Example 5, the gate width of switch SW4a is made greater than the gate width of switch SW1a, and the stack count of switch SW1a is made lower than the stack count of switch SW4a. Furthermore, the gate width of each of switches SW2a and SW3a is also made narrower than the gate width of switch SW4a, and the stack count of each of switches SW2a and SW3a is also made lower than the stack count of switch SW4a.

Specifically, the gate width and the stack count of each of switches SW1a to SW3a can be made narrower and lower in Example 5 than those in Comparative Example 2, and thus a total size of switches SW1a to SW4a can be decreased (19950 $\mu m^2$: see Table 14, 65800 $\mu m^2$: see Table 17). On resistance Ron of switches SW1a to SW3a having relatively narrow gate widths can be decreased by making the stack counts of switches SW1a to SW3a each lower than the stack count of switch SW4a. Accordingly, passband insertion loss when switches SW1a to SW4a are on (namely, when Band11-Rx is used) can be further reduced (1.64 dB: see Table 15, 1.66 dB: see Table 18).

As stated above, filter 10D according to Example 5 can yield following advantageous effects (1) to (3).

(1) By making gate width W4a of switch SW4a greater than gate width W1a of switch SW1a, power durability that filter 10D is to have is ensured, and furthermore reduction in size of the filter and passband insertion loss when the switches are conducting can be achieved.

(2) By switching between the conducting and non-conducting states of a switch, the frequency of the attenuation pole on the passband low-frequency side can be changed without increasing insertion loss at the passband low-frequency edge.

(3) In a configuration in which voltage V1a across switch SW1a is lower than voltage V4a across switch SW4a, stack count Ns1 of switch SW1a is made lower than stack count Ns4 of switch SW4a, thus securing power durability that filter 10D is to have, and also achieving further reduction in size of the filter and passband insertion loss when the switches are conducting.

10. Variation 4 of Embodiment 1 (Example 6)

In Variation 3 of Embodiment 1, in each of the first parallel-arm circuit and the second parallel-arm circuit, the resonant frequency of the second parallel-arm resonator is higher than the resonant frequency of the first parallel-arm resonator, and the antiresonant frequency of the second parallel-arm resonator is higher than the antiresonant frequency of the first parallel-arm resonator. However, the present disclosure is not limited thereto, and the resonant frequency of the second parallel-arm resonator may be lower than the resonant frequency of the first parallel-arm resonator, and the antiresonant frequency of the second parallel-arm resonator may be lower than the antiresonant frequency of the first parallel-arm resonator. The following describes a filter according to Variation 4 of Embodiment 1 having such a configuration, in comparison with a comparative example (Comparative Example 3), using an example (Example 6).

10.1 Example 6

The filter according to Example 6 has a similar circuit configuration to that of the filter according to Example 5 except that design parameters are different. Accordingly, description of the circuit configuration of the filter according to Example 6 is omitted.

The filter according to this example is a radio-frequency filter that switches, by switching between the conducting and non-conducting states of switches SW1a to SW4a, between first filter characteristics that Band28a-Tx (703 to 733 MHz) is a first passband and Band28a-Rx (758 to 788 MHz) is a first attenuation band, and second filter characteristics that Band28b-Tx (718 to 748 MHz) is a second passband and Band28b-Rx (773 to 803 MHz) is a second attenuation band. Specifically, the filter is a radio-frequency filter (tunable filter) having a frequency-tunable function of being switched between a transmission filter for Band 28a and a transmission filter for Band 28b, by switching between the conducting and non-conducting states of switches SW1a to SW4a.

In this example, similarly to Example 5, switches SW1a to SW4a are designed such that current withstand capability and voltage withstand capability that switches SW1a to SW4a are to have are ensured when high-frequency power of +36 dBm is applied through input terminal 102. Specifically, the gate widths of switches SW1a to SW4a are individually determined according to currents flowing through switches SW1a to SW4a, and the stack counts of switches SW1a to SW4a are individually determined according to the voltages applied to switches SW1a to SW4a. Thus, the gate widths of transistors in switches SW1a to SW4a are individually determined to ensure current withstand capability that switches SW1a to SW4a are to have, and the stack counts are individually determined to ensure voltage withstand capability that switches SW1a to SW4a are to have.

In Example 6, resonant frequency frp1a of parallel-arm resonator p1a is higher than resonant frequency frp1b of parallel-arm resonator p1b, and antiresonant frequency fap1a of parallel-arm resonator p1a is higher than antiresonant frequency fap1b of parallel-arm resonator p1b. Resonant frequency frp2a of parallel-arm resonator p2a is higher than resonant frequency frp2b of parallel-arm resonator p2b, and antiresonant frequency fap2a of parallel-arm resonator p2a is higher than antiresonant frequency fap2b of parallel-arm resonator p2b. Resonant frequency frp3a of parallel-arm resonator p3a is higher than resonant frequency frp3b of parallel-arm resonator p3b, and antiresonant frequency fap3a of parallel-arm resonator p3a is higher than antiresonant frequency fap3b of parallel-arm resonator p3b. Resonant frequency frp4a of parallel-arm resonator p4a is higher than resonant frequency frp4b of parallel-arm resonator p4b, and antiresonant frequency fap4a of parallel-arm resonator p4a is higher than antiresonant frequency fap4b of parallel-arm resonator p4b.

Table 19 shows design parameters of the filter according to Example 6. Table 20 shows allowable input currents, allowable input voltages, sizes, and a total size of the switches of the filter according to Example 6. Table 21 shows passband insertion losses of the filter according to Example 6.

Figure 19:
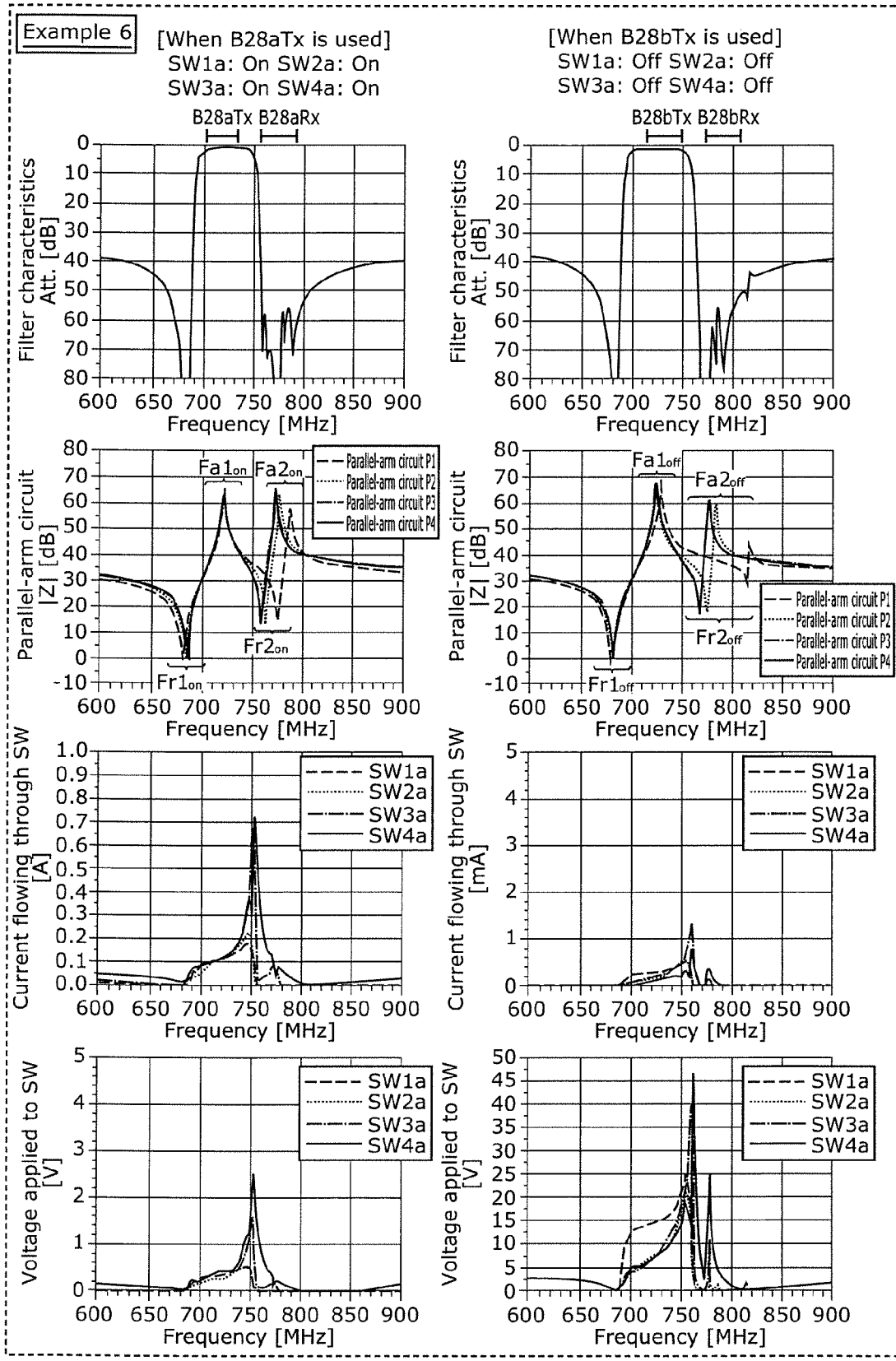
FIG. 19 illustrates graphs showing various characteristics of a filter according to Example 6.

FIG. 19 illustrates graphs showing various characteristics of the filter according to Example 6.

TABLE 19

| Ex. 6 | $W_F$ (mm) | Ns (Ct) | sw | Fr1 (MHz) | Fa1 (MHz) | Fr2 (MHz) | Fa2 (MHz) | Is @B28aRx (mA) | Is @B28aTx (mA) | Vs @B28aRx (V) |
|---|---|---|---|---|---|---|---|---|---|---|
| P-arm ckt P1 | 1.10 | 9 | On | 681.1 | 720.9 | 776.0 | 788.4 | 130 | 32 | 0.42 |
|  |  |  | Off | 681.1 | 729.4 | 814.2 | 816.3 | — | — | — |
| P-arm ckt P2 | 1.20 | 7 | On | 683.4 | 721.7 | 764.1 | 778.0 | 143 | 10 | 0.36 |
|  |  |  | Off | 683.4 | 726.0 | 777.7 | 785.8 | — | — | — |
| P-arm ckt P3 | 1.20 | 7 | On | 684.8 | 722.0 | 759.0 | 773.9 | 146 | 82 | 0.36 |
|  |  |  | Off | 684.8 | 725.8 | 769.6 | 779.4 | — | — | — |
| P-arm ckt P4 | 1.40 | 11 | On | 683.1 | 721.5 | 759.3 | 773.1 | 140 | 393 | 0.49 |
|  |  |  | Off | 683.1 | 725.0 | 769.8 | 778.8 | — | — | — |

| Ex. 6 | Vs @B28aTx (V) | Is @B28bRx (mA) | Is @B28bTx (mA) | Vs @B28bRx (V) | Vs @B28bTx (V) | Is_max (mA) | Vs_max (V) | Ron (Ω) |
|---|---|---|---|---|---|---|---|---|
| P-arm ckt P1 | 0.02 | — | — | — | — | 130 | 20.11 | 3.42 |
|  | — | 0 | 0 | 20.11 | 0.16 |  |  |  |

TABLE 19-continued

| | | | | | | | | |
|---|---|---|---|---|---|---|---|---|
| P-arm ckt P2 | 0.03 — | — 0 | — 0 | — 15.36 | — 1.98 | 143 | 15.36 | 2.44 |
| P-arm ckt P3 | 0.21 — | — 0 | — 0 | — 16.13 | — 12.26 | 146 | 16.13 | 2.44 |
| P-arm ckt P4 | 1.39 — | — 0 | — 1 | — 13.73 | — 27.08 | 393 | 16.02 | 3.29 |

TABLE 20

| Ex. 6 | Allowable input current (mA) | Allowable input voltage (V) | Size (μm²) |
|---|---|---|---|
| P-arm ckt P1 (Switch SW1a) | 350 | 22.5 | 9900 |
| P-arm ckt P2 (Switch SW2a) | 381 | 17.5 | 8400 |
| P-arm ckt P3 (Switch SW3a) | 381 | 17.5 | 8400 |
| P-arm ckt P4 (Switch SW4a) | 445 | 27.5 | 15400 |
| Total | 1557 | 85.0 | 42100 |

TABLE 21

| Ex. 6 | SW1a to SW4a | IL @B28aTx (dB) | IL @B28bTx (dB) |
|---|---|---|---|
| Filter charcs. | On | 1.53 | — |
| | Off | — | 1.24 |

10.2 Comparative Example 3

The filter according to Comparative Example 3 has the same configuration as that of the filter according to Examples 6, except that design parameters are different. Specifically, in Comparative Example 3, switches SW1a to SW4a have the same gate width determined according to the greatest current of the currents that flow through switches SW1a to SW4a, similarly to Comparative Examples 1 and 2. Switches SW1a to SW4a have the same stack count determined according to the highest voltage of the voltages applied to switches SW1a to SW4a.

Table 22 shows design parameters of the filter according to Comparative Example 3. Table 23 shows allowable input currents, allowable input voltages, sizes, and a total size of the switches of the filter according to Comparative Example 3. Table 24 shows passband insertion losses of the filter according to Comparative Example 3.

Figure 20:
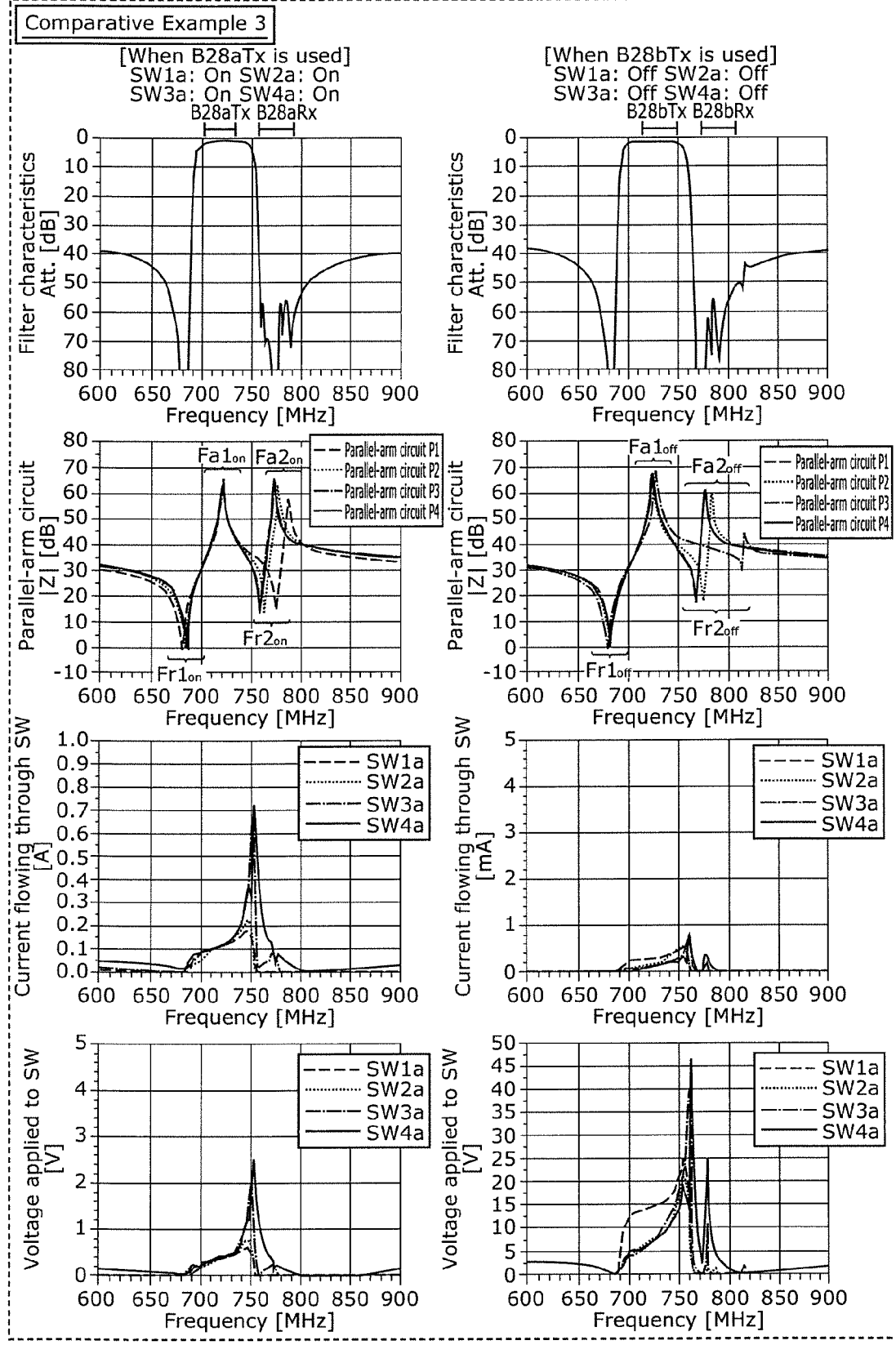
FIG. 20 illustrates graphs showing various characteristics of a filter according to Comparative Example 3.

FIG. 20 illustrates graphs showing various characteristics of the filter according to Comparative Example 3.

TABLE 22

| Comp. Ex. 3 | W_F (mm) | Ns (Ct) | sw | Fr1 (MHz) | Fa1 (MHz) | Fr2 (MHz) | Fa2 (MHz) | Is @B28aRx (mA) | Is @B28aTx (mA) | Vs @B28aRx (V) |
|---|---|---|---|---|---|---|---|---|---|---|
| P-arm ckt P1 | 1.40 | 11 | On | 681.1 | 720.9 | 766.0 | 788.4 | 130 | 32 | 0.46 |
| | | | Off | 681.1 | 729.4 | 814.3 | 816.3 | — | — | — |
| P-arm ckt P2 | 1.40 | 11 | On | 683.4 | 721.7 | 764.0 | 778.0 | 143 | 9 | 0.5 |
| | | | Off | 683.4 | 726.0 | 777.7 | 785.8 | — | — | — |
| P-arm ckt P3 | 1.40 | 11 | On | 684.8 | 722.0 | 758.9 | 773.9 | 146 | 82 | 0.52 |
| | | | Off | 684.8 | 725.9 | 769.6 | 779.4 | — | — | — |
| P-arm ckt P4 | 1.40 | 11 | On | 683.2 | 721.5 | 759.3 | 773.1 | 140 | 393 | 0.49 |
| | | | Off | 683.2 | 725.0 | 769.8 | 778.8 | — | — | — |

| Comp. Ex. 3 | Vs @B28aTx (V) | Is @B28bRx (mA) | Is @B28bTx (mA) | Vs @B28bRx (V) | Vs @B28bTx (V) | Is_max (mA) | Vs_max (V) | Ron (Ω) |
|---|---|---|---|---|---|---|---|---|
| P-arm ckt P1 | 0.02 — | — 0 | — 0 | — 20.13 | — 0.16 | 130 | 20.13 | 0.16 |
| P-arm ckt P2 | 0.03 — | — 0 | — 0 | — 15.37 | — 2 | 143 | 15.37 | 3.29 |
| P-arm ckt P3 | 0.29 — | — 0 | — 0 | — 16.14 | — 12.27 | 146 | 16.14 | 3.29 |
| P-arm ckt P4 | 1.39 — | — 0 | — 0 | — 1374 | — 27.09 | 393 | 16.02 | 3.29 |

TABLE 23

| Comp. Ex. 3 | Allowable input current (mA) | Allowable input voltage (V) | Size (μm²) |
|---|---|---|---|
| P-arm ckt P1 (Switch SW1a) | 445 | 27.5 | 15400 |
| P-arm ckt P2 (Switch SW2a) | 445 | 27.5 | 15400 |
| P-arm ckt P3 (Switch SW3a) | 445 | 27.5 | 15400 |
| P-arm ckt P4 (Switch SW4a) | 445 | 27.5 | 15400 |
| Total | 1780 | 110.0 | 61600 |

TABLE 24

| Comp. Ex. 3 | SW1a to SW4a | IL @B28aTx (dB) | IL @B28bTx (dB) |
|---|---|---|---|
| Filter charcs. | On | 1.53 | — |
|  | Off | — | 1.24 |

10.3 Comparison with Example 6 and Comparative Example 3

As illustrated in FIGS. 19 and 20 and Tables 19 and 22, resonance characteristics (resonant frequencies and antiresonant frequencies) of parallel-arm circuits P1 to P4 in the filters according to Example 6 and Comparative Example 3 are substantially the same. As illustrated in the first graphs in FIGS. 19 and 20, when switches SW1a to SW4a are on, the filters have first filter characteristics that Band28a-Tx is a first passband, and Band28a-Rx is a first attenuation band. Further, when switches SW1a to SW4a are off, the filters have second filter characteristics that Band28b-Tx is a second passband, and Band28b-Rx is a second attenuation band. Specifically, the filters are radio-frequency filters (tunable filters) having a frequency-tunable function of switching a passband between Band28a-Tx and Band28b-Tx, by switching between on and off of switches SW1a to SW4a.

Here, with reference to the second graphs in FIGS. 19 and 20, impedance characteristics of parallel-arm circuits P1 to P4 are described using in particular parallel-arm circuit P1 as an example. When switch SW1a is on, switch SW1a short-circuits capacitor Cp1a, and thus impedance characteristics of parallel-arm circuit P1 are not influenced by capacitor Cp1a. Thus, in this case, combined characteristics (characteristics of parallel-arm circuit P1 shown by the left second graph in FIG. 19 and by the left second graph in FIG. 20) of two parallel-arm resonators (parallel-arm resonators p1a and p1b) are impedance characteristics of parallel-arm circuit P1.

Specifically, when switch SW1a is on, parallel-arm circuit P1 has impedance characteristics as follows. Parallel-arm circuit P1 has two resonant frequencies Fr1on and Fr2on (at this time, the following are satisfied: Fr1on≈resonant frequency frp1b of parallel-arm resonator p1b; and Fr2on≈resonant frequency frp1a of parallel-arm resonator p1a). Specifically, impedance of parallel-arm circuit P1 has a local minimum value at a frequency substantially the same as resonant frequency frp1a of parallel-arm resonator p1a, and a local minimum value at a frequency substantially the same as resonant frequency frp1b of parallel-arm resonator p1b.

Parallel-arm circuit P1 has two antiresonant frequencies Fa1on and Fa2on (at this time, the following are all satisfied: Fr1on<Fa1on<Fr2on<Fa2on; Fa1on<antiresonant frequency fap1b of parallel-arm resonator p1b; and Fa2on<antiresonant frequency fap1a of parallel-arm resonator p1a). Specifically, impedance of parallel-arm circuit P1 has a local maximum value at a frequency between resonant frequency frp1b of parallel-arm resonator p1b and resonant frequency frp1a of parallel-arm resonator p1a, and a local maximum value at a frequency between antiresonant frequency fap1b of parallel-arm resonator p1b and antiresonant frequency fap1a of parallel-arm resonator p1a.

Here, a reason for Fa1on<fap1b being satisfied is that parallel-arm resonator p1a connected in parallel to parallel-arm resonator p1b operates as a parallel capacitor in a frequency band near antiresonant frequency fap1b of parallel-arm resonator p1b. Further, a reason for Fa2on<fap1a being satisfied is that parallel-arm resonator p1b connected in parallel to parallel-arm resonator p1a operates as a parallel capacitor in a frequency band near antiresonant frequency fap1a of parallel-arm resonator p1a.

When configuring a band pass filter using a ladder filter structure, antiresonant frequency Fa1on of parallel-arm circuit P1 and resonant frequency frs1a of series-arm resonator s1a are brought close to each other. Accordingly, when switch SW1a is on, a frequency region near resonant frequency Fr1on at which the impedance of parallel-arm circuit P1 approaches 0 is a low-frequency stop band. If the frequency is higher than resonant frequency Fr1on, the impedance of parallel-arm circuit P1 is high at a frequency near antiresonant frequency Fa1on, and the impedance of series-arm resonator s1a approaches 0 at a frequency near resonant frequency frs. This provides a passband for signals near antiresonant frequency Fa1on and resonant frequency frs1a. Furthermore, if the frequency is increased so as to be near resonant frequency Fr2on and antiresonant frequency fas1a, the impedance of series-arm resonator s1a is increased and the impedance of parallel-arm circuit P1 approaches 0, which provides a high frequency stop band.

Specifically, when switch SW1a is on, filter 10E has first filter characteristics that a passband is determined by antiresonant frequency Fa1on and resonant frequency frs1a, the pole (attenuation pole) on the passband low-frequency side is determined by resonant frequency Fr1on, and the pole (attenuation pole) on the passband high-frequency side is determined by resonant frequency Fr2on and antiresonant frequency fas1a.

On the other hand, when switch SW1a is off, switch SW1a does not short-circuit capacitor Cp1a, and thus the impedance characteristics of parallel-arm circuit P1 are influenced by capacitor Cp1a. Specifically, in this case, combined characteristics (combined characteristics of parallel-arm circuit P1 shown by the right second graph in FIG. 19 and by the right second graph in FIG. 20) of two parallel-arm resonators (parallel-arm resonators p1b and p1a) and capacitor Cp1a connected in series to parallel-arm resonator p1a are impedance characteristics of parallel-arm circuit P1.

Specifically, when switch SW1a is off, parallel-arm circuit P1 has impedance characteristics as follows. Parallel-arm circuit P1 has two resonant frequencies Fr1off and Fr2off, and two antiresonant frequencies Fa1off and Fa2off (at this time, the following are all satisfied: Fr1off<Fa1off<Fr2off<Fa2off; Fa1off<fap1b;

frp1$a$<Frp2off; and Fa2off<fap1$a$). Specifically, impedance of parallel-arm circuit P1 has a local minimum value at a frequency higher than resonant frequency frp1$b$ of parallel-arm resonator p1$b$, and a local minimum value at a frequency higher than resonant frequency frp1$a$ of parallel-arm resonator p1$a$. Impedance of parallel-arm circuit P1 has a local maximum value at a frequency between resonant frequency frp1$b$ of parallel-arm resonator p1$b$ and resonant frequency frp1$a$ of parallel-arm resonator p1$a$, and a local maximum value at a frequency between antiresonant frequency fap1$b$ of parallel-arm resonator p1$b$ and antiresonant frequency fap1$a$ of parallel-arm resonator p1$a$.

Here, a reason for Fa1off<fap1$b$ being satisfied is that parallel-arm resonator p1$a$ connected in parallel to parallel-arm resonator p1$b$ operates as a parallel capacitor in a frequency band near antiresonant frequency fap1$b$ of parallel-arm resonator p1$b$. Further, a reason for frp1$b$<Fr1off being satisfied is that resonance of parallel-arm resonator p1$b$ and capacitor Cp1$a$ occurs in a frequency band near resonant frequency frp1$b$ of parallel-arm resonator p1$b$. Further, a reason for Fa2off<fap1$a$ being satisfied is that combined characteristics of parallel-arm resonator p1$b$ and capacitor Cp1$a$ connected in parallel to parallel-arm resonator p1$a$ function as a parallel capacitor.

Specifically, when switch SW1$a$ is off, filter 10E has second filter characteristics that a passband is determined by antiresonant frequency Fa1off and resonant frequency frs1$a$, the pole (attenuation pole) on the passband low-frequency side is determined by resonant frequency Fr1off, and the pole (attenuation pole) on the passband high-frequency side is determined by resonant frequency Fr2off and antiresonant frequency fas1$a$.

As illustrated in the second graphs in FIGS. 19 and 20, if switches SW1$a$ to SW4$a$ are switched from on to off, impedance characteristics of parallel-arm circuits P1 to P4 are changed as follows. Specifically, a higher resonant frequency of two resonant frequencies and a higher antiresonant frequency of two antiresonant frequencies of each of parallel-arm circuits P1 to P4 are both switched to higher frequencies. In this example, only parallel-arm resonator p1$a$ is connected in series to capacitor Cp1$a$ and switch SW1$a$, and thus a higher resonant frequency of two resonant frequencies is switched from Fr2on to Fr2off to be a higher frequency. Also, the lower antiresonant frequency is switched from Fa2on to Fa2off to be a higher frequency.

Here, higher antiresonant frequencies and higher resonant frequencies of parallel-arm circuits P1 to P4 determine the attenuation slope on the passband high-frequency side of filter 10E, and are all switched to higher frequencies, as described above. Accordingly, as illustrated in the first graphs in FIGS. 19 and 20, switching switch SW1$a$ from on to off switches passing characteristics of the filters according to Example 6 and Comparative Example 3 to higher-frequency passing characteristics while the attenuation slope on the passband high-frequency side maintains its steepness. In other words, the filters can switch a frequency at the passband high-frequency edge to a higher frequency while switching the frequency of the attenuation pole on the passband high-frequency side to a higher frequency and inhibiting an increase in insertion loss at the passband high-frequency edge.

Here, a comparison between Example 6 and Comparative Example 3 shows that in Example 6, the gate width of switch SW4$a$ is made greater than the gate width of switch SW1$a$, and the stack count of switch SW1$a$ is made lower than the stack count of switch SW4$a$. Furthermore, the gate widths of switches SW2$a$ and SW3$a$ are each made narrower than the gate width of switch SW4$a$, and the stack counts of switches SW2$a$ and SW3$a$ are also each made lower than the stack count of switch SW4$a$.

Specifically, the gate width and the stack count of each of switches SW1$a$ to SW3$a$ can be made narrower and lower in Example 6 than those in Comparative Example 3, and thus a total size of switches SW1$a$ to SW4$a$ can be decreased. Further, on resistance Ron of each of switches SW1$a$ to SW3$a$ having relatively narrow gate widths can be decreased by making the stack counts of switches SW1$a$ to SW3$a$ each lower than the stack count of switch SW4$a$. Accordingly, without increasing passband insertion loss (1.53 dB: see Table 21, 1.53 dB: see Table 24) when switches SW1$a$ to SW4$a$ are on (namely, when Band28-Tx is used), a total size of switches SW1$a$ to SW4$a$ can be decreased (42100 $\mu m^2$: see Table 20, 61600 $\mu m^2$: see Table 23).

As stated above, the filter according to Example 6 can yield following advantageous effects (1) to (3).

(1) By making gate width W4$a$ of switch SW4$a$ greater than gate width W1$a$ of switch SW1$a$, power durability that the filter is to have is ensured, and furthermore a reduction in size of the filter and passband insertion loss when the switches are conducting can be achieved.

(2) Switching between the conducting and non-conducting states of a switch can change the frequency of the attenuation pole on the passband high-frequency side without increasing the insertion loss at the passband high-frequency edge.

(3) In a configuration in which voltage V1$a$ across switch SW1$a$ is lower than voltage V4$a$ across switch SW4$a$, stack count Ns1 of switch SW1$a$ is made lower than stack count Ns4 of switch SW4$a$, thus securing power durability that the filter is to have, and also achieving further reduction in size of the filter and passband insertion loss when the switches are conducting.

11. Variation 5 of Embodiment 1 (Example 7)

The first parallel-arm circuit and the second parallel-arm circuit described in Variations 3 and 4 of Embodiment 1 may further include a second parallel-arm resonator and a second switch circuit connected in series to the second parallel-arm resonator. Thus, the following describes a filter according to Variation 5 of Embodiment 1 having such a configuration, in comparison with a comparative example (Comparative Example 4), using an example (Example 7).

11.1 Example 7

Figure 21:
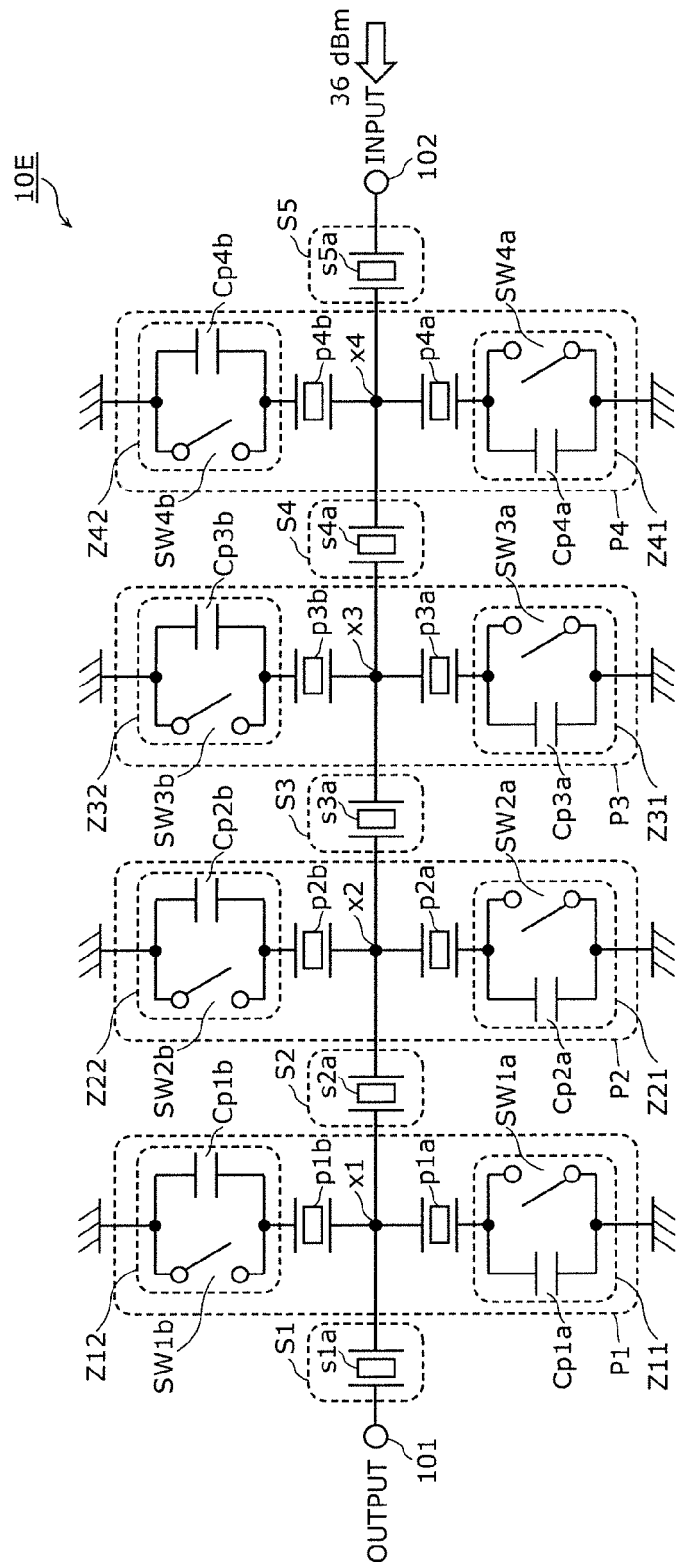
FIG. 21 illustrates a circuit configuration of a filter according to Example 7.

FIG. 21 illustrates a circuit configuration of filter 10E according to Example 7. Filter 10E illustrated in FIG. 21 is different from filter 10A according to examples (Examples 1 and 2) of Embodiment 1 and filter 10D according to Example 5 in the configuration of a parallel-arm circuit. More specifically, a single parallel-arm circuit includes two parallel-arm resonators and two switch circuits, and includes two circuits each constituted by a parallel-arm resonator and a switch circuit connected in series, and the two circuits are connected in parallel. In the following, description of the common points of filter 10E according to Example 6 to those of filters 10A and 10D is omitted, and different points are mainly described.

As illustrated in FIG. 21, filter 10E includes series-arm circuits S1, S2, S3, S4, and S5, parallel-arm circuits P1, P2, P3, and P4, output terminal 101, and input terminal 102.

Parallel-arm circuit P1 includes parallel-arm resonator p1a (second parallel-arm resonator), parallel-arm resonator p1b (fourth parallel-arm resonator), switch circuit Z11 (second switch circuit) connected in series to parallel-arm resonator p1a, and switch circuit Z12 (fourth switch circuit) connected in series to parallel-arm resonator p1b. The circuit constituted by parallel-arm resonator p1a and switch circuit Z11 connected in series, and the circuit constituted by parallel-arm resonator p1b and switch circuit Z12 connected in series are connected in parallel between node x1 and the ground.

Parallel-arm circuit P2 includes parallel-arm resonators p2a and p2b, switch circuit Z21 connected in series to parallel-arm resonator p2a, and switch circuit Z22 connected in series to parallel-arm resonator p2b. The circuit constituted by parallel-arm resonator p2a and switch circuit Z21 connected in series, and the circuit constituted by parallel-arm resonator p2b and switch circuit Z22 connected in series are connected in parallel between node x2 and the ground.

Parallel-arm circuit P3 includes parallel-arm resonators p3a and p3b, switch circuit Z31 connected in series to parallel-arm resonator p3a, and switch circuit Z32 connected in series to parallel-arm resonator p3b. The circuit constituted by parallel-arm resonator p3a and switch circuit Z31 connected in series, and the circuit constituted by parallel-arm resonator p3b and switch circuit Z32 connected in series are connected in parallel between node x3 and the ground.

Parallel-arm circuit P4 includes parallel-arm resonator p4a (first parallel-arm resonator), parallel-arm resonator p4b (third parallel-arm resonator), switch circuit Z41 (first switch circuit) connected in series to parallel-arm resonator p4a, and switch circuit Z42 (third switch circuit) connected in series to parallel-arm resonator p4b. The circuit constituted by parallel-arm resonator p4a and switch circuit Z41 connected in series, and the circuit constituted by parallel-arm resonator p4b and switch circuit Z42 connected in series are connected in parallel between node x4 and the ground.

Switch circuit Z11 is a second switch circuit that includes capacitor Cp1a (second impedance element), and switch SW1a (second switch element). Switch SW1a is connected in parallel to capacitor Cp1a. Switch circuit Z12 is a fourth switch circuit that includes capacitor Cp1b (sixth impedance element) and switch SW1b (fourth switch element). Switch SW1b is connected in parallel to capacitor Cp1b.

Switch circuit Z21 includes capacitor Cp2a and switch SW2a. Switch SW2a is connected in parallel to capacitor Cp2a. Switch circuit Z22 includes capacitor Cp2b and switch SW2b. Switch SW2b is connected in parallel to capacitor Cp2b.

Switch circuit Z31 includes capacitor Cp3a and switch SW3a. Switch SW3a is connected in parallel to capacitor Cp3a. Switch circuit Z32 includes capacitor Cp3b and switch SW3b. Switch SW3b is connected in parallel to capacitor Cp3b.

Switch circuit Z41 is a first switch circuit that includes capacitor Cp4a (first impedance element), and switch SW4a (first switch element). Switch SW4a is connected in parallel to capacitor Cp4a. Switch circuit Z42 is a third switch circuit that includes capacitor Cp4b (fifth impedance element) and switch SW4b (third switch element). Switch SW4b is connected in parallel to capacitor Cp4b.

The filter according to this example is a radio-frequency filter that switches, by switching between the conducting and non-conducting states of switches SW1a to SW4a and SW1b to SW4b, between first filter characteristics that Band28a-Tx (703 to 733 MHz) is a first passband and Band28a-Rx (758 to 788 MHz) is a first attenuation band, and second filter characteristics that Band28b-Tx (718 to 748 MHz) is a second passband and Band28b-Rx (773 to 803 MHz) is a second attenuation band. Specifically, the filter is a radio-frequency filter (tunable filter) having a frequency-tunable function of being switched between a transmission filter for Band 28a and a transmission filter for Band 28b, by switching between the conducting and non-conducting states of switches SW1a to SW4a and SW1b to SW4b. Note that when the filter has the second filter characteristics, the digital television (DTV) band (470 to 710 MHz) is furthermore a third attenuation band.

In this example, switches SW1a to SW4a and SW1b to SW4b are designed such that current withstand capability and voltage withstand capability that switches SW1a to SW4a and SW1b to SW4b are to have are ensured when high-frequency power of +36 dBm is applied through input terminal 102. Specifically, the gate widths of switches SW1a to SW4a are individually determined according to currents flowing through switches SW1a to SW4a, and the stack counts of switches SW1a to SW4a are individually determined according to the voltages applied to switches SW1a to SW4a. The gate widths of switches SW1b to SW4b are individually determined according to currents flowing through switches SW1b to SW4b, and the stack counts of switches SW1b to SW4b are individually determined according to the voltages applied to switches SW1b to SW4b.

Here, resonant frequency frp1a of parallel-arm resonator p1a is lower than resonant frequency frp1b of parallel-arm resonator p1b, and antiresonant frequency fap1a of parallel-arm resonator p1a is lower than antiresonant frequency fap1b of parallel-arm resonator p1b. Resonant frequency frp2a of parallel-arm resonator p2a is lower than resonant frequency frp2b of parallel-arm resonator p2b, and antiresonant frequency fap2a of parallel-arm resonator p2a is lower than antiresonant frequency fap2b of parallel-arm resonator p2b. Resonant frequency frp3a of parallel-arm resonator p3a is lower than resonant frequency frp3b of parallel-arm resonator p3b, and antiresonant frequency fap3a of parallel-arm resonator p3a is lower than antiresonant frequency fap3b of parallel-arm resonator p3b. Resonant frequency frp4a of parallel-arm resonator p4a is lower than resonant frequency frp4b of parallel-arm resonator p4b, and antiresonant frequency fap4a of parallel-arm resonator p4a is lower than antiresonant frequency fap4b of parallel-arm resonator p4b.

Tables 25 and 26 show design parameters of filter 10E according to Example 7. Table 27 shows allowable input currents, allowable input voltages, sizes, and a total size of the switches of filter 10E according to Example 7. Table 28 shows passband insertion losses of filter 10E according to Example 7.

Figure 22A:
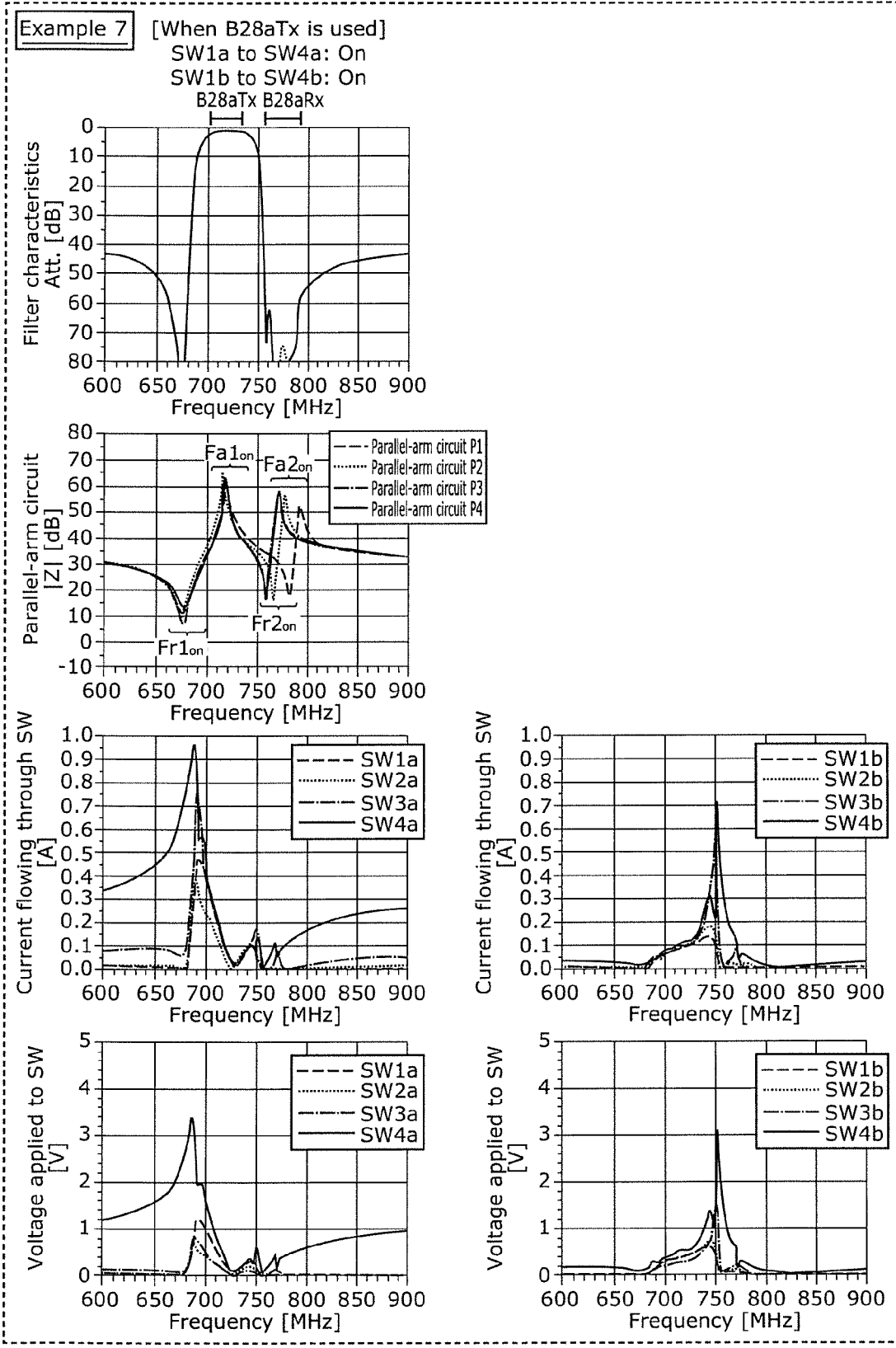
FIG. 22A illustrates graphs showing various characteristics of the filter according to Example 7 when Band28a-Tx is used.
Figure 22B:
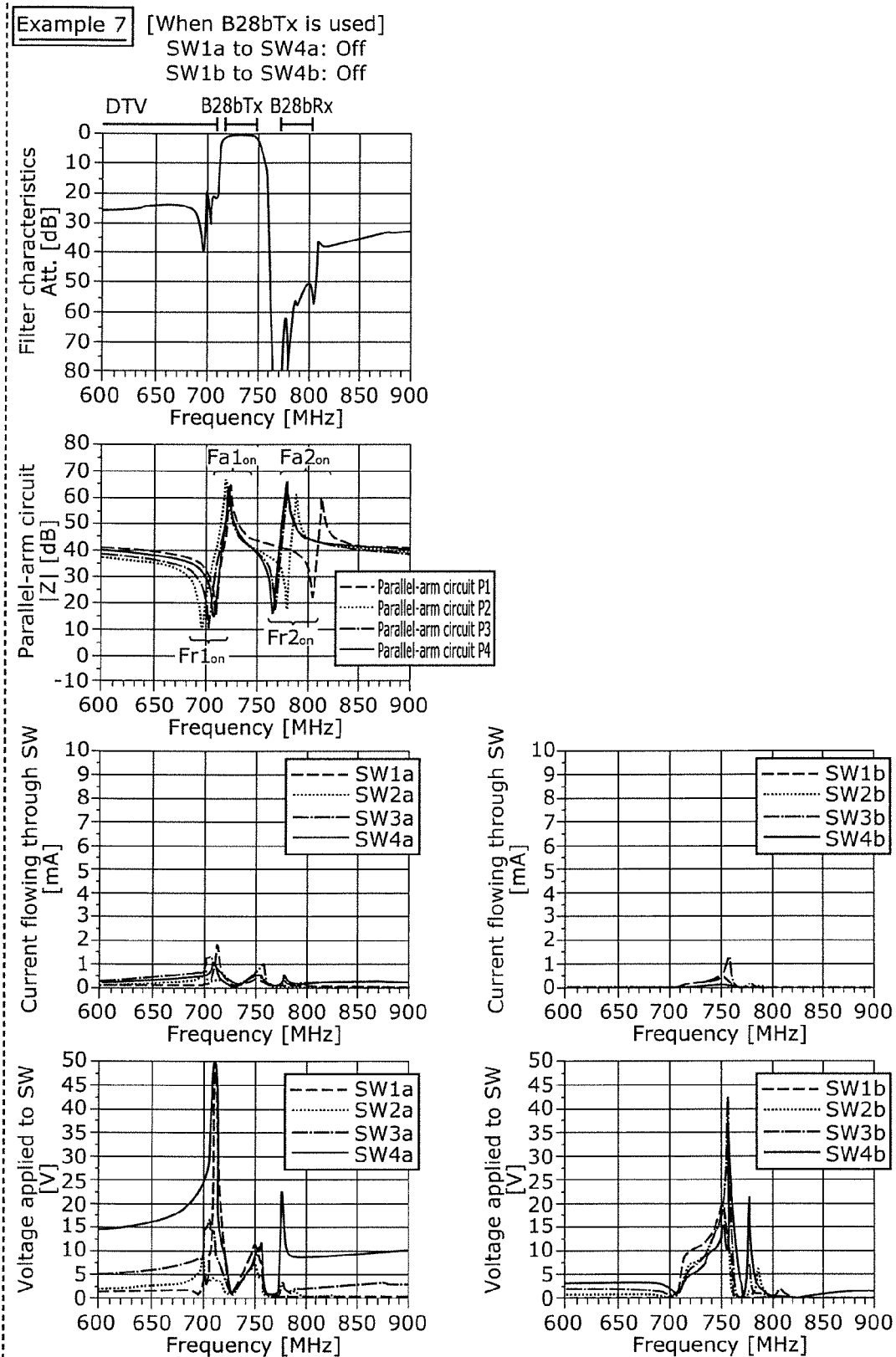
FIG. 22B illustrates graphs showing various characteristics of the filter according to Example 7 when Band28b-Tx is used.

FIGS. 22A and 22B illustrate graphs showing various characteristics of filter 10E according to Example 7. Specifically, FIG. 22A illustrates graphs showing various characteristics of the filter according to Example 7 when Band28a-Tx is used. FIG. 22B illustrates graphs showing various characteristics of filter 10E according to Example 7 when Band28b-Tx is used.

TABLE 25

| Ex. 7 | SW | Fr1 (MHz) | Fa1 (MHz) | Fr2 (MHz) | Fa2 (MHz) |
|---|---|---|---|---|---|
| P-arm ckt P1 | On | 677.5 | 719.3 | 782.3 | 793.1 |
| | Off | 710.9 | 724.9 | 805.3 | 812.7 |
| P-arm ckt P2 | On | 675.4 | 716.0 | 767.1 | 778.4 |
| | Off | 697.6 | 719.9 | 779.9 | 788.8 |
| P-arm ckt P3 | On | 678.6 | 718.5 | 759.7 | 771.8 |
| | Off | 704.0 | 722.5 | 769.2 | 780.2 |
| P-arm ckt P4 | On | 678.6 | 718.9 | 759.0 | 771.3 |
| | Off | 708.6 | 722.9 | 766.0 | 779.3 |

TABLE 26

| Ex. 7 | | $W_F$ (mm) | Ns (Ct) | SW | Is @B28aRx (mA) | Is @B28aTx (mA) | Vs @B28aRx (V) | Vs @B28aTx (V) | Is @B28bRx (mA) |
|---|---|---|---|---|---|---|---|---|---|
| P-arm ckt P1 | SW1a | 1.25 | 7 | On | 358 | 1 | 0.9 | 0 | — |
| | | | | Off | — | — | — | — | 1 |
| | SW1b | 0.80 | 7 | On | 114 | 1 | 0.41 | 0.01 | — |
| | | | | Off | — | — | — | — | 0 |
| P-arm ckt P2 | SW2a | 0.85 | 3 | On | 235 | 5 | 0.37 | 0.01 | — |
| | | | | Off | — | — | — | — | 0 |
| | SW2b | 0.85 | 7 | On | 130 | 4 | 0.48 | 0.01 | — |
| | | | | Off | — | — | — | — | 0 |
| P-arm ckt P3 | SW3a | 1.25 | 3 | On | 329 | 86 | 0.35 | 0.09 | — |
| | | | | Off | — | — | — | — | 1 |
| | SW3b | 0.90 | 5 | On | 143 | 92 | 0.36 | 0.23 | — |
| | | | | Off | — | — | — | — | 1 |
| P-arm ckt P4 | SW4a | 1.55 | 12 | On | 403 | 149 | 1.39 | 0.52 | — |
| | | | | Off | — | — | — | — | 0 |
| | SW4b | 1.15 | 11 | On | 155 | 331 | 0.69 | 1.43 | — |
| | | | | Off | — | — | — | — | 0 |

| Ex. 7 | | Is @B28bTx (mA) | Vs @B28bRx (V) | Vs @B28bTx (V) | Is_max (mA) | Vs_max (V) | Ron (Ω) |
|---|---|---|---|---|---|---|---|
| P-arm ckt P1 | SW1a | — | — | — | 358 | 17.17 | 2.34 |
| | | 0 | 17.17 | 0.06 | | | |
| | SW1b | — | — | — | 114 | 17.29 | 3.66 |
| | | 0 | 17.29 | 0.59 | | | |
| P-arm ckt P2 | SW2a | — | — | — | 235 | 5.6 | 1.48 |
| | | 0 | 5.6 | 1.96 | | | |
| | SW2b | — | — | — | 130 | 15.98 | 3.45 |
| | | 0 | 15.98 | 6.68 | | | |
| P-arm ckt P3 | SW3a | — | — | — | 329 | 6.77 | 1 |
| | | 0 | 6.77 | 3.39 | | | |
| | SW3b | — | — | — | 143 | 14.97 | 2.33 |
| | | 0 | 14.97 | 7.64 | | | |
| P-arm ckt P4 | SW4a | — | — | — | 403 | 22.95 | 3.24 |
| | | 1 | 12.13 | 22.95 | | | |
| | SW4b | — | — | — | 331 | 22.27 | 4 |
| | | 0 | 11.1 | 22.27 | | | |

TABLE 27

| Ex. 7 | | Allowable input current (mA) | Allowable input voltage (V) | Size (μm²) |
|---|---|---|---|---|
| P-arm ckt P1 | Switch SW1a | 897 | 17.5 | 8750 |
| | Switch SW1b | 254 | 17.5 | 5600 |
| P-arm ckt P2 | Switch SW2a | 270 | 7.5 | 2550 |
| | Switch SW2b | 270 | 17.5 | 5950 |
| P-arm ckt P3 | Switch SW3a | 397 | 7.5 | 3750 |
| | Switch SW3b | 286 | 12.5 | 4500 |
| P-arm ckt P4 | Switch SW4a | 493 | 30.0 | 18600 |
| | Switch SW4b | 366 | 27.5 | 12650 |
| Total | | 3233 | 137.5 | 62350 |

TABLE 28

| Ex. 7 | SW1a to SW4a SW1b to SW4b | IL @ B28aTx | IL @ B28bTx |
|---|---|---|---|
| Filter charcs. | On | 1.89 | — |
| | Off | — | 1.51 |

11.2 Comparative Example 4

The filter according to Comparative Example 4 has the same configuration as that of the filter according to Example 7, except that design parameters are different. Specifically, in Comparative Example 4, similarly to Comparative Examples 1 to 3, switches SW1a to SW4a have the same gate width determined according to the greatest current of the currents that flow through switches SW1a to SW4a. Switches SW1a to SW4a have the same stack count determined according to the highest voltage of the voltages applied to switches SW1a to SW4a. Furthermore, in Comparative Example 4, switches SW1b to SW4b have the same gate width determined according to the greatest current of the currents that flow through switches SW1b to SW4b. Furthermore, in Comparative Example 4, switches SW1b to SW4b have the same stack count determined according to the highest voltage of the voltages applied to switches SW1b to SW4b.

Tables 29 and 30 show design parameters of the filter according to Comparative Example 4. Table 31 shows allowable input currents, allowable input voltages, sizes, and a total size of the switches of the filter according to Comparative Example 4. Table 32 shows passband insertion losses of the filter according to Comparative Example 4.

Figure 23A:
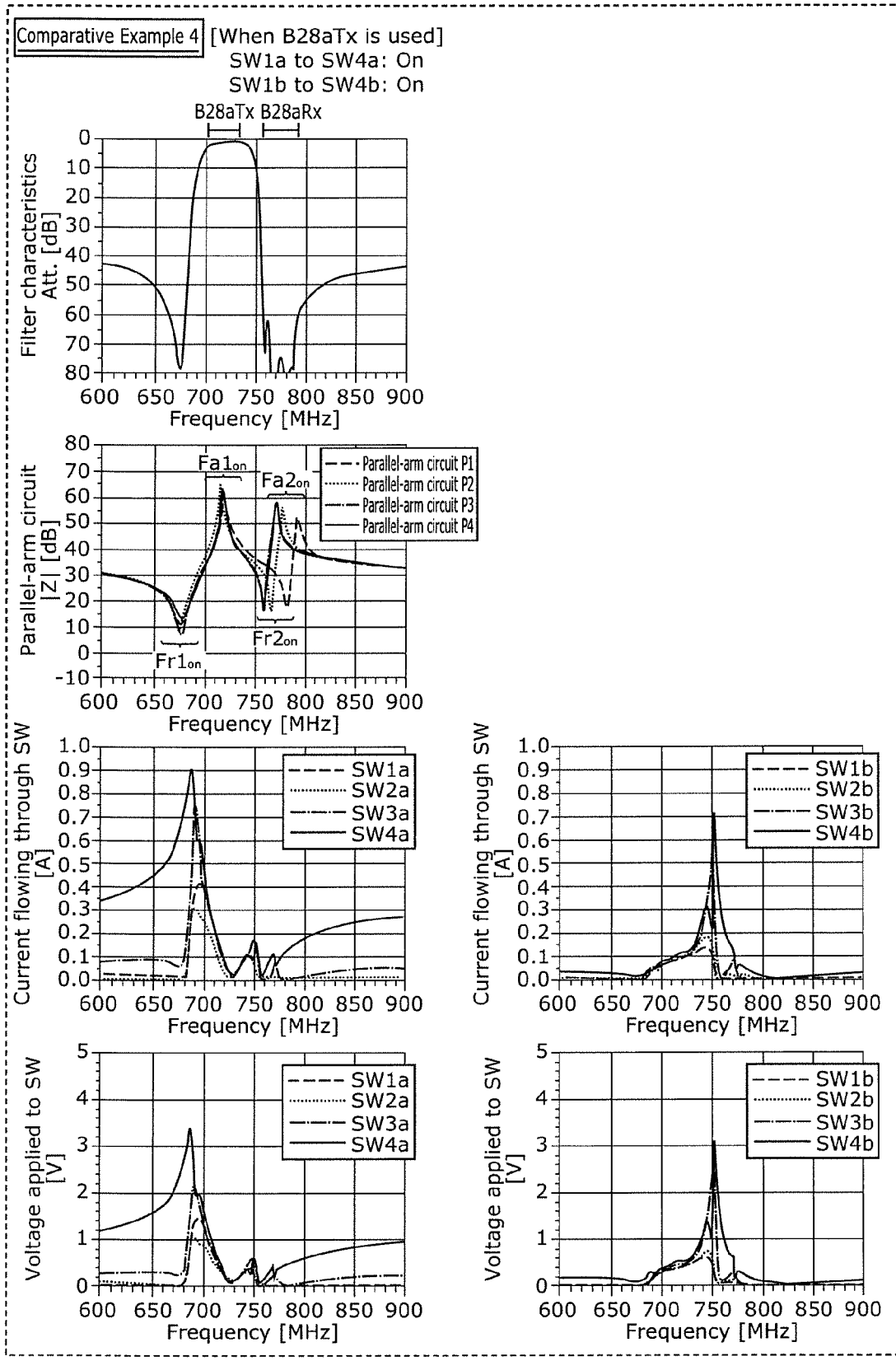
FIG. 23A illustrates graphs showing various characteristics of a filter according to Comparative Example 4 when Band28a-Tx is used.
Figure 23B:
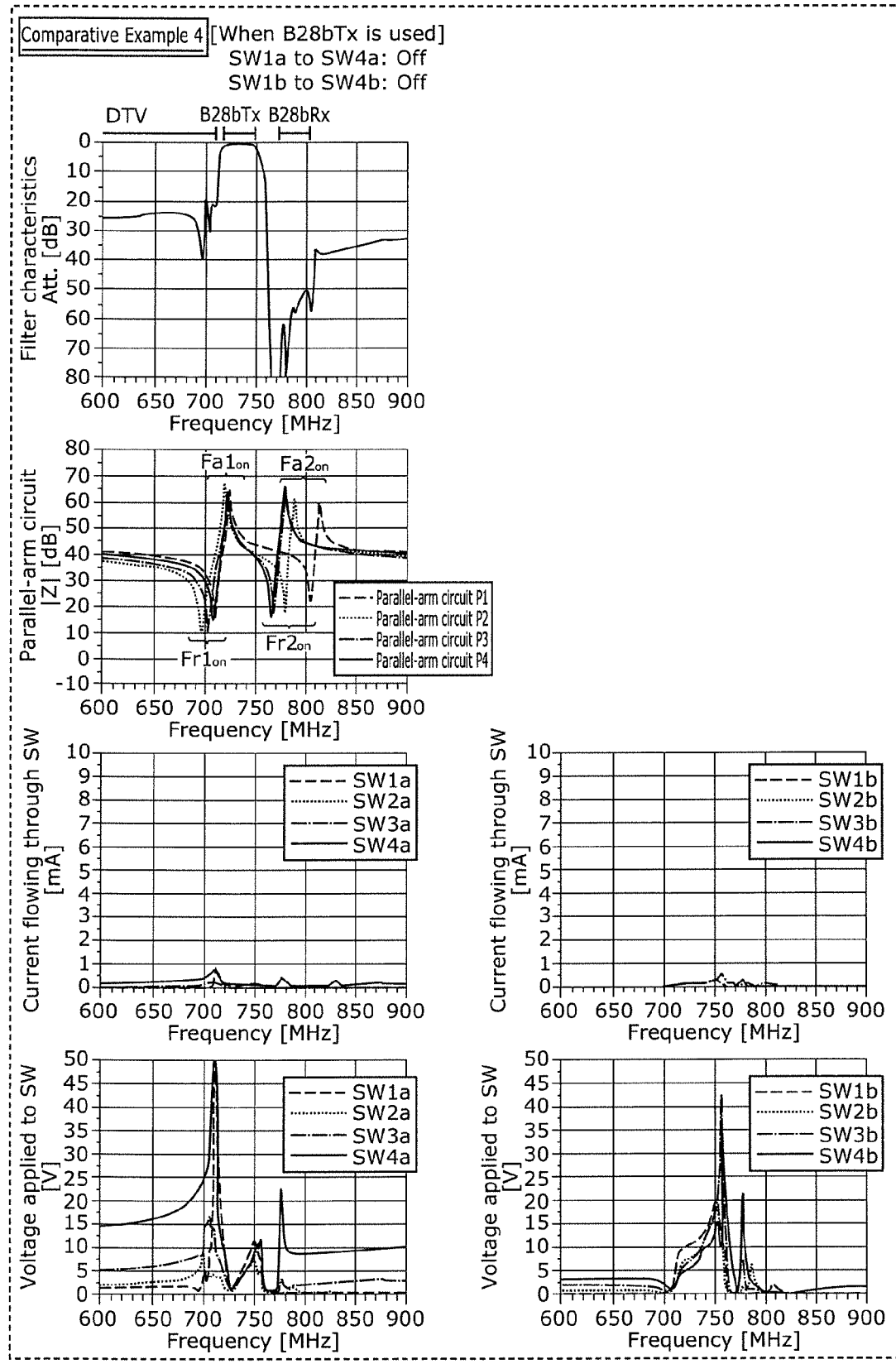
FIG. 23B illustrates graphs showing various characteristics of the filter according to Comparative Example 4 when Band28b-Tx is used.

FIGS. 23A and 23B illustrate graphs showing various characteristics of the filter according to Comparative Example 4. Specifically, FIG. 22A illustrates graphs showing various characteristics of the filter according to Example 7 when Band28a-Tx is used. FIG. 22B illustrates graphs showing various characteristics of the filter according to Example 7 when Band28b-Tx is used.

TABLE 29

| Comp. Ex. 4 | SW | Fr1 (MHz) | Fa1 (MHz) | Fr2 (MHz) | Fa2 (MHz) |
| --- | --- | --- | --- | --- | --- |
| P-arm ckt P1 | On | 677.4 | 719.4 | 782.3 | 793.1 |
|  | Off | 710.9 | 724.9 | 805.3 | 812.8 |
| P-arm ckt P2 | On | 675.0 | 715.9 | 778.4 | 767.1 |
|  | Off | 697.6 | 719.9 | 779.9 | 788.8 |
| P-arm ckt P3 | On | 678.1 | 718.4 | 771.7 | 759.7 |
|  | Off | 704.1 | 722.5 | 769.2 | 780.3 |
| P-arm ckt P4 | On | 678.3 | 718.9 | 771.3 | 759.0 |
|  | Off | 708.6 | 722.9 | 766.0 | 779.3 |

TABLE 30

| Comp. Ex. 4 | | $W_F$ (mm) | Ns (Ct) | SW | Is @B28aRx (mA) | Is @B28aTx (mA) | Vs @B28aRx (V) | Vs @B28aTx (V) | Is @B28bRx (mA) |
| --- | --- | --- | --- | --- | --- | --- | --- | --- | --- |
| P-arm ckt P1 | SW1a | 1.55 | 12 | On | 343 | 1 | 1.19 | 0 | — |
|  |  |  |  | Off | — | — | — | — | 0 |
|  | SW1b | 1.15 | 11 | On | 114 | 1 | 0.49 | 0.01 | — |
|  |  |  |  | Off | — | — | — | — | 0 |
| P-arm ckt P2 | SW2a | 1.55 | 12 | On | 230 | 5 | 0.8 | 0.02 | — |
|  |  |  |  | Off | — | — | — | — | 0 |
|  | SW2b | 1.15 | 11 | On | 130 | 3 | 0.56 | 0.02 | — |
|  |  |  |  | Off | — | — | — | — | 0 |
| P-arm ckt P3 | SW3a | 1.55 | 12 | On | 324 | 80 | 1.12 | 0.28 | — |
|  |  |  |  | Off | — | — | — | — | 0 |
|  | SW3b | 1.15 | 11 | On | 144 | 85 | 0.62 | 0.37 | — |
|  |  |  |  | Off | — | — | — | — | 0 |
| P-arm ckt P4 | SW4a | 1.55 | 12 | On | 409 | 149 | 1.41 | 0.52 | — |
|  |  |  |  | Off | — | — | — | — | 0 |
|  | SW4b | 1.15 | 11 | On | 155 | 330 | 0.66 | 1.43 | — |
|  |  |  |  | Off | — | — | — | — | 0 |

| Comp. Ex. 4 | | Is @B28bTx (mA) | Vs @B28bRx (V) | Vs @B28bTx (V) | Is_max (mA) | Vs_max (V) | Ron (Ω) |
| --- | --- | --- | --- | --- | --- | --- | --- |
| P-arm ckt P1 | SW1a | — | — | — | 343 | 17.22 | 3.24 |
|  |  | 0 | 17.22 | 0.06 |  |  |  |
|  | SW1b | — | — | — | 114 | 17.31 | 4.00 |
|  |  | 0 | 17.31 | 0.59 |  |  |  |
| P-arm ckt P2 | SW2a | — | — | — | 230 | 6.75 | 3.24 |
|  |  | 0 | 5.62 | 1.98 |  |  |  |
|  | SW2b | — | — | — | 130 | 15.99 | 4.00 |
|  |  | 0 | 15.99 | 6.68 |  |  |  |
| P-arm ckt P3 | SW3a | — | — | — | 324 | 7.61 | 3.24 |
|  |  | 0 | 6.8 | 3.37 |  |  |  |
|  | SW3b | — | — | — | 144 | 14.98 | 4.00 |
|  |  | 0 | 14.98 | 7.61 |  |  |  |
| P-arm ckt P4 | SW4a | — | — | — | 409 | 22.29 | 3.24 |
|  |  | 0 | 12.13 | 22.98 |  |  |  |
|  | SW4b | — | — | — | 330 | 11.10 | 4.00 |
|  |  | 0 | 11.1 | 22.29 |  |  |  |

TABLE 31

| Comp. Ex. 4 | | Allowable input current (mA) | Allowable input voltage (V) | Size ($\mu m^2$) |
|---|---|---|---|---|
| P-arm ckt P1 | Switch SW1a | 493 | 30 | 18600 |
| | Switch SW1b | 366 | 27.5 | 12650 |
| P-arm ckt P2 | Switch SW2a | 493 | 30 | 18600 |
| | Switch SW2b | 366 | 27.5 | 12650 |
| P-arm ckt P3 | Switch SW3a | 493 | 30 | 18600 |
| | Switch SW3b | 366 | 27.5 | 12650 |
| P-arm ckt P4 | Switch SW4a | 493 | 30 | 18600 |
| | Switch SW4b | 366 | 27.5 | 12650 |
| Total | | 3436 | 230 | 125000 |

TABLE 32

| Comp. Ex. 4 | SW1a to SW4a | SW1b to SW4b | IL @ B28aTx | IL @ B28bTx |
|---|---|---|---|---|
| Filter charcs. | On | | 2.21 | — |
| | Off | | — | 1.51 |

11.3 Comparison Between Example 7 and Comparative Example 4

As illustrated in FIGS. 22A to 23B and Tables 25 and 29, resonance characteristics (resonant frequencies and antiresonant frequencies) of parallel-arm circuits P1 to P4 in the filters according to Example 7 and Comparative Example 4 are substantially the same. As illustrated in the first graphs in FIGS. 22A and 23A, these filters have first filter characteristics that Band28a-Tx is a first passband, and Band28a-Rx is a first attenuation band, when switches SW1a to SW4a are on and switches SW1b to SW4b are on. As illustrated in the first graphs in FIGS. 22B and 23B, when switches SW1a to SW4a are off and switches SW1b to SW4b are off, the filters have second filter characteristics that Band28b-Tx is a second passband, and Band28b-Rx and the DTV band (470 to 710 MHz) are second attenuation bands. Specifically, the filters are radio-frequency filters (tunable filters) having a frequency-tunable function of switching a passband between Band28a-Tx and Band28b-Tx, by switching between on and off of switches SW1a to SW4a.

Here, impedance characteristics of parallel-arm circuits P1 to P4 are to be described using the second graphs in FIGS. 22A to 23B.

As illustrated in the second graphs in FIGS. 22A to 23B, if switches SW1a to SW4a are switched from on to off, impedance characteristics of parallel-arm circuits P1 to P4 are changed as follows. Specifically, a lower resonant frequency of two resonant frequencies and a lower antiresonant frequency of two antiresonant frequencies of each of parallel-arm circuits P1 to P4 are both switched to higher frequencies. In this example, only parallel-arm resonator p1a is connected in series to capacitor Cp1a and switch SW1a, and thus the lower resonant frequency of two resonant frequencies is switched from Fr1on to Fr1off to be a higher frequency. The lower antiresonant frequency is switched from Fa1on to Fa1off to be a higher frequency.

Here, lower antiresonant frequencies and lower resonant frequencies of parallel-arm circuits P1 to P4 determine the attenuation slope on the passband low-frequency side of filter 10E, and are all switched to higher frequencies, as described above. Accordingly, as illustrated in the top graph in FIG. 23B, switching switch SW1a from on to off switches passing characteristics of filter 10E to higher-frequency characteristics while the attenuation slope on the passband low-frequency side maintains its steepness. In other words, filter 10E can switch a frequency at the passband low-frequency edge to a higher frequency while switching the frequency of the attenuation pole on the passband low-frequency side to a higher frequency and inhibiting an increase in the insertion loss at the passband low-frequency edge.

As illustrated in the second graphs in FIGS. 22A to 23B, if switches SW1b to SW4b are switched from on to off, impedance characteristics of parallel-arm circuits P1 to P4 are changed as follows. Specifically, a higher resonant frequency of two resonant frequencies and a higher antiresonant frequency of two antiresonant frequencies of each of parallel-arm circuits P1 to P4 are both switched to higher frequencies. In this example, only parallel-arm resonator p1b is connected in series to capacitor Cp1b and switch SW1b, and thus the higher resonant frequency of two resonant frequencies is switched from Fr2on to Fr2off to be a higher frequency. Also, the lower antiresonant frequency is switched from Fa2on to Fa2off to be a higher frequency.

Here, higher antiresonant frequencies and higher resonant frequencies of parallel-arm circuits P1 to P4 determine the attenuation slope on the passband high-frequency side of filter 10E, and are all switched to higher frequencies, as described above. Accordingly, as illustrated in the top graph in FIG. 23B, switching switch SW1b from on to off switches passing characteristics of filter 10E to higher-frequency passing characteristics while the attenuation slope on the passband high-frequency side maintains its steepness. In other words, filter 10E can switch a frequency at the passband high-frequency edge to a higher frequency while switching the attenuation pole on a passband high-frequency side to an attenuation pole at a higher frequency and inhibiting an increase in the insertion loss at the passband high-frequency edge.

Thus, with regard to passing characteristics of filter 10E, switching switches SW1a to SW4a from on to off and switching switches SW1b to SW4b from on to off switch the passband to a higher-frequency passband while the attenuation slopes on the passband low-frequency side and the passband high-frequency side maintain their steepness. In other words, in filter 10E, switching the switches from on to off can switch the passband to a higher-frequency passband while switching the frequency of the attenuation pole on the passband low-frequency side to a higher frequency, switching the frequency of the attenuation pole on the passband high-frequency side to a higher frequency, and inhibiting an increase in insertion loss at the passband low-frequency edge. On the other hand, switching the switches from off to on can switch the passband to a lower-frequency passband while switching the frequency of the attenuation pole on the passband low-frequency side to a lower frequency, switching the frequency of the attenuation pole on the passband high-frequency side to a lower frequency, and inhibiting an increase in the insertion loss at the passband high-frequency edge.

Here, a comparison between Example 7 and Comparative Example 4 shows that in Example 7, the gate width of switch SW4a is made greater than the gate width of switch SW1a, and the stack count of switch SW1a is made lower than the stack count of switch SW4a. Furthermore, the gate width of each of switches SW2a and SW3a is also made narrower than the gate width of switch SW4a, and the stack count of each of switches SW2a and SW3a is also made lower than the stack count of switch SW4a. Furthermore, the gate width of switch SW4b is made greater than the gate width of switch SW1b, and the stack count of switch SW4b is made higher than the stack count of switch SW1b.

Specifically, the gate width and the stack count of each of switches SW1a to SW3a can be made narrower and lower in Example 7 than those in Comparative Example 4, and thus a total size of switches SW1a to SW4a can be decreased. Further, on resistance Ron of switches SW1a to SW3a having relatively narrow gate widths can be decreased by making the stack counts of switches SW1a to SW3a each lower than the stack count of switch SW4a.

The gate width and the stack count of each of switches SW1b to SW3b can be made narrower and lower in Example 7 than those in Comparative Example 4, and thus a total size of switches SW1b to SW4b can be decreased. Further, on resistance Ron of switches SW1b to SW3b having relatively narrow gate widths can be decreased by making the stack counts of switches SW1b to SW3b each lower than the stack count of switch SW4b.

Thus, while reducing passband insertion loss when switches SW1a to SW4a are on and switches SW1b to SW4b are on (namely, when Band28-Tx is used) (1.89 dB: see Table 28, 2.21 dB: see Table 32), a total size of switches SW1a to SW4a and SW1b to SW4b can be decreased (62350 μm²: see Table 27, 125000 μm²: see Table 31).

As stated above, filter 10E according to Example 7 can yield following advantageous effects (1) to (3).

(1) By making gate width W4a of switch SW4a greater than gate width W1a of switch SW1a, and making gate width W4b of switch SW4b greater than gate width W1b of switch SW1b, power durability that filter 10E is to have can be secured, and also reduction in size of the filter and passband insertion loss when the switches are conducting can be achieved.

(2) Switching between the conducting and non-conducting states of switches can change the frequency of the attenuation pole on the passband low-frequency side and the frequency of the attenuation pole on the passband high-frequency side, without increasing insertion losses at the passband edges.

(3) In a configuration in which voltage V1a across switch SW1a is lower than voltage V4a across switch SW4a, and voltage V1b across switch SW1b is lower than voltage V4b across switch SW4b, power durability that filter 10E is to have can be ensured, and also further reduction in size of the filter and passband insertion loss when the switches are conducting can be achieved by making stack count Ns1a of switch SW1a lower than stack count Ns4a of switch SW4a, and making stack count Ns1b of switch SW1b than stack count Ns4b of switch SW4b.

Thus, according to filter 10E according to this example, when high-frequency power is applied through input terminal 102, greater current flows though a switch of a parallel-arm circuit connected closer to input terminal 102 when the switch is conducting. Then, the gate width of each of one or more transistors included in switch SW4b is greater than the gate width of each of one or more transistors included in switch SW1b, and thus the same description of switches SW4a and SW1a as above also applies to switches SW4b and SW1b. Accordingly, the current withstand capability that achieves power durability that filter 10E is to have can be ensured for switches SW4b and SW1b, while a total size thereof is decreased. The passband insertion loss of filter 10E can be reduced when switch SW4b is conducting. Specifically, without increasing insertion loss at a passband edge, power durability can be ensured for a frequency-tunable radio-frequency filter while achieving reduction in size and passband insertion loss of the filter.

Resistance of switch SW1b having a relatively narrow gate width when switch SW1b is conducting can be decreased by making the stack count of switch SW1b lower than the stack count of switch SW4b. Accordingly, passband insertion loss of filter 10E when switch SW1b is conducting can be reduced, and at the same time, reduction in size of filter 10E can be achieved.

Embodiment 2

The filters described above in Embodiment 1 and examples thereof (Examples 1 and 2), and variations of Embodiment 1 and examples thereof (examples 3 to 7) are applicable to a multiplexer for a system that uses a large number of bands.

12. Basic Configuration of Multiplexer

Figure 24:
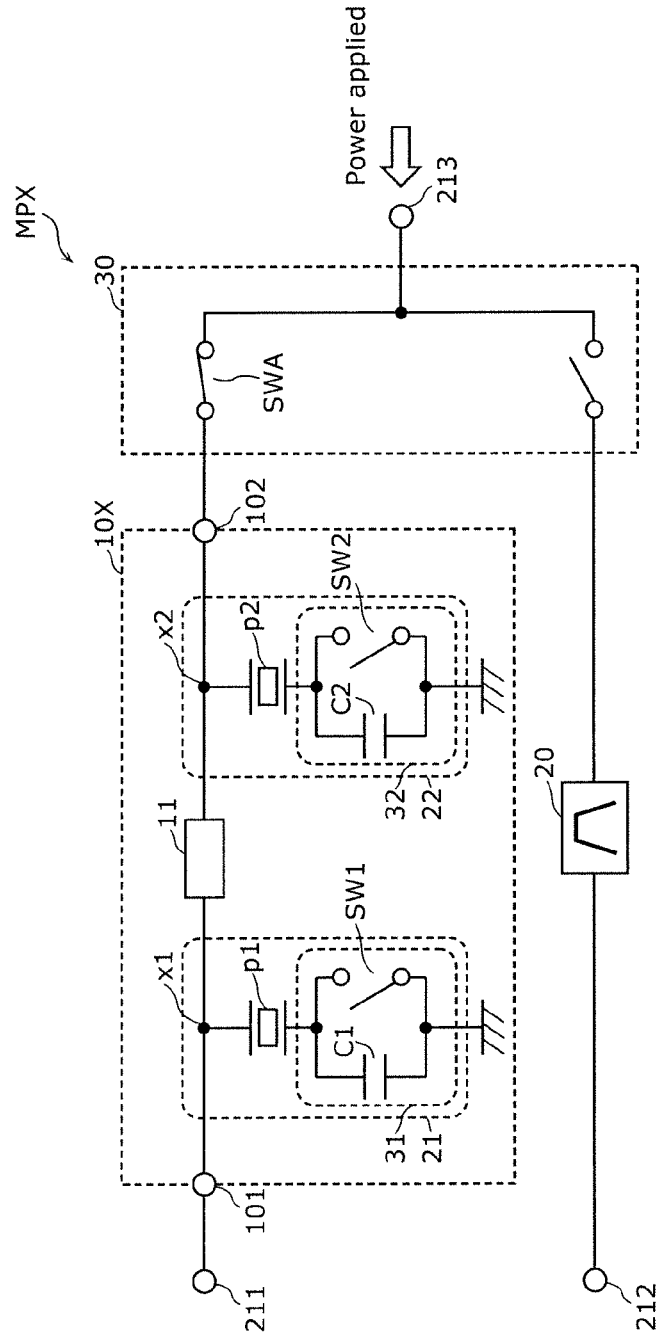
FIG. 24 illustrates a circuit configuration of a multiplexer according to Embodiment 2.

FIG. 24 illustrates a circuit configuration of multiplexer MPX according to the present embodiment.

As illustrated in the FIG. 24, multiplexer MPX is a transmission multiplexer that includes a plurality of filters (here, a total of two filters, namely filter 10X according to Embodiment 1 and filter 20), change circuit 30, a plurality of individual terminals (here, two individual terminals 211 and 212), and common terminal 213, and a high-frequency signal is input through common terminal 213. Multiplexer MPX causes a high-frequency signal input through common terminal 213 to pass through one of the plurality of filters by making switching in change circuit 30 according to a control signal from a controller (not illustrated).

Note that the configuration of multiplexer MPX is not limited to this. For example, multiplexer MPX may include three or more filters. Multiplexer MPX may be not only a transmission multiplexer, but also a receiving multiplexer, or may be, for instance, a duplexer that includes a transmission filter and a receiving filter. Change circuit 30 may be disposed on the output terminal 101 side, or may be disposed on both the output terminal 101 side and the input terminal 102 side.

Input terminals or output terminals of the filters are directly or indirectly connected to common terminal 213, and are indirectly connected to common terminal 213 through change circuit 30 in the present embodiment. Specifically, filter 10X includes input terminal 102 indirectly connected to common terminal 213, and output terminal 101 directly connected to individual terminal 211. Similarly, filter 20 includes an input terminal indirectly connected to common terminal 213, and an output terminal directly connected to individual terminal 212.

Change circuit 30 switches a filter connected to common terminal 213 from one filter to another filter out of the plurality of filters (here, a total of two filters, namely filters 10X and 20). For example, change circuit 30 is a single pole n throw (SPnT) switch disposed downstream from a transmission power amplifier, and switches between the plurality of filters.

Change circuit 30 includes switch SWA that is a sixth switch element that switches between a conducting state in which one of input terminal 102 and output terminal 101 of filter 10X is connected to common terminal 213 and a non-conducting state in which the one of input terminal 102 and output terminal 101 of filter 10X is disconnected from common terminal 213.

Switch SWA includes one or more transistors, similarly to switches SW1 and SW2 of filter 10X, and includes a plurality of transistors in the present embodiment. Such a switch for which semiconductors are used is small, and thus change circuit 30 can be miniaturized, so that entire multiplexer MPX can be miniaturized.

In such multiplexer MPX, the current withstand capability of each switch is to be ensured in order to achieve power durability that multiplexer MPX is to have. In this regard, switch SWA is provided in series on a main path for an input high-frequency signal, and thus is to have higher current withstand capability than that of switches SW1 and SW2 of parallel-arm circuits 21 and 22 disposed on a path that connects the main path and the ground. In particular, in the present embodiment, when change circuit 30 is disposed on the input terminal 102 side of filter 10X, total current corresponding to high-frequency power applied through common terminal 213 flows through switch SWA, and on the other hand, current divided by parallel-arm circuit 22 and series-arm circuit 11 flows through switch SW2, and further divided current flows through switch SW1. Accordingly, in the present embodiment, switch SWA is to have higher current withstand capability.

In the present embodiment, the gate width of switch SWA (sixth switch element) is greater than the gate width of switch SW2 (first switch element) of filter 10X. Accordingly, multiplexer MPX according to the present embodiment can ensure power durability, while achieving reduction in size and passband insertion loss. The following describes in detail reasons why such advantageous effects are yielded.

13. Influence of Gate Width on Filter Characteristics

To explain the reasons why such above advantageous effects are yielded, in a ladder filter that includes series-arm resonator s1 and parallel-arm resonator p1, the influence on filter characteristics exerted when resistor Rs is connected in series to series-arm resonator s11 and when resistor Rp is connected in series to parallel-arm resonator p11 is to be described.

Figure 25A:
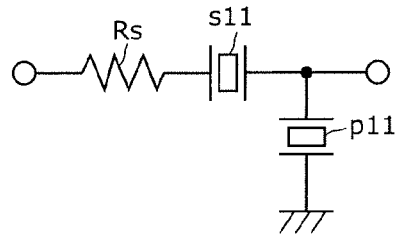
FIG. 25A illustrates a circuit configuration when a resistor is connected in series to a series-arm resonator in a ladder filter.
Figure 25B:
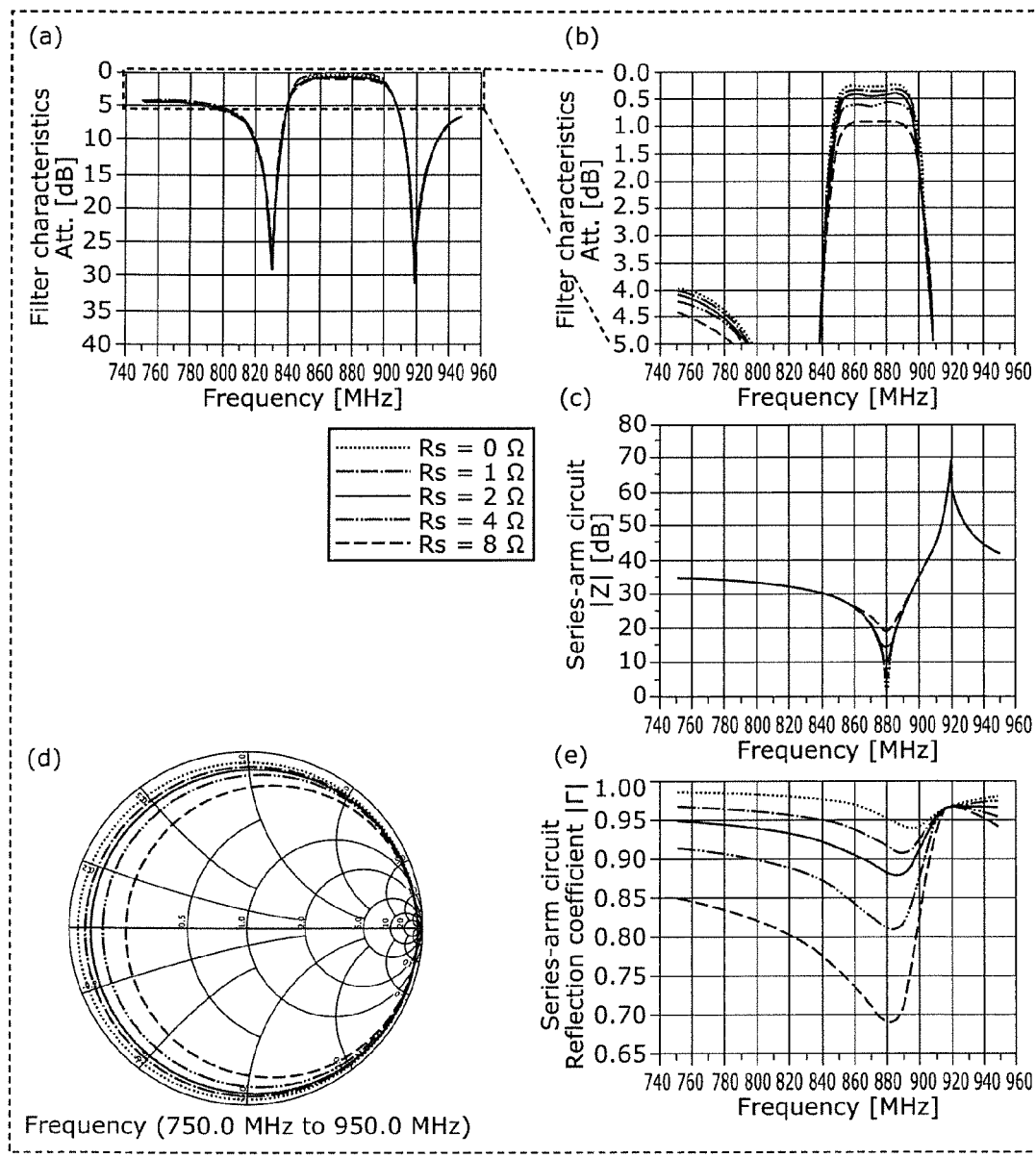
FIG. 25B illustrates graphs showing influence on filter characteristics in the circuit configuration illustrated in FIG. 25A when the resistance of the resistor is changed.

FIG. 25A illustrates a circuit configuration when resistor Rs is connected in series to series-arm resonator s11 in the above ladder filter. FIG. 25B illustrates graphs showing the influence on filter characteristics in the circuit configuration illustrated in FIG. 25A, when the resistance of resistor Rs is changed in a range from 0 to 8Ω. Specifically, in FIG. 25B, (a) is a graph showing filter characteristics, (b) is a graph showing an enlarged portion of (a), (c) is a graph showing impedance characteristics of a series-arm circuit, (d) is a Smith chart showing the impedance characteristics, and (e) is a graph showing a reflection coefficient (hereinafter, may be denoted by |Γ|) of the series-arm circuit. Here, the series-arm circuit is a circuit constituted by series-arm resonator s11 and resistor Rs connected in series.

Figure 26A:
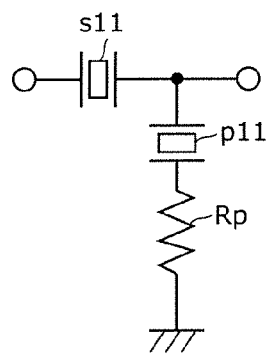
FIG. 26A illustrates a circuit configuration when a resistor is connected in series to a parallel-arm resonator in a ladder filter.
Figure 26B:
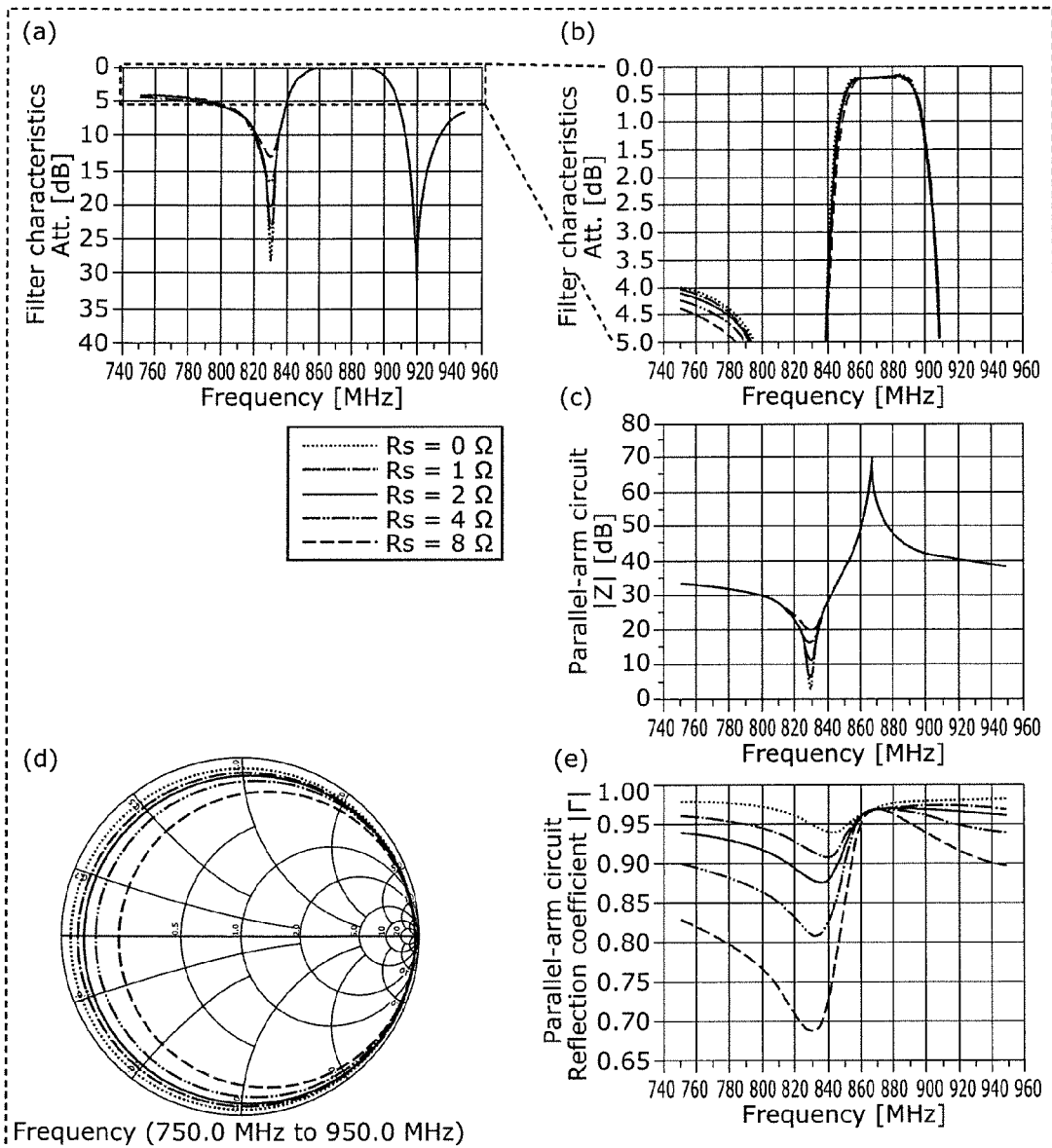
FIG. 26B illustrates graphs showing influence on filter characteristics in the circuit configuration illustrated in FIG. 26A when the resistance of the resistor is changed.

FIG. 26A illustrates a circuit configuration when resistor Rp is connected in series to parallel-arm resonator p11 in the above ladder filter. FIG. 26B illustrates graphs showing the influence on filter characteristics in the circuit configuration illustrated in FIG. 26A, when the resistance of resistor Rs is changed in a range from 0 to 8Ω. Specifically, in FIG. 26B, (a) is a graph showing filter characteristics, (b) is a graph showing an enlarged portion of (a), (c) is a graph showing impedance characteristics of a parallel-arm circuit, (d) is a Smith chart showing the impedance characteristics, and (e) is a graph showing a reflection coefficient of the parallel-arm circuit. Here, the parallel-arm circuit is a circuit constituted by parallel-arm resonator p11 and resistor Rp connected in series.

As is clear from a comparison between (b) of FIG. 25B and (b) of FIG. 26B, the influence on passband insertion loss is higher when resistor Rs is included in the series-arm circuit than when resistor Rp is included in the parallel-arm circuit.

Specifically, as is clear from (d) and (e) of FIG. 25B and (d) and (e) of FIG. 26B, in both the series-arm circuit and the parallel-arm circuit, the resistor connected in series to a resonator does not decrease |Γ| at a frequency near the antiresonant frequency, but decreases |Γ| in the other frequency band. Accordingly, resistor Rs connected in series to series-arm resonator s11 increases insertion loss in the entire passband, whereas resistor Rp connected in series to parallel-arm resonator p11 hardly influences insertion loss in the center of the passband and increases insertion loss at the passband edge. Accordingly, from the viewpoint of reducing insertion loss, the resistance of resistor Rs connected in series to a parallel-arm resonator is to be made lower than the resistance of resistor Rp connected in series to a series-arm resonator in the multiplexer that includes a ladder filter.

Here, in multiplexer MPX according to the present embodiment, the gate width of switch SW2 connected in series to parallel-arm resonator p2 is greater than the gate width of switch SW2 connected in series to parallel-arm resonator p2. Accordingly, the on resistance of switch SWA can be made lower than the on resistance of switch SW2, and thus power durability can be ensured while achieving reduction in size and passband insertion loss of multiplexer MPX.

14. Example of Multiplexer (Example 8)

Next, multiplexer MPX according to the present embodiment is to be described in more detail using Example 8.

Figure 27:
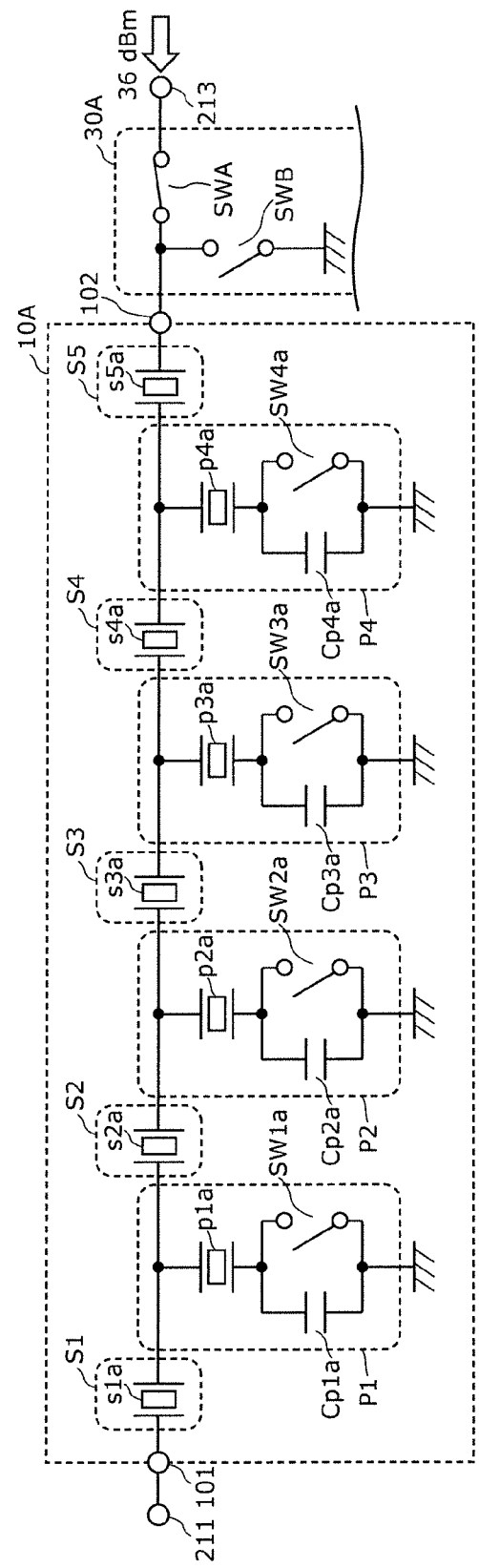
FIG. 27 illustrates a circuit configuration of a portion of a multiplexer according to Example 8.

FIG. 27 illustrates a circuit configuration of a portion of a multiplexer according to Example 8. Specifically, FIG. 27 illustrates filter 10A that is Example 2 of filter 10, and a partial configuration relevant to filter 10A of change circuit 30A that is an example of change circuit 30. In the following, a description of common points of change circuit 30A to those of change circuit 30 described above is omitted, and different points are mainly described. Note that filter 10A according to Example 2 is as described above, and thus a description thereof is omitted.

In comparison with change circuit 30, change circuit 30A further includes switch SWB that is a seventh switch element that switches between a conducting state in which input terminal 102 of filter 10A that is an example of a first filter is connected to the ground and a non-conducting state in which input terminal 102 is disconnected from the ground, as illustrated in FIG. 27. Switch SWB includes one or more transistors, similarly to switch SWA, and includes a plurality of transistors in the present embodiment.

Figure 28A:
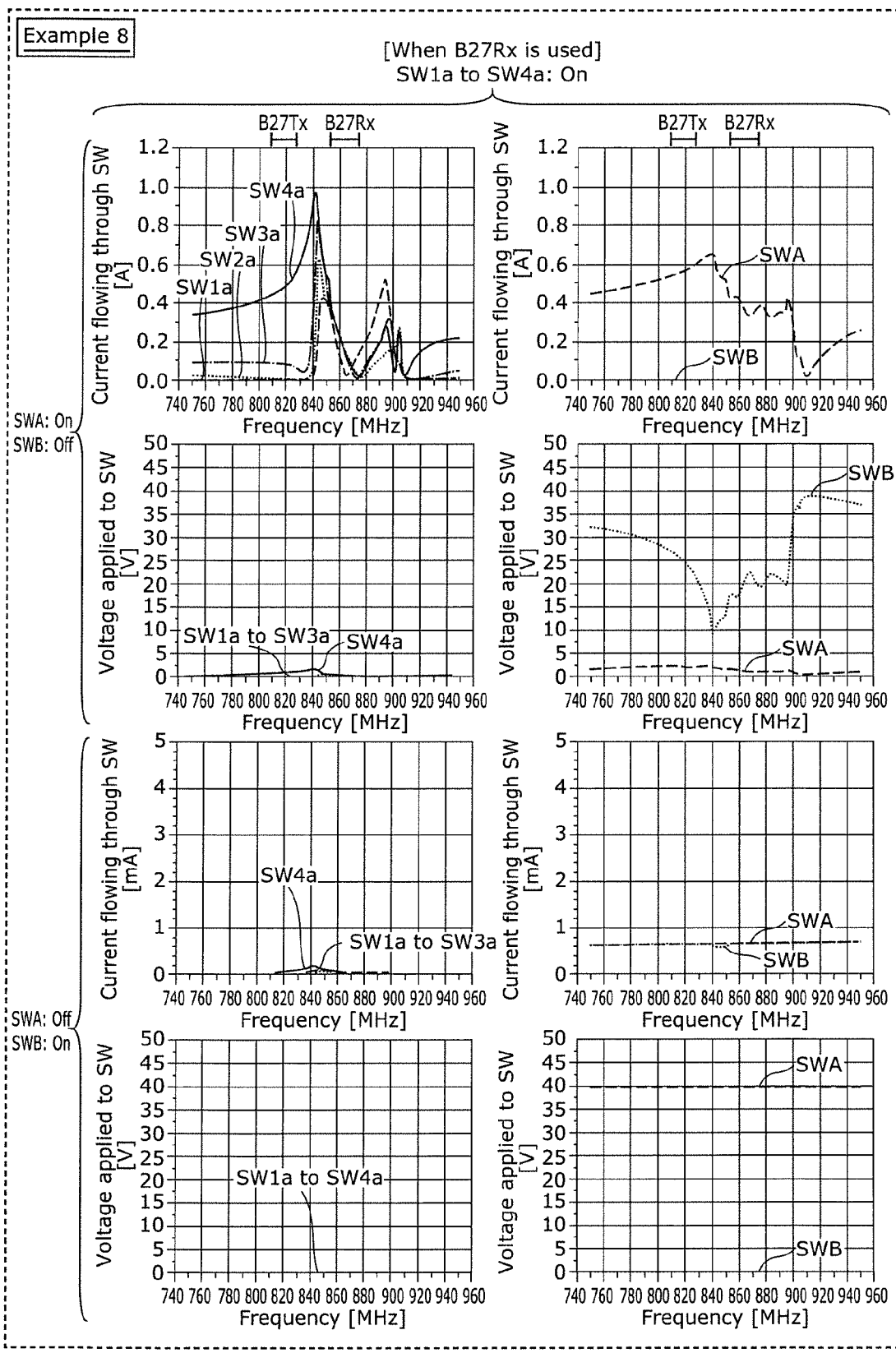
FIG. 28A illustrates graphs showing various characteristics of the multiplexer according to Example 8 when Band27-Rx is used.
Figure 28B:
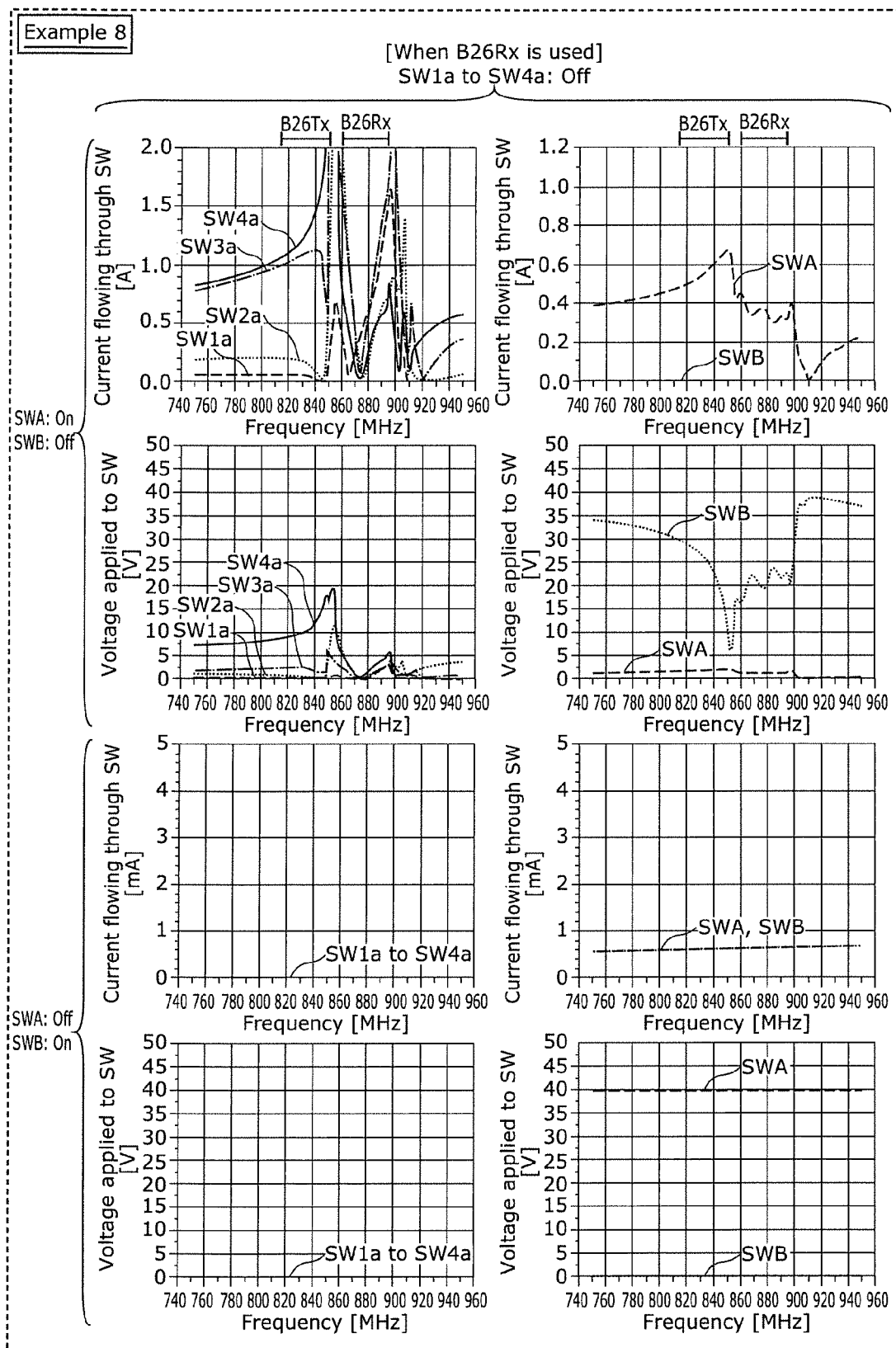
FIG. 28B illustrates graphs showing various characteristics of the multiplexer according to Example 8 when Band26-Rx is used.

FIG. 28A illustrates graphs showing various characteristics of the multiplexer according to Example 8 in the case where on and off of switches in filter 10A are switched when Band 27 is used. FIG. 28B illustrates graphs showing various characteristics of the multiplexer according to Example 8 in the case where on and off of switches in filter 10A are switched when Band 26 is used. In FIGS. 28A and 28B, the left graphs show characteristics of switches SW1a to SW4a of filter 10A, whereas the right graphs show characteristics of switches SWA and SWB of change circuit 30A. The first graphs show switch current characteristics when switch SWA is on and switch SWB is off, and the second graphs show switch voltage characteristics when switch SWA is on and switch SWB is off. The third graphs show switch current characteristics when switch SWA is off and switch SWB is on, and the fourth graphs show switch voltage characteristics when switch SWA is off and switch SWB is on.

The highest voltages that can be applied to and the greatest currents that can flow through the switches (switches SWA, SWB, and SW1a to SW4a) in the passbands and attenuation bands (Band27-Tx, Band27-Rx, Band26-Tx, Band26-Rx) are as follows.

Switch SWA . . . highest voltage=39.9 V, greatest current=681 mA

Switch SWB . . . highest voltage=30.4 V, greatest current<1 mA

Switches SW1a to SW4a . . . highest voltage=19.4 V, greatest current=534 mA

Thus, the greatest current flows through switch SWA in the on state and the highest voltage is applied to switch SWA in the off state, and thus the greatest current and the highest voltage are greater/higher than those of switches SW1a to SW4a of parallel-arm circuits P1 to P4 included in filter 10A. Accordingly, switch SWA is given a high stack count and a great gate width. This can ensure voltage withstand capability and current withstand capability for switch SWA.

In addition, the on resistance of switch SWA influences the loss in the entire passband when switch SWA is on, and thus on resistance Ron is to be made low. Also from this viewpoint, switch SWA is to be designed to have a great gate width.

The highest voltage is applied to switch SWB in the off state, yet hardly no current flows through switch SWB in both the on and off states. Accordingly, a high stack count is given to switch SWB. This can ensure voltage withstand capability for switch SWB. Even if on resistance Ron of switch SWB increases, this does not influence filter characteristics, and thus the gate width of switch SWB is desirably narrow from the viewpoint of size reduction.

Lower voltages are applied to and smaller currents flow through switches SW1a to SW4a of parallel-arm circuits P1 to P4 than the voltage applied to and the current flowing through switch SWA of change circuit 30A. Thus, switches SW1a to SW4a are to be designed to satisfy the following relations from the viewpoint of size reduction.

Gate width of each of switches SW1a to SW4a<gate width of switch SWA

Stack count of each of switches SW1a to SW4a<stack count of switch SWA

Lower voltages are applied to and greater currents flow through switches SW1a to SW4a of parallel-arm circuits P1 to P4 than the voltage applied to and the current flowing through switch SWB of change circuit 30A. Accordingly, from the viewpoint of achieving both voltage withstand capability and size reduction, switches SW1a to SW4a are to be designed to satisfy the following relations.

Stack count of each of switch SW1a to SW4a<stack count of switch SWB

Gate width of each of switches SW1a to SW4a>gate width of switch SWB

As described above, by designing the switches to satisfy the following relations, power durability of change circuit 30A can be ensured while achieving reduction in size and passband insertion loss of change circuit 30A. Accordingly, a multiplexer that includes such change circuit 30A can also yield similar advantageous effects.

Gate width of each of switches SW1a to SW4a<gate width of switch SWA

Gate width of each of switches SW1a to SW4a>gate width of switch SWB

Stack count of each of switches SW1a to SW4a<stack count of switch SWA

Stack count of each of switches SW1a to SW4a<stack count of switch SWB

Figure 29:
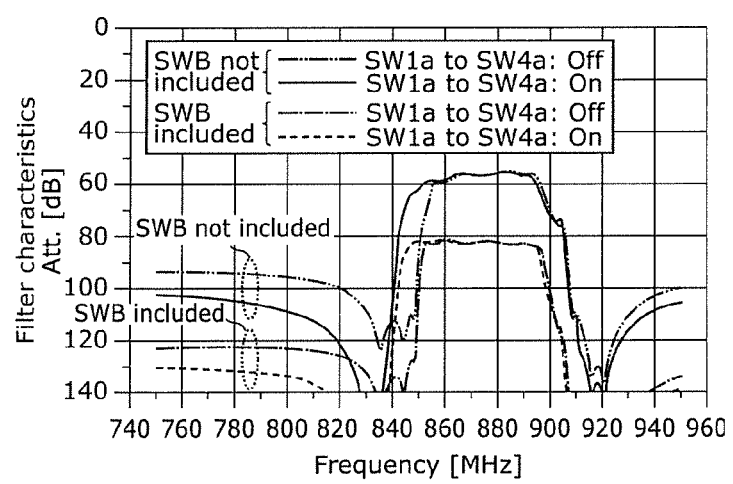
FIG. 29 illustrates a graph showing influence on filter characteristics due to whether a switch that switches between connection and disconnection of an input/output terminal of the filter and the ground is included.

FIG. 29 is a graph showing influence on filter characteristics due to whether switch SWB that switches between connection and disconnection of input terminal 102 of filter 10A and the ground is included. Specifically, FIG. 29 illustrates, for each of when switch SWB is included and when switch SWB is not included, damping characteristics (frequency characteristics of insertion loss) between common terminal 213 and individual terminal 211, when switch SWA is off (namely, filter 10A and common terminal 213 are disconnected) and switches SW1a to SW4a are on/off.

As is clear from FIG. 29, if switch SWB is included, isolation of filter 10A from common terminal 213 can be improved when filter 10A is disconnected from common terminal 213, as compared with the case where no switch SWB is included.

Note that switch SWA is off when switch SWB is on, and thus the on resistance of switch SWB does not influence the isolation.

Embodiment 3

The filters described in Embodiment 1 and the examples thereof are applicable to a multiplexer and a radio-frequency front-end circuit for a system in which a larger number of bands are used. In view of this, in the present embodiment, such a multiplexer, such a radio-frequency front-end circuit, and a communication device are to be described.

Figure 30:
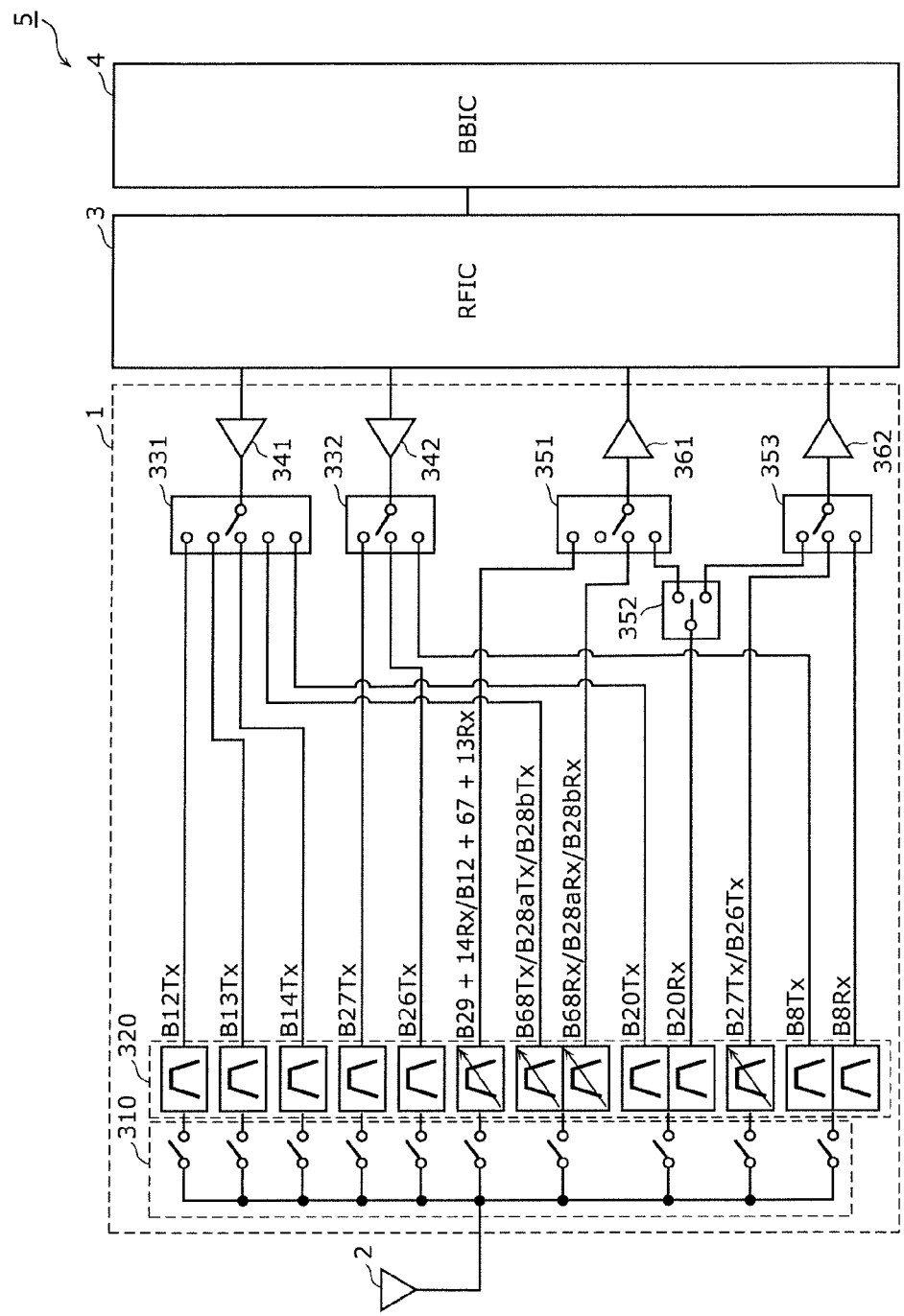
FIG. 30 illustrates a configuration of a communication device according to Embodiment 3.

FIG. 30 illustrates a configuration of communication device 5 according to Embodiment 3.

As illustrated in FIG. 30, communication device 5 includes switch group 310 that includes a plurality of switches, filter group 320 that includes a plurality of filters, transmitter switches 331 and 332, receiver switches 351, 352, and 353, transmission amplifier circuits 341 and 342, receiving amplifier circuits 361 and 362, radio frequency (RF) signal processing circuit (RFIC) 3, baseband signal processing circuit (baseband integrated circuit (BBIC)) 4, and antenna element 2.

Switch group 310 connects antenna element 2 and a signal path for a predetermined band, according to a control signal from a controller (not illustrated), and includes a plurality of single-pole single-throw (SPST) switches, for example. Note that not only one signal path but also a plurality of signal paths may be connected to antenna element 2. Specifically, communication device 5 may support carrier aggregation.

Filter group 320 includes a plurality of filters (including a duplexer) having the following passbands, for example. Specifically, such bands include (i) the transmission band of Band 12, (ii) the transmission band of Band 13, (iii) the transmission band of Band 14, (iv) the transmission band of Band 27, (v) the transmission band of Band 26, (vi) the receiving bands of Band 29 and Band 14 or of Band 12, Band 67, and Band 13, (vii-Tx) the transmission band of Band 68, Band 28a, or Band 28b, (vii-Rx) the receiving band of Band 68, Band 28a, or Band 28b, (viii-Tx) the transmission band of Band 20, (viii-Rx) the receiving band of Band 20, (ix-Tx) the transmission band of Band 27 or Band 26, (x-Tx) the transmission band of Band 8, and (x-Rx) the receiving band of Band 8.

Transmitter switch 331 is a switch circuit that includes a plurality of selection terminals connected to a plurality of transmitter signal paths on a low band side where the center frequency of filter group 320 is low, and a common terminal connected to transmission amplifier circuit 341. Transmitter switch 332 is a switch circuit that includes a plurality of selection terminals connected to a plurality of transmitter signal paths on a high band side where the center frequency of filter group 320 is high, and a common terminal connected to transmission amplifier circuit 342. Transmitter switches 331 and 332 are switch circuits that are disposed upstream from filter group 320 (here, upstream of the transmitter signal paths), and the connected states of which are changed according to control signals from the controller (not illustrated). Accordingly, high-frequency signals (here, high-frequency signals to be transmitted) amplified by transmission amplifier circuits 341 and 342 are output to antenna element 2 through predetermined filters of filter group 320.

Receiver switch 351 is a switch circuit that includes a plurality of selection terminals connected to a plurality of receiver signal paths on the low band side, and a common terminal connected to receiving amplifier circuit 361. Receiver switch 352 is a switch circuit that includes a common terminal connected to a receiver signal path for a predetermined band (here, Band 20), and two selection terminals connected to one of the selection terminals of receiver switch 351 and one of the selection terminals of receiver switch 353. Receiver switch 353 is a switch circuit that includes a plurality of selection terminals connected to a plurality of receiver signal paths on the high band side, and a common terminal connected to receiving amplifier circuit 362. Receiver switches 351 to 353 are disposed downstream from filter group 320 (here, downstream of the receiver signal paths), and the connected states thereof are changed according to control signals from the controller (not illustrated). Accordingly, high-frequency signals (here, high-frequency signals received) input to antenna element 2 are amplified by receiving amplifier circuits 361 and 362 after passing through predetermined filters of filter group 320, and are output to an RF signal processing circuit (RFIC). Note that an RF signal processing circuit (RFIC) for a low band and an RF signal processing circuit (RFIC) for a high band may be individually disposed.

Transmission amplifier circuit 341 is a power amplifier that amplifies power of a low-band high-frequency signal to be transmitted, and transmission amplifier circuit 342 is a power amplifier that amplifies power of a high-band high-frequency signal to be transmitted.

Receiving amplifier circuit 361 is a low-noise amplifier that amplifies power of a low-band high frequency signal received, and receiving amplifier circuit 362 is a low-noise amplifier that amplifies power of a high-band high frequency signal received.

RF signal processing circuit (RFIC) 3 processes high-frequency signals transmitted and received by antenna element 2. Specifically, RF signal processing circuit (RFIC) 3 processes a high-frequency signal (here, a high-frequency signal received) input through a receiver signal path from antenna element 2 by down-conversion, for instance, and outputs a received signal generated by being processed to baseband signal processing circuit (BBIC) 4. RF signal processing circuit (RFIC) 3 processes a signal to be transmitted input from baseband signal processing circuit (BBIC) 4 by up-conversion, for instance, and outputs a high-frequency signal (here, a high-frequency signal to be transmitted) generated by being processed to a transmitter signal path.

Communication device 5 having such a configuration includes the filter(s) according to any one of Embodiment 1 and the examples thereof, as at least one of (vi) a filter having passbands that are a receiving bands of Band 29 and Band 14 or of Band 12, Band 67, and Band 13, (vii-Tx) a filter having a passband that is a transmission band of Band 68, Band 28a, or Band 28b, (vii-Rx) a filter having a passband that is a receiving band of Band 68, Band 28a, or Band 28b, and (ix-Tx) a filter having a passband that is a transmission band of Band 27 or Band 26. Specifically, the filter(s) switch(es) between frequency ranges of the passband and between frequency ranges of the attenuation band, according to control signals.

Note that high frequency front-end circuit 1 includes switch group 310, filter group 320, transmitter switches 331 and 332, receiver switches 351, 352, and 353, transmission amplifier circuits 341 and 342, receiving amplifier circuits 361 and 362, and the controller, out of the elements of communication device 300. Switch group 310 and filter group 320 are included in a multiplexer. Note that the multiplexer according to the present disclosure may have a configuration in which filter group 320 may be connected to a common terminal through switch group 310 as in the present embodiment, or a plurality of filters according to Embodiment 1 are directly connected to a common terminal.

Here, although not illustrated in FIG. 30, the controller may be included in the RF signal processing circuit (RFIC) 3 or may constitute a switch IC together with, for instance, the switches that the controller controls.

Radio-frequency front-end circuit 1 and communication device 5 having the above configuration include the filter(s) according to Embodiment 1 above and the examples thereof, and thus are a high-performance circuit and a high-performance device that can ensure power durability that the circuit and the device are to have, and further achieve reduction in size of the circuit/device and passband insertion loss when the switches are on. Further, the number of filters can be reduced as compared with the case of disposing a filter for each band, and thus the circuit/device can be miniaturized.

Radio-frequency front-end circuit 1 according to the present embodiment includes transmitter switches 331 and 332 and receiver switches 351 to 353 (switch circuits) disposed upstream/downstream of filter group 320 (radio-frequency filters). Accordingly, portions of signal paths through which high-frequency signals are transmitted can be shared. Thus, for example, transmission amplifier circuits 341 and 342 or receiving amplifier circuits 361 and 362 (amplifier circuits) for radio-frequency filters can be shared. Consequently, the radio-frequency front-end circuit can be miniaturized, and cost therefor can be reduced.

Note that it is sufficient if at least one of transmitter switches 331 and 332 and at least one of receiver switches 351 to 353 are included. Further, the number of transmitter switches 331 and 332 and the number of receiver switches 351 to 353 are not limited to the numbers described above, and for example, one transmitter switch and one receiver switch may be included. Also, the numbers of selection terminals of a transmitter switch and a receiver switch are not limited to the numbers as in the present embodiment, and the transmitter switch and the receiver switch may each include two selection terminals.

Other Embodiments

The above has described the radio-frequency filter, the multiplexer, the radio-frequency front-end circuit, and the communication device according to the present disclosure, using Embodiments 1 and 2, yet the present disclosure is not limited to the above embodiments. The present disclosure also encompasses another embodiment achieved by combining arbitrary elements in the above embodiments, variations as a result of adding, to the embodiments, various modifications that may be conceived by those skilled in the art without departing from the scope of the present disclosure, and various devices that include the radio-frequency filter, the multiplexer, the radio-frequency front-end circuit, and the communication device according to the present disclosure.

For example, it is sufficient if two or more parallel-arm circuits are included, and five or more parallel-arm circuits may be included.

Each of the series-arm resonators and the parallel-arm resonators described above may not be limited to a single resonator, but may be achieved by a plurality of split resonators obtained by splitting one resonator.

The above is a description on the assumption that the first impedance element and the second impedance element are capacitors, but may be inductors. Similarly, the above is a description on the assumption that the fifth impedance element and the sixth impedance element are capacitors, but may be inductors. Also, the above is a description on the assumption that the third impedance element and the fourth impedance element are inductors, but may be capacitors.

An inductor may be a variable inductor for which microelectromechanical systems (MEMS) are used, for example.

In the above description, the sizes of gate widths of one switch element and another switch element are compared, assuming that the switch elements each include a plurality of transistors (specifically, FETs) having the same configuration, to simplify the description. However, the configuration of each switch element is not limited to the above, and the configuration of at least one transistor may be different from the configuration of another transistor. Stated differently, in each switch element, transistors may not have the same gate width, but may have different gate widths.

Even the configuration that includes such switch elements yields similar advantageous effects to those as described the above, by satisfying the relations of the gate widths described above.

Specifically, current withstand capability of a switch element that includes a plurality of transistors connected in series is limited (that is, restricted) by current withstand capability of a transistor having the narrowest gate width among the plurality of transistors. In view of this, in order to achieve current withstand capability that the switch element that includes the plurality of transistors is to have, the current withstand capability is to be achieved for each of the plurality of transistors.

Accordingly, for example, with regard to the first switch element that is to have current withstand capability higher than the second switch element, the gate width of each of a plurality of transistors included in the first switch element is made greater than the gate width of at least one of a plurality of transistors included in the second switch element. Accordingly, current withstand capability that achieves power durability that, for instance, the radio-frequency filter is to have can be ensured for the first switch element and the second switch element, while decreasing a total size of the first switch element and the second switch element.

Further, with regard to a switch element that includes a plurality of transistors connected in series, even if the gate width of a transistor different from a transistor having the narrowest gate width is increased, this increase dose not contribute to the improvement in current withstand capability of the entire switch element, and what is more, prevents size reduction. In view of this, in order to reduce the size of a switch element, the gate width of such other transistor is not to be excessively increased.

Accordingly, for example, with regard to the second switch element that is not to have current withstand capability as high as that of the first switch element, the gate width of each of a plurality of transistors included in the second switch element may be made narrower than the gate width of each of the plurality of transistors included in the first switch element. Accordingly, current withstand capability that achieves power durability that, for instance, the radio-frequency filter is to have can be ensured for the second switch element, and at the same time, the second switch element can be further miniaturized. Stated differently, the radio-frequency filter that includes the second switch element, for instance, can be further miniaturized while reducing passband insertion loss and ensuring power durability.

The above has given a description using, as an example, the case where the switch elements (first to seventh switch elements) each include a plurality of transistors, yet the switch elements may each include one transistor.

For example, the controller may be disposed outside RF signal processing circuit (RFIC) 3, and may be disposed in radio-frequency front-end circuit 1, for example. Specifically, the configuration of radio-frequency front-end circuit 1 is not limited to the configuration described above, and may include a radio-frequency filter that includes a frequency-tunable circuit, and a controller that controls on and off of a switch element of the frequency-tunable circuit. Radio-frequency front-end circuit 1 having such a configuration can switch between frequency ranges of the passband according to a frequency specification that the circuit is to have, while inhibiting an increase in the insertion loss at a passband edge.

The above has described multiplexer MPX that includes change circuit 30, yet the configuration of the multiplexer is not limited thereto. Thus, the multiplexer may include a plurality of filters including the filter having the frequency-tunable function described in Embodiment 1 and the variations thereof. The input/output terminals of the filters on one side may be indirectly connected to common terminal 213 via change circuit 30, a phase converter, or a circulator, or may be directly connected to common terminal 213 without having a circuit element therebetween.

Multiplexer MPX is not limited to a transmission multiplexer and may be a receiving multiplexer or may be, for instance, a duplexer that includes a transmission filter and a receiving filter. The number of filters included in multiplexer MPX may be three or more.

For example, in radio-frequency front-end circuit 1 or communication device 5, an inductor or a capacitor may be connected between elements. Note that the inductor may be a line inductor achieved by a line that connects elements.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be widely used in communication apparatuses such as mobile phones, as a small filter, a small multiplexer, a small front-end circuit, and a small communication device that are applicable to a multi-band system.

The invention claimed is:

1. A radio-frequency filter, comprising:
a series-arm circuit disposed on a path that connects an input terminal and an output terminal;
a first parallel-arm circuit connected to a ground and a first node on the path, between the input terminal and the series-arm circuit, the first parallel-arm circuit including a first parallel-arm resonator, and a first switch circuit connected in series to the first parallel arm resonator, the first switch circuit including a first switch element that includes one or more transistors; and
a second parallel-arm circuit connected to the ground and a second node on the path, between the series-arm circuit and the output terminal, the second parallel-arm circuit including a second parallel-arm resonator, and a second switch circuit connected in series to the second parallel-arm resonator, the second switch circuit including a second switch element that includes one or more transistors, wherein
a gate width of each of the one or more transistors included in the first switch element is greater than a gate width of at least one of the one or more transistors included in the second switch element.

2. The radio-frequency filter of claim 1, wherein
under a condition that a stack count indicates a total number of transistors connected in series, the second switch element has a stack count lower than a stack count of the first switch element.

3. The radio-frequency filter of claim 1, wherein
the first switch circuit further includes a first impedance element connected to the first switch element, the first impedance element being one of an inductor and a capacitor, and
the second switch circuit further includes a second impedance element connected to the second switch element, the second impedance element being one of an inductor and a capacitor.

4. The radio-frequency filter of claim 3, wherein the first impedance element and the first switch element are connected in parallel in the first switch circuit, and
the second impedance element and the second switch element are connected in parallel in the second switch circuit.

5. The radio-frequency filter of claim 3, wherein
the first switch circuit further includes a third impedance element connected in series to the first switch element, the third impedance element being an other of the inductor and the capacitor and different from the first impedance element,
the second switch circuit further includes a fourth impedance element connected in series to the second switch element, the fourth impedance element being an other of the inductor and the capacitor and different from the second impedance element,
a circuit comprising the third impedance element and the first switch element connected in series is connected in parallel to the first impedance element, and
a circuit comprising the fourth impedance element and the second switch element connected in series is connected in parallel to the second impedance element.

6. The radio-frequency filter of claim 5, wherein
the first switch circuit includes a plurality of circuits having a same structure as that of the circuit comprising the third impedance element and the first switch element connected in series, and
the second switch circuit includes a plurality of circuits having a same structure as that of the circuit comprising the fourth impedance element and the second switch element connected in series.

7. The radio-frequency filter of claim 3, wherein
the first parallel-arm circuit further includes a third parallel-arm resonator connected in parallel to a circuit comprising the first parallel-arm resonator and the first switch circuit connected in series,
the second parallel-arm circuit further includes a fourth parallel-arm resonator connected in parallel to a circuit comprising the second parallel-arm resonator and the second switch circuit connected in series,
a resonant frequency of the first parallel-arm resonator being lower than a resonant frequency of the third parallel-arm resonator,
an antiresonant frequency of the first parallel-arm resonator being lower than an antiresonant frequency of the third parallel-arm resonator,
a resonant frequency of the second parallel-arm resonator being lower than a resonant frequency of the fourth parallel-arm resonator, and
an antiresonant frequency of the second parallel-arm resonator being lower than an antiresonant frequency of the fourth parallel-arm resonator.

8. The radio-frequency filter of claim 3, wherein
the first parallel-arm circuit further includes a third parallel-arm resonator connected in parallel to a circuit comprising the first parallel-arm resonator and the first switch circuit connected in series,
the second parallel-arm circuit further includes a fourth parallel-arm resonator connected in parallel to a circuit comprising the second parallel-arm resonator and the second switch circuit connected in series,
a resonant frequency of the first parallel-arm resonator being higher than a resonant frequency of the third parallel-arm resonator,
an antiresonant frequency of the first parallel-arm resonator being higher than an antiresonant frequency of the third parallel-arm resonator,
a resonant frequency of the second parallel-arm resonator being higher than a resonant frequency of the fourth parallel-arm resonator, and
an antiresonant frequency of the second parallel-arm resonator being higher than an antiresonant frequency of the fourth parallel-arm resonator.

9. The radio-frequency filter of claim 3, wherein
the first parallel-arm circuit further includes:
a third parallel-arm resonator; and
a third switch circuit connected in series to the third parallel-arm resonator,
the second parallel-arm circuit further includes:
a fourth parallel-arm resonator; and
a fourth switch circuit connected in series to the fourth parallel-arm resonator, the third switch circuit includes:
- a fifth impedance element that is one of an inductor and a capacitor; and
- a third switch element that is connected to the fifth impedance element, and includes one or more transistors, the fourth switch circuit includes:
- a sixth impedance element that is one of an inductor and a capacitor; and
- a fourth switch element that is connected to the sixth impedance element, and includes one or more transistors, a circuit comprising the first parallel-arm resonator and the first switch circuit connected in series and a circuit comprising the third parallel-arm resonator and the third switch circuit connected in series are connected in parallel, and a circuit comprising the second parallel-arm resonator and the second switch circuit connected in series and a circuit comprising the fourth parallel-arm resonator and the fourth switch circuit connected in series are connected in parallel.

10. The radio-frequency filter of claim 9,
wherein a gate width of each of the one or more transistors included in the third switch element is greater than a gate width of at least one of the one or more transistors included in the fourth switch element.

11. The radio-frequency filter of claim 9, wherein
under a condition that a stack count indicates a total number of transistors connected in series, the fourth switch element has a stack count lower than a stack count of the third switch element.

12. The radio-frequency filter of claim 1, wherein the radio-frequency filter has a ladder filter structure that includes:
- two or more series-arm circuits disposed on the path, the two or more series-arm circuits including the series-arm circuit disposed on the path; and
- three or more parallel-arm circuits that include the first parallel-arm circuit and the second parallel-arm circuit,
- the three or more parallel-arm circuits include a third parallel-arm circuit connected to the ground and a node between the first node on the path and the output terminal,
- the third parallel-arm circuit includes a fifth parallel-arm resonator and a fifth switch circuit connected in series to the fifth parallel arm resonator,
- the fifth switch circuit includes a fifth switch element that includes one or more transistors, and
- a gate width of each of the one or more transistors included in the fifth switch element being narrower than a gate width of each of the one or more transistors included in the first switch element.

13. A radio-frequency filter of claim 1, comprising means for providing frequency-tuning and power durability.

14. A multiplexer, comprising:
a plurality of filters that include a first filter that is a radio-frequency filter, the radio-frequency filter comprising:
- a series-arm circuit disposed on a path that connects an input terminal and an output terminal;
- a first parallel-arm circuit connected to a ground and a first node on the path, between the input terminal and the series-arm circuit, the first parallel-arm circuit including a first parallel-arm resonator, and a first switch circuit connected in series to the first parallel arm resonator, the first switch circuit including a first switch element that includes one or more transistors; and
- a second parallel-arm circuit connected to the ground and a second node on the path, between the series-arm circuit and the output terminal, the second parallel-arm circuit including a second parallel-arm resonator, and a second switch circuit connected in series to the second parallel-arm resonator, the second switch circuit including a second switch element that includes one or more transistors, wherein
- a gate width of each of the one or more transistors included in the first switch element is greater than a gate width of at least one of the one or more transistors included in the second switch element, wherein input terminals or output terminals of the plurality of filters are directly or indirectly connected to a common terminal.

15. The multiplexer of claim 14, further comprising:
a change circuit that changes a filter connected to the common terminal from one filter to another filter out of the plurality of filters, wherein
the change circuit includes a sixth switch element configured to switch between (i) a conducting state in which one of the input terminal and the output terminal of the first filter is connected to the common terminal and (ii) a non-conducting state in which the one of the input terminal and the output terminal of the first filter is disconnected from the common terminal,
the sixth switch element includes one or more transistors, and
a gate width of each of the one or more transistors included in the sixth switch element is greater than a gate width of at least one of the one or more transistors included in the first switch element.

16. The multiplexer of claim 15, wherein
the change circuit further includes a seventh switch element that switches between (i) a conducting state in which a node connected with the sixth switch element and the one of the input terminal and the output terminal is connected to the ground and (ii) a non-conducting state in which the node is disconnected from the ground,
under a condition that one of the sixth switch element and the seventh switch element is conducting, an other of the sixth switch element and the seventh switch element is non-conducting,
the seventh switch element includes one or more transistors, and
a gate width of each of the one or more transistors included in the seventh switch element is narrower than a gate width of each of the one or more transistors included in the first switch element.

17. A radio-frequency front-end circuit, comprising:
a multiplexer that includes a plurality of filters that include a first filter that is a radio-frequency filter, or the first filter, the first filter comprising
- a series-arm circuit disposed on a path that connects an input terminal and an output terminal,
- a first parallel-arm circuit connected to a ground and a first node on the path, between the input terminal and the series-arm circuit, the first parallel-arm circuit including a first parallel-arm resonator, and a first switch circuit connected in series to the first parallel arm resonator, the first switch circuit including a first switch element that includes one or more transistors, and a second parallel-arm circuit connected to the ground and a second node on the path, between the series-arm circuit and the output terminal, the second parallel-arm circuit including a second parallel-arm resonator, and a second switch circuit connected in series to the second parallel-arm resonator, the second switch circuit including a second switch element that includes one or more transistors, wherein a gate width of each of the one or more transistors included in the first switch element is greater than a gate width of at least one of the one or more transistors included in the second switch element, and wherein input terminals or output terminals of the plurality of filters are directly or indirectly connected to a common terminal; and an amplifier circuit directly or indirectly connected to the radio-frequency filter or the multiplexer.

18. The radio-frequency front-end circuit of claim 17, wherein the amplifier circuit is a power amplifier that amplifies a high-frequency signal to be transmitted, and the high-frequency signal amplified by the power amplifier is input through the input terminal of the first filter.

19. The radio-frequency front-end circuit of claim 17, wherein the amplifier circuit is a low-noise amplifier that amplifies a high-frequency signal received, and the high-frequency signal amplified by the low-noise amplifier is output through the output terminal of the first filter.

20. A communication device, comprising the radio-frequency front-end circuit of claim 17, the communication device further comprising:

a radio-frequency (RF) signal processing circuit that processes a high-frequency signal to be transmitted by an antenna element, and a high-frequency signal received by the antenna element, wherein the radio-frequency front-end circuit conveys the high-frequency signals between the antenna element and the RF signal processing circuit.

\* \* \* \* \*